(12) United States Patent
Merrill et al.

(10) Patent No.: US 7,166,880 B2
(45) Date of Patent: Jan. 23, 2007

(54) VERTICAL COLOR FILTER SENSOR GROUP WITH CARRIER-COLLECTION ELEMENTS OF DIFFERENT SIZE AND METHOD FOR FABRICATING SUCH A SENSOR GROUP

(75) Inventors: Richard B. Merrill, Woodside, CA (US); Richard F. Lyon, Los Altos, CA (US); Richard M. Turner, Mountain View, CA (US); Paul M. Hubel, Mountain View, CA (US)

(73) Assignee: Foveon, Inc., Santa Clara, CA (US)

( * ) Notice: Subject to any disclaimer, the term of this patent is extended or adjusted under 35 U.S.C. 154(b) by 315 days.

(21) Appl. No.: 10/975,093

(22) Filed: Oct. 27, 2004

(65) Prior Publication Data

US 2005/0087829 A1 Apr. 28, 2005

Related U.S. Application Data

(63) Continuation of application No. 10/355,723, filed on Jan. 31, 2003, now abandoned, and a continuation-in-part of application No. 10/103,304, filed on Mar. 20, 2002, now Pat. No. 6,864,557.

(51) Int. Cl.
*H01L 31/06* (2006.01)
(52) U.S. Cl. .................. 257/294; 257/440; 257/443; 257/465; 257/E31.121
(58) Field of Classification Search ............ 257/222, 257/233, 291, 292, 294, 440, 443, 444, 446, 257/461, 465, E31.121
See application file for complete search history.

(56) References Cited

U.S. PATENT DOCUMENTS 3,617,753 A 11/1971 Kato et al. ............ 250/211 J (Continued)

FOREIGN PATENT DOCUMENTS

JP 61-187282 8/1986

(Continued)

OTHER PUBLICATIONS

K.M. Findlater, et al., "A CMOS Image Sensor Employing a Doulbe Junction Photodiode", *2001 IEEE Workshop on Charge-Coupled Devices and Advanced Image Sensors, IEEE Electron Devices Society (2001)*, pp. 60-63.

(Continued)

*Primary Examiner*—Minh-Loan Tran
(74) *Attorney, Agent, or Firm*—Girard & Equitz LLP

(57) ABSTRACT

A vertical color filter sensor group formed on a substrate (preferably a semiconductor substrate) and including at least two vertically stacked, photosensitive sensors, and an array of such sensor groups. In some embodiments, a carrier-collection element of at least one sensor of the group has substantially larger area, projected in a plane perpendicular to a normal axis defined by a top surface of a top sensor of the group, than does each minimum-sized carrier-collection element of the group. In some embodiments, the array includes at least two sensor groups that share at least one carrier-collection element. Optionally, the sensor group includes at least one filter positioned relative to the sensors such that radiation that has propagated through or reflected from the filter will propagate into at least one sensor of the group.

14 Claims, 29 Drawing Sheets

U.S. PATENT DOCUMENTS

| | | | |
|---|---|---|---|
| 4,238,760 A | 12/1980 | Carr | 357/30 |
| 4,581,625 A | 4/1986 | Gay et al. | 357/30 |
| 4,677,289 A | 6/1987 | Nozaki et al. | 250/226 |
| 5,883,421 A | 3/1999 | Ben Chouikha et al. | 257/461 |
| 5,889,315 A | 3/1999 | Farrenkopf et al. | 257/552 |
| 5,899,714 A | 5/1999 | Farrenkopf et al. | 438/202 |
| 5,965,875 A | 10/1999 | Merrill | 250/226 |
| 6,111,300 A | 8/2000 | Cao et al. | 257/440 |
| 6,455,833 B1 | 9/2002 | Berezin | 250/208.1 |
| 6,593,558 B1 | 7/2003 | Edgar | 250/208.1 |
| 6,753,585 B1 | 6/2004 | Kindt | 257/440 |
| 2002/0058353 A1 | 5/2002 | Merrill | |
| 2002/0130957 A1 | 9/2002 | Gallagher et al. | |
| 2004/0125222 A1 | 7/2004 | Bradski et al. | |

FOREIGN PATENT DOCUMENTS

| | | |
|---|---|---|
| JP | 1-34966 | 5/1989 |
| WO | WO 01/63914 A1 | 8/2001 |

OTHER PUBLICATIONS

I. Takayanagi, et al., "A Low Dark Current Stacked CMOS-APS for Charged Particle Imaging", *IEDM Technical Digest*, Washington, D.C., Dec. 2-5, 2001, pp. 551-554.

M. Bartek, et al., "An Integrated Silicon Colour Sensor Using Selective Epitaxial Growth", *Sensors and Actuators A: Physical*, 41-42 (1994), pp. 123-128.

P. Catrysse et al., "An Integrated Color Pixel in 0.18μm CMOS Technology", *2001 IEDM Technical Digest*, pp. 24.4.1-24.4.4.

D. Knipp, et al., "Low Cost Approach to Realize Novel Detectors for Color Recognition", *International Congress on Imaging Science*, Sep. 7-11, 1998, Antwerp, Belgium, pp. 350-353.

D. Pasquariello, et al., "Plasma-Assisted INP-to-Si Low Temperature Wafer Bonding", *IEEE Journal on Selected Topics in Quantum Electronics*, vol. 8, No. 1. Jan./Feb. 2002, pp. 118-131.

Sony, Inc., "Third Generation Diagonal 4.5 mm (Type ¼) 250K/380K-pixel Color CCD Image Sensor, 250K/290K Pixels, ICX226AK (NTSC), ICX227AK (PAL), 380K/440K Pixels, ICX228AK (NTSC), ICX220AK (PAL)", 2 pages, downloaded from the Internet on Nov. 18, 2002 from http://www.sony.net/products/sc-hp/cxpal/cxnews-20/pdf/n.1cx226.pdf.

Shellcase LTD., "ShellOP", 2 pages, downloaded from the Internet on Nov. 1, 2002 from http://www.shellcase.com/pages/products.asp.

Nayar, S.K. and Mitsunaga, T., "High Dynamic Range Imaging: Spatially Varying Pixel Exposures," *Proceedings of the IEEE Conference on Computer Vision and Pattern Recognition*, vol. 1, pp. 472-479, Jun. 2000.

| Indium Content x | Energy Gap Eg eV | Corresponding Optical Wavelength nm |
|---|---|---|
| 0.000 | 3.437 | 360.8 |
| 0.050 | 3.315 | 374 |
| 0.100 | 3.20 | 388 |
| 0.150 | 3.09 | 402 |
| 0.200 | 2.98 | 416 |
| * | * | * |
| 0.250 | 2.88 | 431 |
| 0.300 | 2.78 | 446 |
| 0.350 | 2.69 | 461 |
| 0.400 | 2.60 | 476.5 |
| 0.450 | 2.52 | 492 |
| * | * | * |
| 0.500 | 2.44 | 507.5 |
| 0.550 | 2.37 | 523 |
| 0.600 | 2.305 | 538 |
| 0.650 | 2.24 | 553 |
| 0.700 | 2.19 | 567 |
| * | * | * |
| 0.750 | 2.13 | 581 |
| 0.800 | 2.09 | 594 |
| 0.850 | 2.05 | 606 |
| 0.900 | 2.01 | 617 |
| 0.950 | 1.98 | 627 |
| * | * | * |
| 1.000 | 1.950 | 635.9 |

| | P contact | | N-type | | Oxide |

| | Silicon | | $SiO_2$ | | Implant | | Implant | polish back
leaving 0.3 um blue diode
implant cmos process
sequence
continues

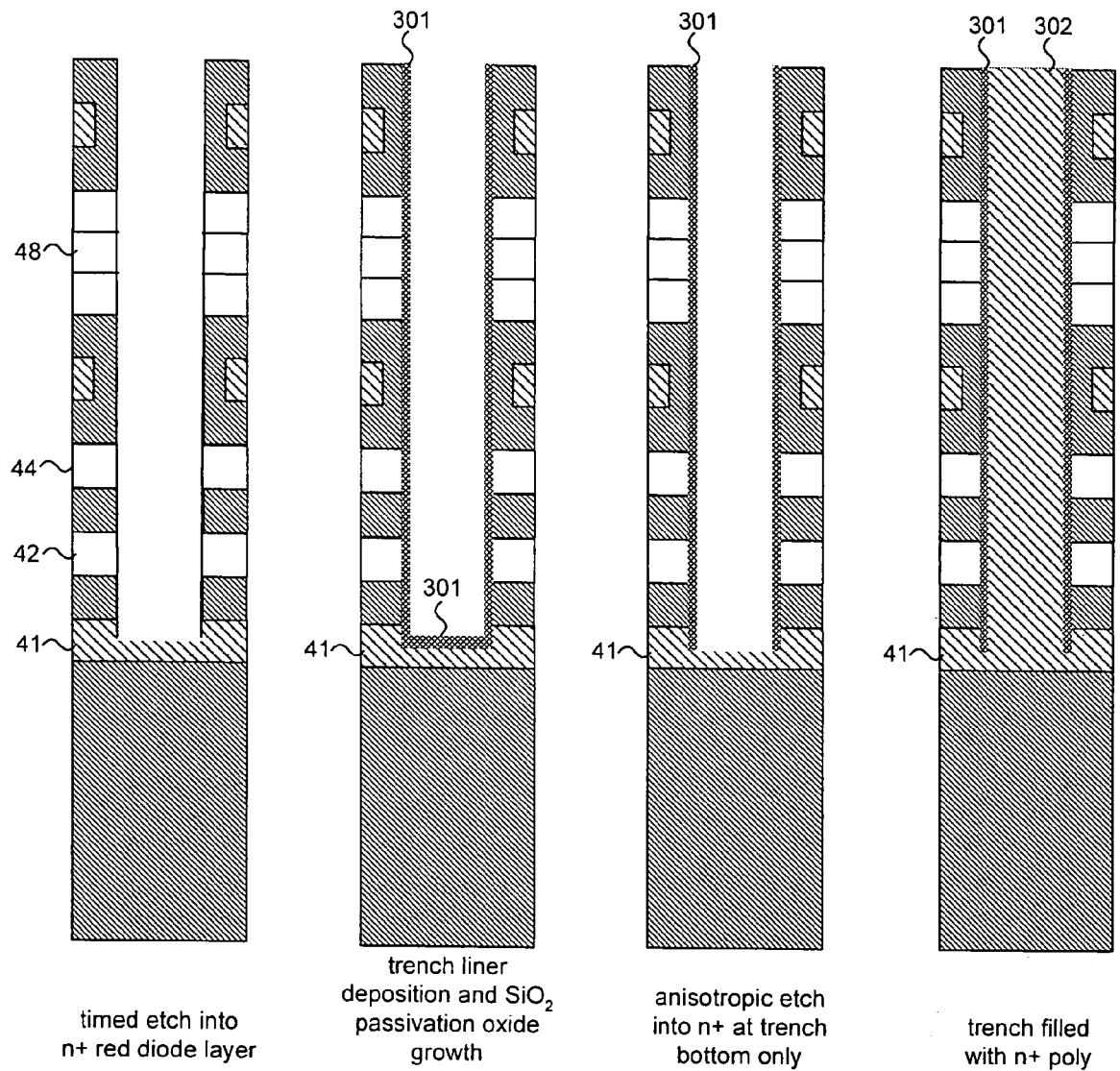

VERTICAL COLOR FILTER SENSOR GROUP WITH CARRIER-COLLECTION ELEMENTS OF DIFFERENT SIZE AND METHOD FOR FABRICATING SUCH A SENSOR GROUP

RELATED APPLICATIONS

This application is a continuation of U.S. patent application Ser. No. 10/355,723, entitled VERTICAL COLOR FILTER SENSOR GROUP WITH CARRIER-COLLECTION ELEMENTS OF DIFFERENT SIZE AND METHOD FOR FABRICATING SUCH A SENSOR GROUP, filed on Jan. 31, 2003, abandoned, and a continuation in part of U.S. patent application Ser. No. 10/103,304, entitled VERTICAL COLOR FILTER DETECTOR GROUP AND ARRAY, filed on Mar. 20, 2002, now U.S. Pat. No. 6,864,557.

BACKGROUND OF THE INVENTION

1. Field of the Invention

The present invention relates to photosensitive sensor groups that comprise vertically stacked sensors. In each group, semiconductor material chromatically filters incident electromagnetic radiation vertically (optionally, other material also filters the radiation) and each sensor simultaneously detects a different wavelength band. The invention also relates to arrays of such sensor groups, with each sensor group positioned at a different pixel location.

2. Background of the Invention

The expressions "filter" and "color filter" are used interchangeably herein (including in the claims) in a broad sense to denote an element that selectively transmits or reflects at least one wavelength band of electromagnetic radiation that is incident thereon. For example, one type of filter is a dichroic mirror that both transmits radiation in a first wavelength band and reflects radiation in a second wavelength band. Examples of filters include short wave pass filters, long wave pass filters, and band pass filters.

The term "radiation" is used herein to denote electromagnetic radiation.

The expression "top sensor" (of a sensor group) herein denotes the sensor of the group that radiation, incident at the sensor group, reaches before reaching any other sensor of the group. The expression that the sensors of a sensor group are "vertically stacked" denotes that one of the sensors is a top sensor of the group, and that the group has an axis (sometimes referred to as a "vertical axis") that extends through all the sensors. As described below, a vertical color filter ("VCF") sensor group that embodies the invention preferably includes vertically stacked sensors configured such that the group's top sensor has a top surface that defines a normal axis (e.g., is at least substantially planar), and when radiation propagating along a vertical axis of the group is incident at the group, the radiation is incident at the top sensor with an incidence angle of less than about 30 degrees with respect to the normal axis (e.g., the radiation is normally incident at the group).

The expression used herein that two elements, included in a structure having a vertical axis, are "laterally" (or "horizontally") separated denotes that there is an axis parallel to the vertical axis that extends between the elements but intersects neither element.

The expression that an item "comprises" an element is used herein (including in the claims) to denote that the item is or includes the element.

MOS active pixel sensors are known in the art. Multiple-wavelength band active pixel sensor arrays are also known in the art. One type of multiple-wavelength band active pixel sensor array employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per resolution element as these sensors are tiled together in a plane. In addition, reconstruction of a color image from such a sensor array is computationally intensive and often results in images with artifacts, defects, or inferior resolution.

Another type of multiple-wavelength band pixel sensor array employs groups of sensors, each group including sensors in a vertically-oriented arrangement. An example of an early multiple-wavelength vertical sensor group for detecting visible and infra-red radiation is disclosed in U.S. Pat. No. 4,238,760 to Carr, in which a first diode in a surface n-type epitaxial region is responsive to visible light and a second diode (including a buried p-region in an underlying n-type substrate) is responsive to infrared radiation. Carr teaches that contact to the buried diode is made using a deep diffusion process "similar to diffusion-under-film collector contact diffusion common in bipolar IC processing and for reducing the parameter $R_{CS}$." Carr also discloses an embodiment in which a V-groove contact (created by a process that includes a step of etching through the n-type epitaxial region) provides contact to the buried p-type region. The disclosed device has a size of 4 mils square. The device disclosed in the Carr patent has several shortcomings, the most notable being its large area, rendering it unsuitable for the image sensor density requirements of modern imaging systems. The technology employed for contact formation to the buried infrared sensing diode is not suitable for modern imaging technology or extension to a 3-color sensor.

U.S. Pat. No. 5,965,875 to Merrill discloses a three-color, visible light, sensor group in which a structure is provided using a triple-well CMOS process wherein the blue, green, and red sensitive PN junctions are disposed at different depths relative to the surface of the semiconductor substrate upon which the imager is fabricated. This three-color sensor group permits fabrication of a dense imaging array because the three colors are sensed over approximately the same area in the image plane. However, its structure has several shortcomings. First, the sensor group uses a reverse-polarity central green-sensitive PN junction, requiring modified circuits or voltage ranges, possibly involving PMOS transistors in addition to the usual NMOS transistors, to sense and read out the green channel. This requirement disadvantageously increases sensor area and complicates support circuits in detectors that include the sensor groups. The added circuit complexity makes it difficult to make an image sensor array that has flexible color readout capabilities (as disclosed herein) and makes it impossible to achieve the small sensor size required by many modern electronic imaging applications.

U.S. Pat. No. 6,111,300 to Cao, et al., discloses a color active pixel sensor which uses a PIN photodiode to attempt to collect blue light, and two additional semiconductor junction diodes (vertically spaced from the PIN photodiode) within a semiconductor substrate to detect green and red light. Among the shortcomings of this sensor are difficult and non-standard manufacturing techniques, use of structures that prohibit high density of sensors (in an array), no ability to select different colors for read out, and inability to perform detection of three or more colors using a monolithic semiconductor substrate.

Findlater et al. ("A CMOS Image Sensor Employing a Double Junction Photodiode," K. M. Findlater, D. Renshaw, J. E. D. Hurwitz, R. K. Henderson, T. E. R. Bailey, S. G. Smith, M. D. Purcell, and J. M. Raynor, in 2001 IEEE Workshop on Charge-Coupled Devices and Advanced Image Sensors, IEEE Electron Devices Society (2001)) disclose an active pixel sensor that employs a double-junction photodiode in conjunction with an organic filter overlay. Each double-junction photodiode comprises top and bottom p-type layers with an n-type layer between them. The n-type layer forms the cathode of a first photodiode, the bottom p-type layer forms the anode of a second photodiode, the first photodiode is coupled to a first readout circuit, and the second photodiode is coupled to a second readout circuit. A mosaic of cyan and yellow filters overlays an array of the sensors so that in each row of the array, the even-numbered sensors receive a radiation in a first wavelength band (blue and green) and the odd-numbered sensors receive radiation in a second wavelength band (red and green). The performance of an array of such sensors is limited by the poor color response of the double-junction photodiode and by the fact that the n-well forms the cathode of both photodiodes, making the sensor design very susceptible to non-linear crosstalk between the color channels. Additionally, the authors cite non-uniformity and process/fabrication constraints that limit the performance and potential benefits of this design.

Several types of vertical color filter ("VCF") sensor groups and methods for fabricating them are described in U.S. Patent Application Publication No. US 2002/0058353A1, published on May 16, 2002, and in above-referenced U.S. patent application Ser. No. 10/103,304. A VCF sensor group includes at least two photosensitive sensors that are vertically stacked with respect to each other (with or without non-sensor material between adjacent sensors). Each sensor of a VCF sensor group has a different spectral response. Typically, each sensor has a spectral response that peaks at a different wavelength. In some embodiments, a VCF sensor group (or one or more of the sensors thereof) includes a filter that does not also function as a sensor.

A VCF sensor group simultaneously senses photons of at least two wavelength bands in the same area of the imaging plane. In contrast, time sequential photon sensing methods do not perform photon sensing at the same time for all wavelength bands. The sensing performed by a VCF sensor group included in an imager occurs in one area of the imager (when the imager is viewed vertically), and photons are separated by wavelength as a function of depth into the sensor group.

Typically, each sensor detects photons in a different wavelength band (e.g., one sensor detects more photons in the "blue" wavelength band than each other sensor, a second sensor detects more photons in the "green" wavelength band than each other sensor, and a third sensor detects more photons in the "red" wavelength band than each other sensor), although the sensor group typically has some "cross-talk" in the sense that multiple sensors detect photons of the same wavelength.

VCF sensor groups can be used for a variety of imaging tasks. In preferred embodiments, they are used in digital still cameras (DSC). However they can be employed in many other systems, such as linear imagers, video cameras and machine vision equipment.

A VCF sensor group uses the properties of at least one semiconductor material to detect incident photons, and also to selectively detect incident photons of different wavelengths at different depths in the group. The detection of different wavelengths is possible due to the vertical stacking of the sensor layers of the sensor group in combination with the variation of optical absorption depth with wavelength in semiconductor materials. The costs of manufacturing VCF sensor groups are substantially reduced because VCF sensor groups do not require external color filters (as are traditionally used in color image sensors) and do not require color filters that are distinct from the sensors themselves (the sensors themselves are made of semiconductor material that itself provides a filtering function). However, in some embodiments of the invention, VCF sensor groups do include (or are used with) color filters that are distinct from the sensors themselves. The spectral response characteristics of VCF color sensor groups typically are much more stable and less sensitive to external factors such as temperature or other environmental factors (that may be present during or after manufacturing) than are conventional color sensors with non-semiconductor based filters.

A VCF sensor group is preferably formed on a substrate (preferably a semiconductor substrate) and comprises a plurality of vertically stacked sensors (e.g., sensor layers) configured by doping and/or biasing to collect photo-generated carriers of a first polarity (preferably negative electrons). The sensors include (or pairs of the sensors are separated by) one or more reference layers configured to collect and conduct away photo-generated carriers of the opposite polarity (preferably positive holes). The sensors have different spectral sensitivities based on their different depths in the sensor group, and on other parameters including doping levels and biasing conditions. In operation, the sensors are individually connected to biasing and active pixel sensor readout circuitry. VCF sensor groups and methods for fabricating them are discussed more fully in above-referenced U.S. Patent Application Publication No. US 2002/0058353A1, and in the parent application, U.S. patent application Ser. No. 10/103,304.

An array of VCF sensor groups can be modified by positioning a pattern of color filters over the array, as described in U.S. patent application Ser. No. 10/103,304. Using filters made of only a single filter material and positioned over a subset of the sensor groups, an array with three sensors per sensor group can be operated to detect radiation in four, five, or six different wavelength bands (by reading out signals from different selected subsets of the sensor groups of the array). This can yield improved color accuracy. Any of many different types of filters can be employed, including organic dye filters as in some conventional color image sensors, and filters comprising one or more layers that are integrated with the sensor group by a semiconductor integrated circuit fabrication process (e.g., a layer of polysilicon to absorb short wavelengths, an interference filter that is a stack of alternating oxide and nitride layers, or another interference filter for shaping the spectral response by interference effects).

BRIEF DESCRIPTION OF THE INVENTION

In a class of embodiments, the invention is a vertical color filter (VCF) sensor group formed on a substrate (preferably a semiconductor substrate) and including at least two vertically stacked, photosensitive sensors. In some preferred embodiments of the inventive VCF sensor group, the carrier-collection element of one sensor of the group has substantially larger "size" (projected area in a plane perpendicular to a normal axis defined by the top surface of a top sensor of the group) than does each minimum-sized carrier-collection element of the group, where "minimum-sized" carrier-collection element denotes each carrier-collection element of the group whose projection on such plane has an area that is less than or equal to the projected area on such plane of each other carrier-collection element of the group. In preferred embodiments in this class, one carrier-collection element of the group has size that is at least twice the group's minimum collection area, where "minimum collection area" denotes the size of a minimum-sized carrier-collection element of the group. In another class of embodiments, the invention is an array of VCF sensor groups, wherein each of the sensors of each of the sensor groups has a carrier-collection element, and at least two of the sensor groups "share" at least one carrier-collection element, in the sense that a vertical axis of each sensor group that "shares" a carrier-collection element intersects such carrier-collection element. When readout circuitry is coupled to the sensor groups of an array in this class, a photogenerated carrier signal read from a shared carrier-collection element can be used to generate an output signal of each sensor group that shares the carrier-collection element. In a preferred embodiment of an array in this class, each sensor group includes a blue sensor, a green sensor, and a red sensor, the carrier-collection elements of the red and blue sensors of each group have larger size than does the carrier-collection element of the group's green sensor, and the carrier-collection element of the group's red or blue sensor is (or the carrier-collection elements of both the red and blue sensors are) shared with at least one other sensor group. Preferably, the carrier-collection element of each group's green sensor is not shared with any other sensor group of the array.

Some embodiments of the inventive array are one-dimensional sensor arrays; others are two-dimensional sensor arrays.

Optionally, the inventive sensor group (or each of one or more sensor groups of an array that embodies the invention) includes at least one filter positioned relative to the sensors of the group such that radiation that has propagated through or reflected from the filter will propagate into at least one sensor of the group.

Another aspect of the invention is an image detector that comprises at least one array of VCF sensor groups and circuitry for converting photogenerated carriers produced in the sensors to electrical signals.

BRIEF DESCRIPTION OF THE DRAWINGS

FIG. 6 is a table that lists (in the center column) the bandgap energy in electron volts of $In_xGa_{1-x}N$ semiconductor having different levels of Indium content, and (in the right column) the optical wavelength corresponding to each bandgap energy.

FIG. 8A is a simplified top view of a portion of an array of the inventive VCF sensor groups, in which each of the groups that includes a filter is marked with an "X."

FIG. 8B is a simplified top view of a portion of another array of the inventive VCF sensor groups, in which each of the groups that includes a filter is marked with an "X."

FIGS. 15A–15H are cross-sectional views (in a vertical plane) of structures formed at various steps of manufacture of another embodiment of the inventive VCF sensor group.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Most of the fabrication processes to be described herein assume sensors made of crystal silicon, but the methods (or modifications thereof that will be apparent to those of ordinary skill in the art) typically also apply to sensors made of other semiconductor material or materials. Each sensor of a VCF sensor group senses photons by directly or indirectly converting their energy into electron-hole pairs. This occurs in semiconducting material. A VCF sensor group is typically implemented so that the output of each sensor in the group is indicative of a different wavelength band of incident radiation. The radiation that reaches each sensor in a VCF sensor group has a different wavelength-intensity spectrum due to the filtering action of the material forming the sensor group. Thus, all sensors in a VCF sensor group can be identical and each sensor can still produce an output that is indicative of a different wavelength band. In some embodiments, however, the sensors in a VCF sensor group are not all identical (e.g., they do not all consist of the same material or combination of materials), and the structure and composition of each is determined so as to optimize or improve the sensor group's performance for a predetermined application. For example, a sensor having relatively high sensitivity to a given range of wavelengths (i.e., relatively high absorptivity in such range) and lower sensitivity to other wavelengths, can be vertically stacked with sensors made of other materials having different spectral sensitivity to form a VCF sensor group.

Color output for a digital still camera (DSC) requires sensing of a minimum of three spectral bands due to the tri-chromatic nature of the human visual system. Thus, many embodiments of the inventive VCF sensor group have three vertically stacked sensors (each comprising semiconductor material) for sensing three different spectral bands. VCF sensor groups with two rather than three vertically stacked sensors are useful in other applications, such as for simultaneous detection of visible and infrared radiation as described, for example, in U.S. Pat. No. 4,581,625 and U.S. Pat. No. 4,677,289. Since there can be advantages to sensing more than three spectral regions, some embodiments of the inventive VCF sensor group have more than three vertically stacked sensors. Using the extra information from additional spectral regions, it can be possible to produce a more accurate representation of the color of an object. As more spectral data are available, the accuracy of color representation potentially improves.

Figure 2:
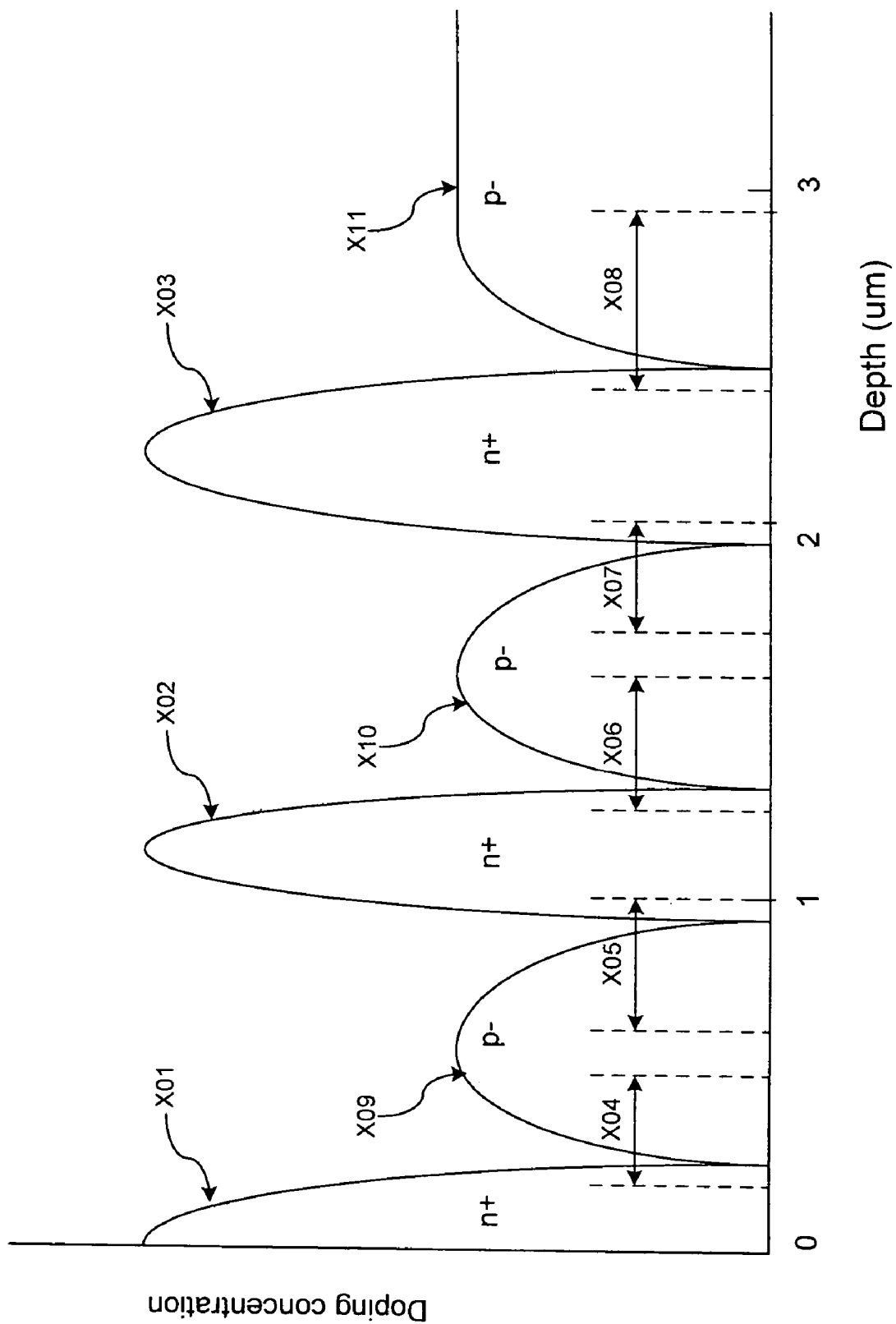
FIG. 2 is a graph indicative of a vertical doping profile for a VCF sensor group that embodies the invention.

In a class of embodiments of the inventive VCF sensor group, each sensor includes two layers of semiconductor material (as does the sensor comprising layer X01 and an adjacent portion of layer X09 in FIG. 2) or three layers of semiconductor material (as does the sensor comprising layer X02 and adjacent portions of layers X09 and X10 in FIG. 2), there is a junction (e.g., a "p-n" junction or heterojunction) between each two adjacent layers of a sensor, and one of the sensor's layers is a carrier-collection element having a contact portion (accessible to biasing and readout circuitry). During typical operation, the layers of each sensor are biased so that photogenerated carriers migrate through at least one depletion region to the contact to make a photocharge signal available at the contact portion. In typical embodiments of a VCF sensor group, the group includes material (e.g., the semiconductor material of layer X09 in FIG. 2 that belongs neither to depletion region X04 nor depletion region X05) in which photons can be absorbed and such absorption is likely to produce charge that is detected by readout circuitry, but in which photogenerated carriers can migrate (with significant probability) toward any of at least two different carrier-collection elements. Typically, but not necessarily, all layers of a VCF sensor group consist of semiconductor material.

Figure 1:
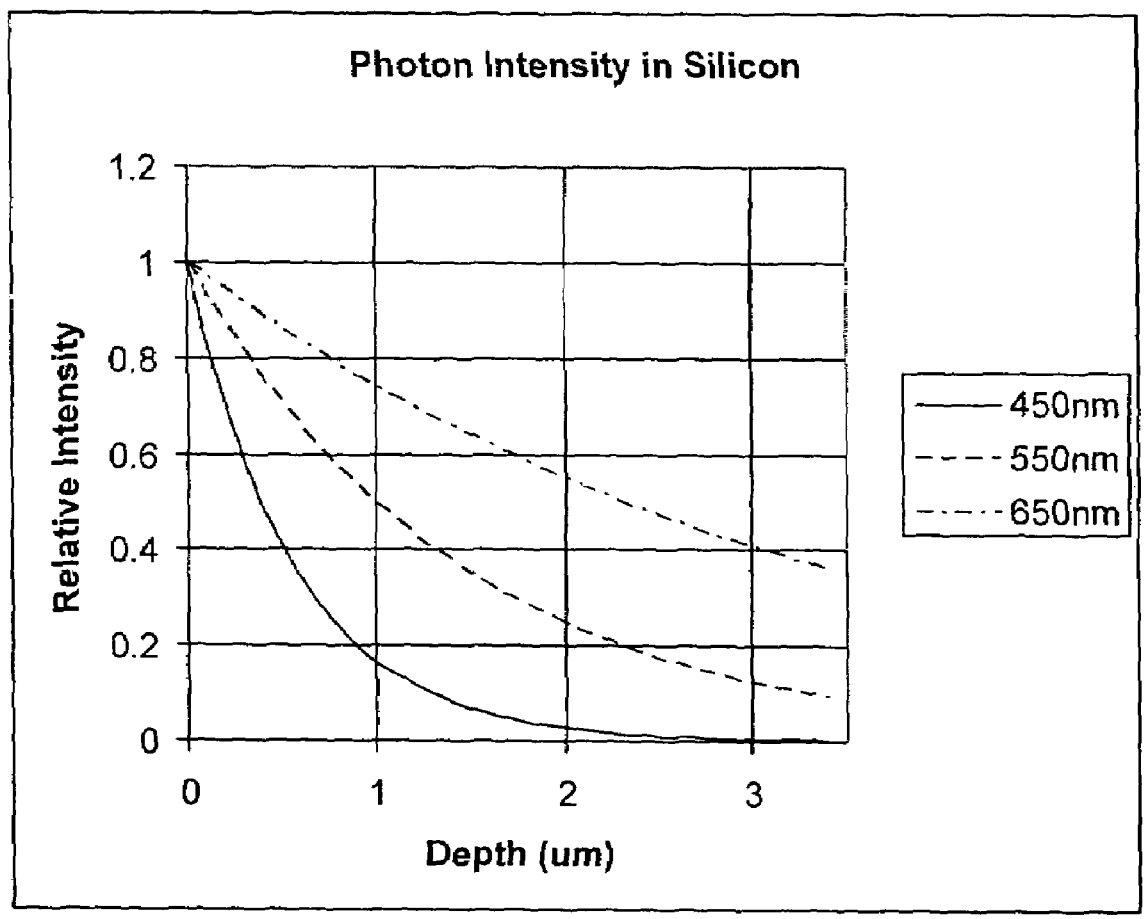
FIG. 1 is a graph of the intensity of electromagnetic radiation in crystalline silicon (relative to its incident intensity $I_0$) as a function of depth (in microns) in the silicon, for the wavelengths 450 nm, 550 nm, and 650 nm.
Figure 3:
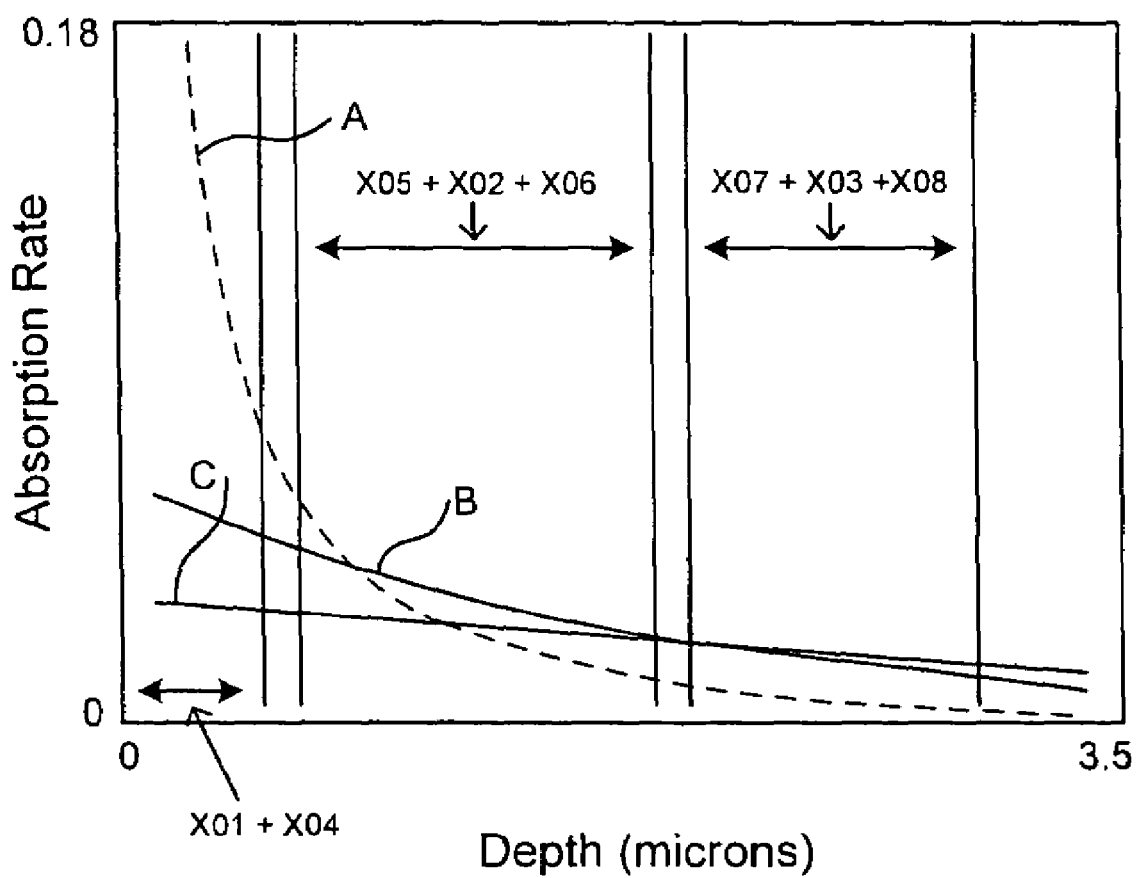
FIG. 3 is a graph of the absorption rate of electromagnetic radiation in crystalline silicon (relative to its incident intensity $I_0$) as a function of depth (in microns) in the silicon, for the wavelengths 450 nm (curve A), 550 nm (curve B), and 650 nm (curve C), with indications of the locations of the FIG. 2 sensor group's layers overlayed thereon.

FIG. 1 is a graph of the intensity of electromagnetic radiation in crystalline silicon (relative to its incident intensity $I_0$) as a function of depth in the silicon, for the wavelengths 450 nm, 550 nm, and 650 nm. FIG. 3 is a graph of the absorption rate of electromagnetic radiation in crystalline silicon (relative to its incident intensity $I_0$) as a function of depth in the silicon, for the wavelengths 450 nm (curve A), 550 nm (curve B), and 650 nm (Curve C), with indications of the locations of the FIG. 2 sensor group's layers overlayed thereon. The graphs of FIGS. 1 and 3 are generated from the same data. Each curve of FIG. 3 plots difference values, with the "n"th difference value being the difference between the "(n+1)th" and "n"th data values of the corresponding curve of FIG. 1. The intensity of radiation (having a given wavelength) as a function of depth in many semiconductors other than silicon is a function similar to those graphed in FIG. 1. FIG. 1 shows that (for each wavelength) the radiation's relative intensity (the ratio $I/I_0$, where "I" is the intensity at depth "x" in the silicon and "$I_0$" is the incident intensity) decreases with increasing depth as the photons are absorbed by the silicon. FIGS. 1 and 3 show that relatively more blue (450 nm) photons are absorbed near the surface than are photons of longer wavelength, and that at any depth in the silicon, more green (550 nm) photons than blue photons are present and that more red (650 nm) photons than green photons are present (assuming equal incident intensity for red, green, and blue photons).

Each of the three curves of FIG. 1 (and FIG. 3) indicates an exponential intensity drop off with increasing depth, and is based on the measured behavior of light in crystalline silicon that has been subjected to typical doping and processing. The exact shape of each curve will depend on the parameters of doping and processing, but there will be only small differences between curves that assume different sets of doping and/or processing parameters. It is well known that the absorption of photons of different wavelengths by a semiconductor depends on the bandgap energy of the semiconductor material and on the details of the states at the band edges. It is also well known that typical semiconductors (e.g., silicon) have different absorptivity to different wavelengths.

As is apparent from FIGS. 1 and 3, a volume of silicon that functions as a sensor in a VCF sensor group at a given depth in a larger volume of the silicon, and has a given thickness, has greater absorptivity to blue light than green light and greater absorptivity to green light than red light. However, if the sensor silicon is sufficiently deep in the larger volume, most of the blue and green light will have been absorbed by the material above the sensor silicon. Even if light having a substantially flat wavelength-intensity spectrum is incident at the surface of the larger volume, the sensor can actually absorb more red light than green or blue light if the intensity of the green and blue light that reaches the sensor is much less than that of the red light that reaches the sensor.

Typical embodiments of the inventive VCF sensor group achieve separation of colors by capturing photons in different ranges of depth in a volume of semiconductor material. FIG. 2 is a vertical doping profile for a VCF sensor group comprising top layer X01 (made of n-type semiconductor), second (p-type) layer X09 below the top layer, third (n-type) layer X02 below the second layer, fourth (p-type) layer X10 below the third layer, fifth (n-type) layer X03 below the fourth layer, and p-type semiconductor substrate X11 below the fifth layer.

Figure 2A:
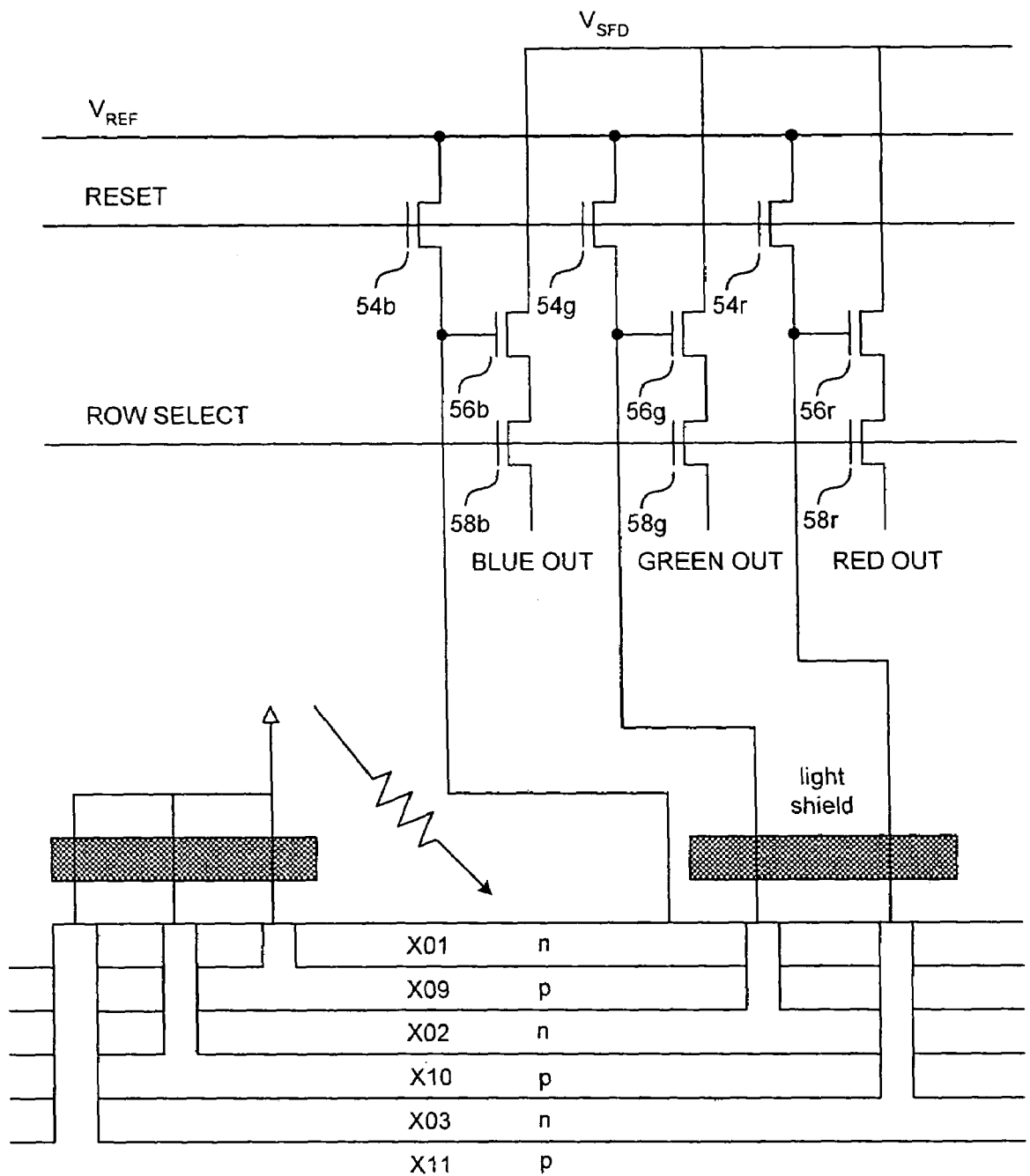
FIG. 2A is a cross-sectional view (in a vertical plane) of the VCF sensor group whose profile is shown in FIG. 2, with a schematic circuit diagram of biasing and readout circuitry coupled to the sensor group.

FIG. 2A is a cross-sectional view (in a vertical plane) of this VCF sensor group. As shown in FIG. 2A, biasing and readout circuitry is coupled to layers X01, X02, X03, X04, and X05, and to substrate X11.

Blue, green, and red photodiode sensors are formed by the junctions between the n-type and p-type regions of FIG. 2A, and are disposed at different depths beneath the surface of the semiconductor structure. The red, green, and blue photocharge signals are all taken from the n-type cathodes (X01, X02, and X03) of three isolated photodiodes.

The readout circuitry of FIG. 2A is of the non-storage type, and is similar to that described in above-referenced U.S. Patent Application Publication No. US 2002/0058353A1. Readout circuitry for each sensor includes a reset transistor (54b for the blue sensor, 54g for the green sensor, and 54r for the red sensor) driven from a RESET signal line and coupled between the photodiode cathode and a reset potential (identified as $V_{REF}$ in FIG. 2A), a source-follower amplifier transistor (one of transistors 56b, 56g, and 56r) whose gate is coupled to the photodiode cathode and whose drain is maintained at potential $V_{SFD}$ during operation, and a row-select transistor (one of transistors 58b, 58g, and 58r) driven from a ROW-SELECT signal line and coupled between the source of the relevant source follower amplifier transistor and a row line. The suffixes "r," "g," and "b" are used to denote the wavelength band (red, green, or blue) associated with each transistor. As is known in the art, the RESET signal is active to reset the pixel and is then inactive during exposure, after which the row select line is activated to read out the detected signal.

Each of p-type regions X09, X10, and X11 is held at ground potential during operation. Each of n-type layers X01, X02, and X03 is a carrier-collection element having a contact portion accessible to (and that can be coupled to) the biasing and readout circuitry. Before each readout of the sensor group, the biasing circuitry resets each of the n-type layers to the reset potential (above ground potential). During exposure to radiation to be sensed, the reversed-biased pairs of adjacent p-type and n-type layers function as photodiodes: a first photodiode whose cathode is layer X01 and whose anode is layer X09; a second photodiode whose cathode is layer X02 and whose anodes are layers X09 and X10; and a third photodiode whose cathode is layer X03 and whose anodes are layers X10 and X11. As shown in FIG. 2, each of the n-type layers X01, X02, and X03 is coupled to biasing and readout circuitry and thus serves as a photodiode terminal.

During typical operation when the photodiodes of FIG. 2 are reverse biased, depletion regions are formed which encompass the majority of the silicon in which photons are absorbed. In FIG. 2, the depletion region for the first photodiode (which senses primarily blue light) is labeled "X04," the depletion regions for the second photodiode (which senses primarily green light) are labeled "X05" and "X06," and the depletion regions for the third photodiode (which senses primarily red light) are labeled "X07" and "X08." The fields within the depletion regions separate the electron hole pairs formed by the absorption of photons. This leaves charge on the cathode of each photodiode, and readout circuitry coupled to each cathode converts this charge into an electrical signal. The charge on the cathode of each photodiode is proportional to the number of photons absorbed by the photodiode. This proportionality is the quantum efficiency, QE.

FIG. 3 shows the same curves shown in FIG. 1 (indicative of the absorption of blue, green, and red photons by silicon) and also includes lines indicating the extent of the carrier-collection elements (X01, X02, and X03) and depletion regions of the FIG. 2 structure. Thus, the region labeled "X01+X04" in FIG. 3 represents the region of FIG. 2 above the lower surface of depletion region X04, the region labeled "X05+X02+X06" in FIG. 3 represents the region of FIG. 2 between the upper surface of depletion region X05 and the lower surface of depletion region X06, and the region labeled "X07+X03+X08" in FIG. 3 represents the region of FIG. 2 between the upper surface of depletion region X07 and the lower surface of depletion region X08. FIG. 3 thus illustrates the three distinct "sensor" regions in which the three photodiodes of FIG. 2 absorb photons and in which charge resulting from such absorption remains (and does not migrate outside the sensor region in which it is produced) and can be measured by readout circuitry. It should be recognized, however, that electron-hole pairs created between the three sensor regions (e.g., electron-hole pairs created in layer X09 between the lower surface of depletion region X04 and the upper surface of depletion region X05) can still diffuse (with high efficiency) into the sensor regions and create charge on the photodiodes that can be measured by readout circuitry.

The selective absorption of photons by wavelength determines the photo response of the three photodiodes. If one considers the position of the sensor regions ("X01+X04,"

"X05+X02+X06," and "X07+X03+X08") in relation to the curves of FIG. 3 for 450 nm, 550 nm and 650 nm photons, one will see that the depth and extent of the sensor regions determines the spectral response. In the "X01+X04" region, much more incident blue light is absorbed than incident green and red light, but some small amount of green and red light is absorbed. In the "X01+X04" region much less incident green light is absorbed than incident blue light, and much more incident green light is absorbed than incident red light. In the "X05+X02+X06" region, more incident green light is absorbed than incident blue light (since most of the blue light incident at region "X01+X04" is absorbed in that region and does not reach region "X05+X02+X06"), and more incident green light is absorbed than incident red light (even though only a small amount of the red light incident at region "X01+X04" is absorbed in that region so that most such red light reaches region "X05+X02+X06").

Figure 4:
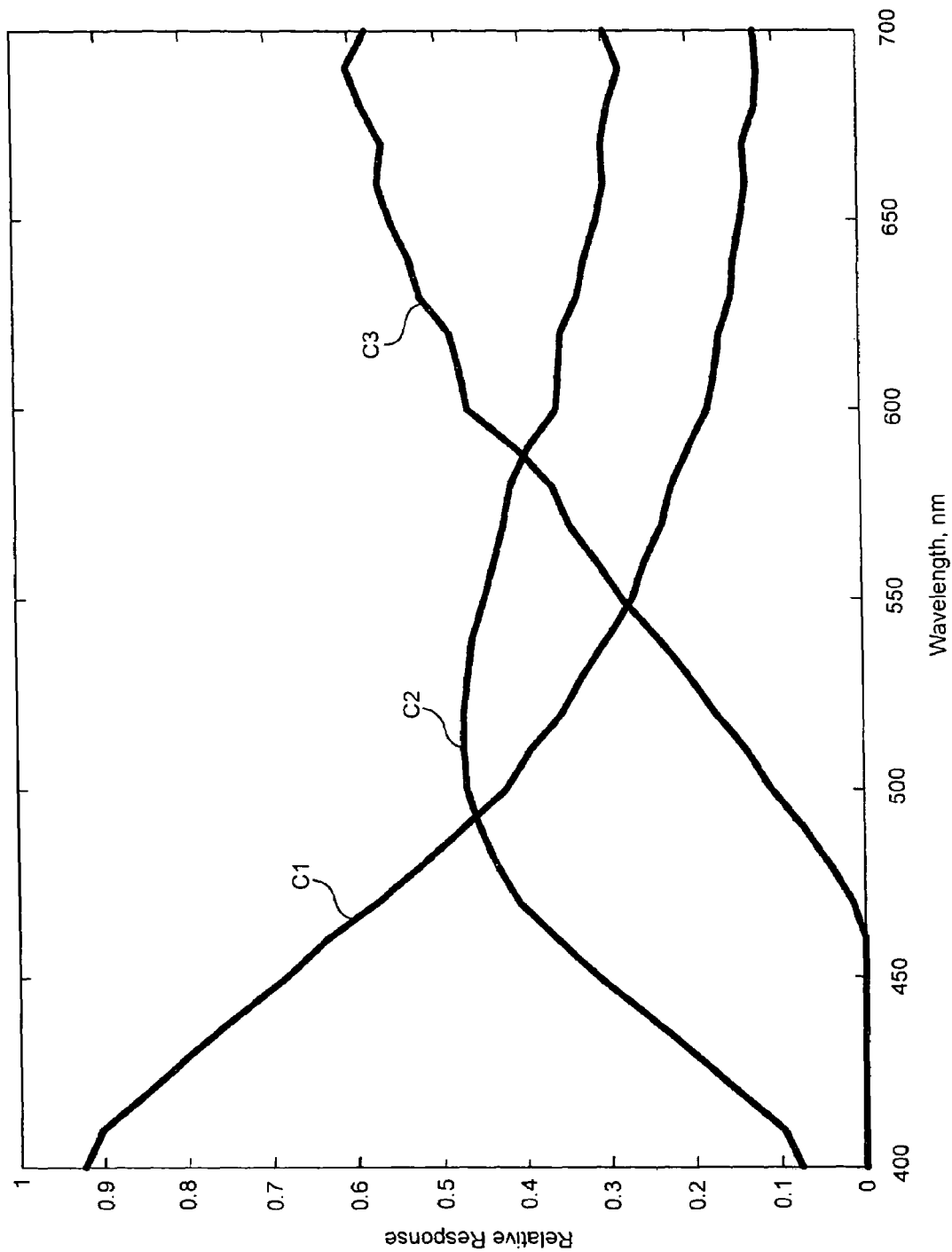
FIG. 4 is a graph of the spectral response of the three photodiodes of the sensor group whose profile is similar to that shown in FIG. 2.

The full range of incident wavelengths (not just the three wavelengths 450 nm, 550 nm and 650 nm) determines the spectral response of the three photodiodes of FIG. 2, which is similar to that shown in FIG. 4. Curve C1 in FIG. 4 is the spectral response of a top ("blue") photodiode similar to the top ("blue") photodiode of FIG. 2, curve C2 in FIG. 4 is the spectral response of a middle ("green") photodiode similar to the middle ("green") photodiode of FIG. 2, and curve C3 in FIG. 4 is the spectral response of a bottom ("red") photodiode similar to the bottom ("red") photodiode of FIG. 2.

In an important class of embodiments (including the VCF sensor group of FIG. 2), the inventive VCF sensor group implements three photodiodes. Such VCF sensor groups are well suited for use in a DSC or digital video camera. However, in other embodiments, the inventive VCF sensor group implements two (or more than three) photodiodes placed at different depths within a volume consisting at least mainly of semiconductor material.

As noted, materials whose absorptivity varies with wavelength change the spectral content of radiation that propagates through them as a function of depth into the material. Such materials can have multiple functions in VCF sensor groups: they can function as filters and also as sensors (or elements of sensors). For example, in the FIG. 2 embodiment each of the silicon regions X01, X02, X03, X09, X10, and X11 functions as a filter and also as an element of at least one sensor. In other embodiments, other semiconductors (or layers of at least two different semiconducting materials) similarly function both as sensors (or elements of sensors) and as filters.

In a class of embodiments, the inventive vertical color filter ("VCF") sensor group includes vertically stacked sensors, the sensors include a top sensor having a top surface (e.g., surface T of FIG. 10A), and radiation to be sensed is incident at the top surface and propagates into the top sensor (through the top surface) before reaching any other sensor of the group. The top surface defines a normal axis (e.g., axis N of FIG. 10A) and is typically at least substantially planar). Preferably, the sensors are configured such that when radiation propagating along a vertical axis (e.g., axis A of FIG. 10A) of the group (defined above) is incident at the group, the radiation is incident at the top sensor with an incidence angle (e.g., angle I of FIG. 10A) of less than about 30 degrees with respect to the normal axis.

Figure 5:
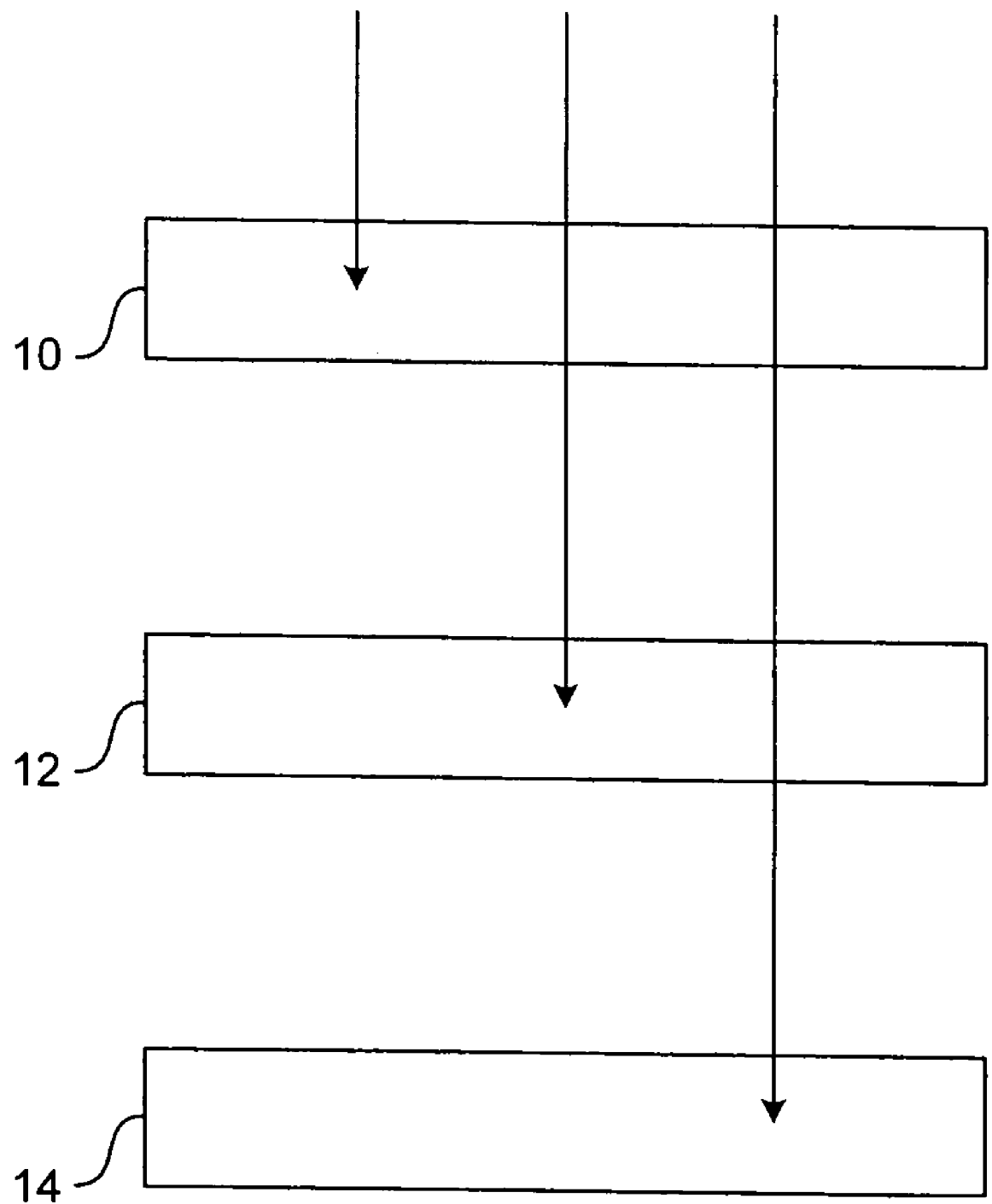
FIG. 5 is a simplified cross-sectional view (in a vertical plane) of an embodiment of the inventive VCF sensor group.
Figure 7:
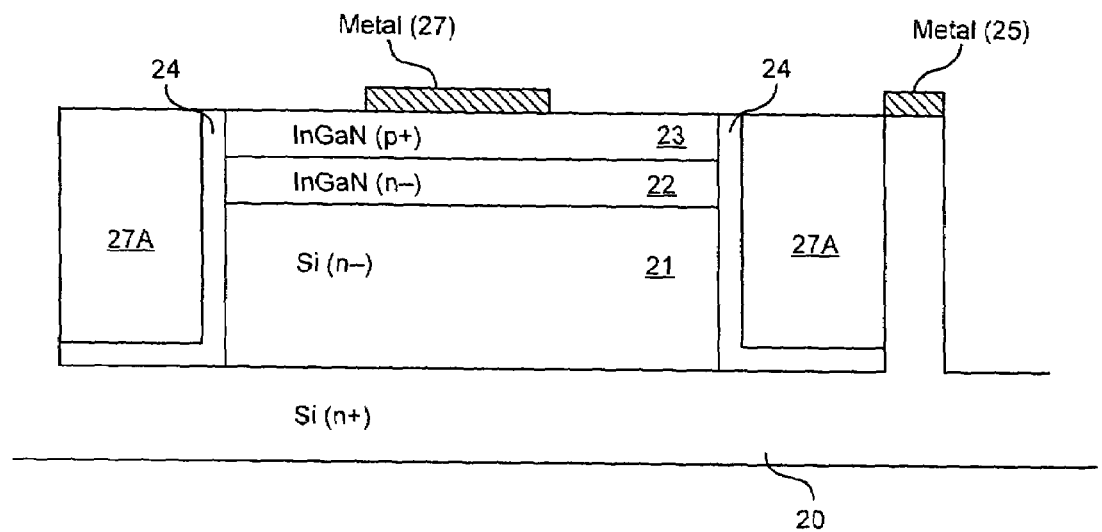
FIG. 7 is a cross-sectional view of an avalanche sensor that can be included in an embodiment of the inventive VCF sensor group.

Next, with reference to FIGS. 5, 6, and 7, we describe embodiments in which semiconductor materials other than silicon (e.g., InGaN or other III-V semiconductor materials, or semiconductor materials other than silicon that are not III-V materials) are used to form a VCF sensor group. One such semiconductor material that is neither silicon nor a III-V material is silicon carbide. FIG. 5 is a simplified cross-sectional view (in a vertical plane) of a VCF sensor group including top sensor 10, bottom sensor 14, and middle sensor 12 positioned between sensors 10 and 14. Each of sensors 10 and 12 consists of $In_xGa_{1-x}N$ semiconductor material, where x=0.475 for sensor 10 and x=0.825 for sensor 12. Sensor 14 consists essentially of silicon. Typically, each of sensors 10 and 12 consists of multiple layers of $In_xGa_{1-x}N$ semiconductor that determine at least one junction that is biased during operation to function as a photodiode, and sensor 14 consists of multiple layers of silicon having different doping (e.g., a layer of n-type silicon, and adjacent portions of p-type silicon layers above and below the n-type layer) that are biased during operation to function as a photodiode.

It is within the scope of the invention to employ sensors that consist essentially of one or more III-V semiconductor materials, and determine junctions (of any kind, including heterojunctions and Schottky barriers) that are biased during operation to function as photodiodes.

FIG. 6 is a table that lists the bandgap energy (in the center column labeled "Energy gap") in electron volts of $In_xGa_{1-x}N$ semiconductor having different levels of Indium content (different values of the subscript "x"). FIG. 6 also lists (in the right column) the optical wavelength corresponding to each bandgap energy. Thus, FIG. 6 indicates that the maximum wavelength that can be absorbed by a sensor made of $In_{0.1}Ga_{0.9}N$ semiconductor is 388 nm, that the maximum wavelength that can be absorbed by sensor 10 of FIG. 5 (made of $In_{0.475}Ga_{0.525}N$ semiconductor) is about 500 nm, and that the maximum wavelength that can be absorbed by sensor 12 of FIG. 5 (made of $In_{0.825}Ga_{0.175}N$ semiconductor) is about 612 nm.

Thus, sensor 10 transmits all (or substantially all) the green and red light incident thereon and preferably has thickness sufficient for it to absorb all (or substantially all) blue light incident on the FIG. 5 sensor group. Similarly, sensor 12 transmits all (or substantially all) the red light incident thereon and preferably has thickness sufficient for it to absorb all (or substantially all) green light incident on the FIG. 5 sensor group. Sensor 14 preferably has thickness sufficient for it to absorb all (or at least a significant amount of the red light incident thereon.

In general, when using $In_xGa_{1-x}N$ semiconductor material (or other III-V semiconductor material) to form a VCF sensor group, the parameters of the material (e.g., the parameter "x" in $In_xGa_{1-x}N$) are chosen to achieve the desired band gap energy for each sensor of the VCF sensor group (e.g., so as to make one sensor transparent to light having wavelength greater than a threshold, where the threshold is determined by the band gap energy).

More generally, in some preferred embodiments of the invention, at least one semiconductor material other than silicon is employed to implement at least one sensor of a VCF sensor group, and the material is chosen to make different sensors of the group selectively sensitive to different wavelength bands. In some such preferred embodiments, at least two different types of semiconductor materials are employed to implement sensors of a VCF sensor group, and the materials are chosen to make different sensors of the group selectively sensitive to different wavelength bands.

Some embodiments of the inventive VCF sensor group include at least one "avalanche" photodiode, which is a photodiode that collects more than one electron per absorbed photon as a result of an "avalanche" gain process. In an avalanche gain process, a first electron-hole pair generated by absorption of a photon generates at least one additional electron-hole pair, assuming that the energy of the electron of the first electron-hole pair exceeds the bandgap energy of semiconductor material that forms the photodiode sensor. A semiconductor material has an ionization coefficient ($a_n$) for electrons and an ionization coefficient ($a_p$) for holes, where $1/a_n$ is the average distance over which an electron is accelerated in the material before it creates an electron/hole pair by impact ionization, and $1/a_p$ is the average distance over which a hole is accelerated in the material before it creates an electron/hole pair by impact ionization. It is much more difficult to implement a practical avalanche photodiode when the photodiode is formed of semiconductor material in which the ratio of ionization coefficients, $a_p/a_n$, is nearly equal to one than in the case that the photodiode is formed of semiconductor material in which the ratio of ionization coefficients, $a_p/a_n$, is much greater than one or much less than one.

In some embodiments of the invention, at least one sensor of a VCF sensor group is an avalanche sensor that includes an optical absorption region and an avalanche region separate from the optical absorption region. For example, FIG. 7 is a cross-sectional view of such an avalanche sensor that can be included in a VCF sensor group. The sensor of FIG. 7 comprises substrate 20 (made of n+ silicon), layer 21 (made of n– silicon) on substrate 20, layer 22 (made of n-type $In_xGa_{1-x}N$ semiconductor material having a relatively low dopant concentration) on layer 22, and layer 23 (made of p-type $In_xGa_{1-x}N$ semiconductor material having a relatively high dopant concentration) on layer 23. Metal contact 27 is formed on layer 23, and substrate 20 is coupled to metal contact 25 by a vertically oriented contact region consisting of n+ silicon. In operation, bias voltage is applied across metal contacts 25 and 27, and readout circuitry can be coupled to contact 27. Isolation is provided by dielectric material 27A (which can consist of photoresist, e.g., polymethylglutarimide resist) around layers 21, 22, and 23, and dielectric material 24 (which can be silicon nitride) between layers 21, 22, and 23 and dielectric material 24 (and between substrate 20 and material 24).

In operation, layers 22 and 23 function as an optical absorption region in which electron-hole pairs are formed in response to incident photons. The $In_xGa_{1-x}N$ semiconductor material that forms layers 22 and 23 has a ratio of ionization coefficients ($a_p/a_n$) that is much greater (or much less) than one, and thus layers 22 and 23 are not utilized as an avalanche gain region.

In operation, layers 21 and 20 function as an avalanche gain region in which electron-hole pairs are formed in response to electron-hole pairs formed in the optical absorption region. The silicon that forms layers 22 and 23 has a ratio of ionization coefficients ($a_p/a_n$) that is much closer to one than is the ratio of ionization coefficients for layers 22 and 23.

In general, some embodiments of the inventive VCF sensor group include at least one sensor that is an avalanche photodiode, wherein the avalanche photodiode includes an optical absorption region made of semiconductor material (e.g., InGaN) whose ionization coefficient for electrons is very different than its ionization coefficient for holes, and an avalanche region separate from the optical absorption region made of another semiconductor material (e.g., silicon) having more nearly equal ionization coefficients for electrons and holes. It is contemplated that one important use of a sensor implemented as an avalanche photodiode is to sense radiation of low intensity, such as radiation that has had its intensity significantly reduced (e.g., by absorption) during propagation through at least one filter and/or at least one other sensor before reaching the avalanche photodiode.

In other embodiments of the inventive VCF sensor group, at least one filter that does not function as a sensor (or sensor element) is stacked with at least one layer of semiconductor material that functions as a sensor (or as an element or one or more sensors). Such a filter can, but need not, have the same spectral sensitivity as does the silicon in the FIG. 2 embodiment.

Filters remove wavelengths from radiation in the following sense. For each filter, there are first and second wavelengths such that, if the first and second wavelengths are incident at the filter with intensities "I1" and "I2," respectively, and the transmitted intensities of the first and second wavelengths (after transmission through the filter) are "O1" and "O2," respectively, then $O1 \leq I1$, $O2 \leq I2$, and $O1/O2 < I1/I2$.

One type of filter that is included in some embodiments of the inventive VCF sensor group is a "conversion filter" (e.g., a "conversion layer") that changes the wavelengths of electromagnetic radiation that is incident thereon. A "conversion" filter absorbs photons of one wavelength and emits photons at at least one shorter or longer wavelength. Typically, the material that comprises a conversion filter is a non-linear optical material. A conversion filter can be used to convert photons with frequencies below a sensor cutoff frequency to higher frequencies so that they can be detected. Alternatively, a conversion filter can be used to convert photons with frequencies above a threshold frequency to lower frequencies so that they can be detected. An example of the latter is the X-ray conversion layer used to convert X-rays, which easily penetrate most detecting materials, to visible light which is easily detected. Either a layer of Gadolinium Oxy-sulfide having thickness of about 100 μm, or a layer of Cesium Iodide doped with Thallium having thickness in the range from about 100 μm to 600 μm could be used as such an X-ray conversion layer in some embodiments of the invention.

There are two related ways of detecting photons in a group of spectral bands, and each can be used to implement the invention. In some embodiments of the inventive VCF sensor group, at least one filter removes photons outside at least one wavelength band and at least two vertically stacked sensors detect remaining photons, where each sensor is an element distinct from each filter. Other embodiments of the inventive VCF sensor group do not include a non-sensor filter (a filter that is not a sensor), but do include sensors that are sensitive to limited wavelength bands. Other embodiments of the invention implement combinations of these approaches, for example by including a first sensor and a second sensor below the first sensor, where the first sensor absorbs a limited range of wavelengths and passes photons outside this range to the second sensor, and the second sensor is sensitive to all wavelengths. In the example, the first sensor functions as a filter for the second sensor.

In some embodiments of the invention, at least one non-sensor filter is positioned between at least one pair of vertically stacked sensors of a VCF sensor group, or above the top sensor of the group, or below the bottom sensor of the group. When such a filter is positioned between a pair of vertically stacked sensors of a VCF sensor group, the filter can be of any of a variety of different types, including (but not limited to the following): the filter can absorb radiation in one wavelength band and transmit other wavelengths without reflecting significant radiation of any wavelength; the filter can reflect radiation in one wavelength band and transmit other wavelengths without absorbing significant radiation of any wavelength; or the filter can be highly transmissive to radiation in one wavelength band, absorptive of radiation in another wavelength band, and reflective of radiation in a third wavelength band. The VCF sensor group of FIG. 8 includes two non-sensor filters of the latter type: color filter 43 and color filter 48. It should be appreciated that the FIG. 8 sensor group is only one example of the many embodiments of the invention that are contemplated.

Figure 8:
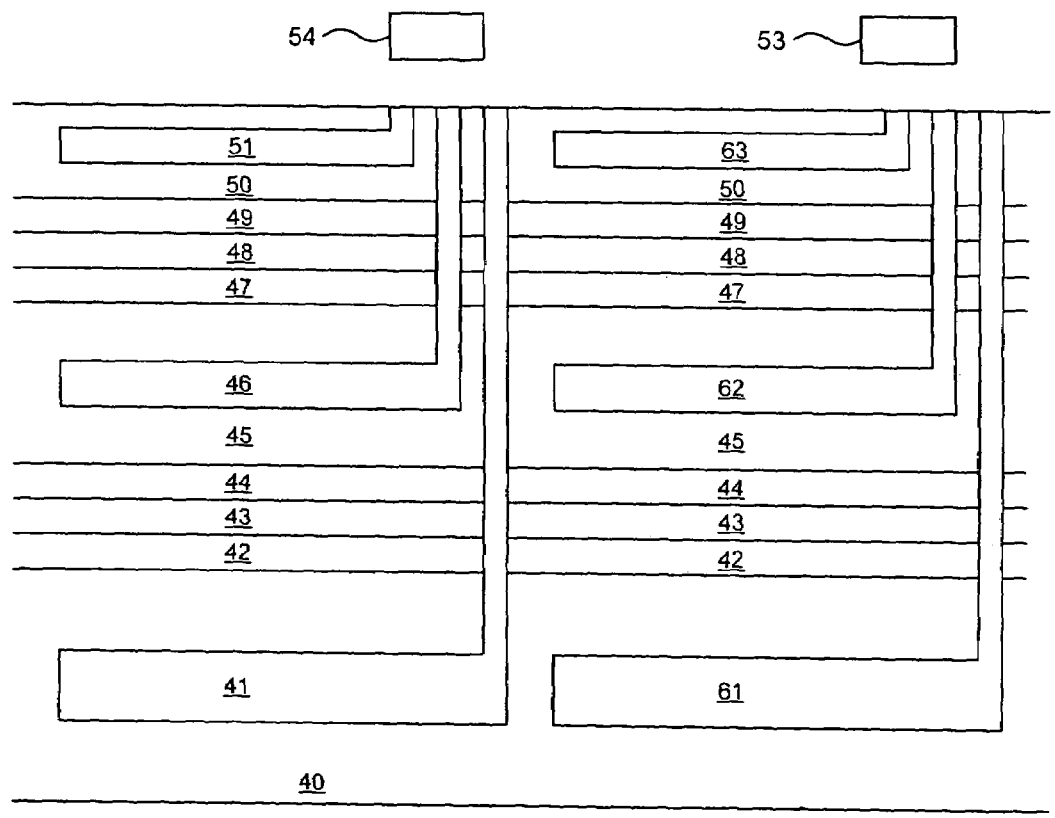
FIG. 8 is a cross-section view of a portion of an array of the inventive VCF sensor groups, each sensor group in the array including two non-sensor filters and three sensors.

FIG. 8 is a cross-sectional view (in a vertical plane) of a portion of one embodiment of an array of the inventive VCF sensor groups which includes two non-sensor filters (layers 43 and 48) and four insulation layers (diffusion barriers 42, 44, 47, and 48). Each insulation layer can consist of silicon dioxide. In FIG. 8, one VCF sensor group comprises layer 51 (made of n-type semiconductor) and layers of p-type semiconductor material 50 above and below layer 51, insulating layer 49 below material 50, color filter 48 below layer 49, insulating layer 47 below filter 48, layer 46 (made of n-type semiconductor) and layers of p-type semiconductor material 45 above and below layer 46, insulating layer 44 below material 45, color filter 43 below layer 44, insulating layer 42 below filter 43, and layer 41 (made of n-type semiconductor) and p-type semiconductor substrate material 40 above and below layer 41. Vertically oriented plug contacts connect each of layers 41, 46, and 51 to the sensor group's top surface, so that each of layers 41, 46, and 51 can be coupled to biasing and readout circuitry. Light shield 54 is mounted above the plug contacts to prevent radiation (normally incident at the sensor groups' top surface) from reaching the plug contacts, which would reduce frequency selectivity. The array of FIG. 8 also includes a second VCF sensor group comprising layer 63 (made of n-type semiconductor) and layers of the p-type semiconductor material 50 above and below layer 63, insulating layer 49 below material 50, color filter 48 below layer 49, insulating layer 47 below filter 48, layer 62 (made of n-type semiconductor) and layers of the p-type semiconductor material 45 above and below layer 62, insulating layer 44 below material 45, color filter 43 below layer 44, insulating layer 42 below filter 43, and layer 61 (made of n-type semiconductor) and p-type semiconductor substrate material 40 above and below layer 61. Vertically oriented plug contacts connect each of layers 61, 62, and 63 to the sensor group's top surface, so that each of layers 61, 62, and 63 can be coupled to biasing and readout circuitry. Light shield 53 is mounted above the plug contacts of the second VCF sensor group to prevent radiation (normally incident at the sensor groups' top surface) from reaching the plug contacts.

In variations on the FIG. 8 embodiment, horizontally oriented variations on n-type layers 51 and 63 (which lack vertically oriented contact portions) are exposed at the top surface of the sensor group (and are not covered by semiconductor material 50). Each such exposed, n-type layer can be directly connected (e.g., by a metal contact formed thereon) to biasing and readout circuitry. Similarly, in variations on the FIG. 8 embodiment, n-type layers 46 and 62 lie directly under layer 47 (and are not separated from layer 47 by p-type semiconductor material 45) and n-type layers 41 and 61 lie directly under layer 42 (and are not separated from layer 42 by p-type semiconductor material 40).

Each of the p-type semiconductor layers of FIG. 8 is held at ground potential during operation. Each of the n-type layers is coupled by a plug contact that is accessible to (and can be coupled to) biasing and readout circuitry. Before each readout of each sensor group, biasing circuitry resets each of the n-type layers to a reference potential (above ground potential). During exposure to radiation to be sensed, the reversed-biased pairs of adjacent p-type and n-type layers of the first sensor group function as photodiodes: a first photodiode whose cathode is layer 51 and whose anodes are the adjacent layers of material 50 (referred to as a "blue" sensor since it absorbs more blue photons than green or red photons in response to white light incident at the top of the sensor group); a second photodiode whose cathode is layer 46 and whose anodes are the adjacent layers of material 45 (referred to as a "green" sensor since it absorbs more green than blue or red photons when white light is incident at the top of the sensor group); and a third photodiode whose cathode is layer 41 and whose anodes are the adjacent layers of material 40 (referred to as a "red" sensor since it absorbs more red than blue or green photons when white light is incident at the top of the sensor group). During exposure to radiation to be sensed, the reversed-biased pairs of adjacent p-type and n-type layers of the second sensor group also function as photodiodes: a first photodiode whose cathode is layer 63 and whose anodes are the adjacent layers of material 50 (also referred to as a "blue" sensor since it absorbs more blue photons than green or red photons in response to white light incident at the top of the second sensor group); a second photodiode whose cathode is layer 62 and whose anodes are the adjacent layers of material 45 (referred to as a "green" sensor since it absorbs more green than blue or red photons when white light is incident at the top of the second sensor group; and a third photodiode whose cathode is layer 61 and whose anodes are the adjacent layers of material 40 (referred to as a "red" sensor since it absorbs more red than blue or green photons when white light is incident at the top of the second sensor group).

When layers 40, 41, 45, 46, 50, and 51 are made of crystalline silicon (as is typical), layers 51 and 50 are preferably thinner than layers 46 and 45, respectively, and layers 41 and 40 are thinner than layers 51 and 50, respectively, by amounts sufficient to ensure that the intensity ratio of green light to red light incident at each green sensor is sufficiently high while ensuring that much more red light than green light is incident at each red sensor and that much more blue light than green light is absorbed by each blue sensor. Typically, the combined thickness of layers 51 and 50 in the first sensor group (and layers 63 and 50 in the second sensor group) is 0.3 μm or less and the combined thickness of layers 45 and 46 in the first sensor group (and layers 45 and 62 in the second sensor group) is about 0.5 μm.

Color filter 43 is a "red pass/cyan reflect" filter that is highly transmissive to red light but reflects most or nearly all of the blue and green light incident thereon. Color filter 48 is a "yellow pass/blue reflect" filter that is highly transmissive to red and green light incident thereon but reflects most or nearly all the blue light incident thereon. Other embodiments of the invention employ transmissive filters that are not reflective.

Filter 43 functions to increase the ratio of red to green light (and the ratio of red to blue light) that is absorbed by each red sensor, and can reduce or eliminate red/green discrimination problems that might otherwise affect the red sensors if filter 43 were omitted. Similarly, filter 48 functions to increase the ratio of green to blue light that is absorbed by each green sensor, and can reduce or eliminate green/blue discrimination problems that might otherwise affect the green sensors if filter 48 were omitted.

Filter 48 also functions to increase the ratio of blue to green (and red) light that is absorbed by each blue sensor, since blue light reflecting from filter 48 has another chance to be absorbed in a blue sensor. Each blue sensor's absorption of blue light is improved without increasing its response to red and green light, since there is no more than insignificant reflection of red and green light from filter 48 back into the blue sensors. Similarly, filter 43 also functions to increase the ratio of green to red light that is absorbed by each green sensor, since green light reflecting from filter 43 has another chance to be absorbed in a green sensor. Each green sensor's absorption of green light is improved without increasing its response to red light, since there is no more than insignificant reflection of red light from filter 43 back into the green sensors. Very little blue light reaches the green sensors since nearly all the blue light is either absorbed in the blue sensors or reflected back toward the blue sensors by filter 48.

There are a wide variety of materials that may act as a filter in a VCF sensor group (e.g., filter 43 or 48 in FIG. 8, or a filter that is reflective of a wavelength band but transmissive to all other wavelengths, or a filter that is absorptive of a wavelength band but not reflective). These materials may be used in combination or in various thicknesses. The arrangements are determined partly by their optical properties, but also in good measure by process integration considerations.

Materials and interfaces between materials can reflect photons. When a mirror's reflectivity is selective by wavelength, the mirror (either a material or an interface between materials) can function as a filter in the inventive VCF sensor group. For example, some embodiments of the inventive VCF sensor group include a dichroic mirror that both transmits radiation in a first wavelength band and reflects radiation in a second wavelength band.

As discussed above, stacked layers of material whose optical absorption varies with wavelength can be used as filters in various embodiments of the inventive VCF sensor group. In preferred embodiments that include layers of differently doped semiconductor material (e.g., silicon), at least one semiconductor layer is used both as a filter and a sensor. In a VCF sensor group in which a layer of semiconductor material is used both as a filter and as a cathode (or anode) of a photodiode sensor, the sensor's spectral sensitivity can be controlled somewhat by controlling the bias voltage applied across the photodiode's anode(s) and cathode, and can also be controlled by determining the doping levels and locations of the dopant atoms, and the structure spacing of sensor elements.

Another type of filter that is included in some embodiments of the invention is a thin metal film. Thin metal films can act as partial reflectors and thereby filter incoming photons. The reflected photons return through any layers above them, which gives them a second chance to be absorbed.

Other types of filter that are included in some embodiments of the invention are interference filters (e.g., stacks of layers of dielectric material having differing dielectric constants) that reflect certain wavelengths and pass others, and organic and inorganic dyes and pigments.

Figures 8A, 8B:
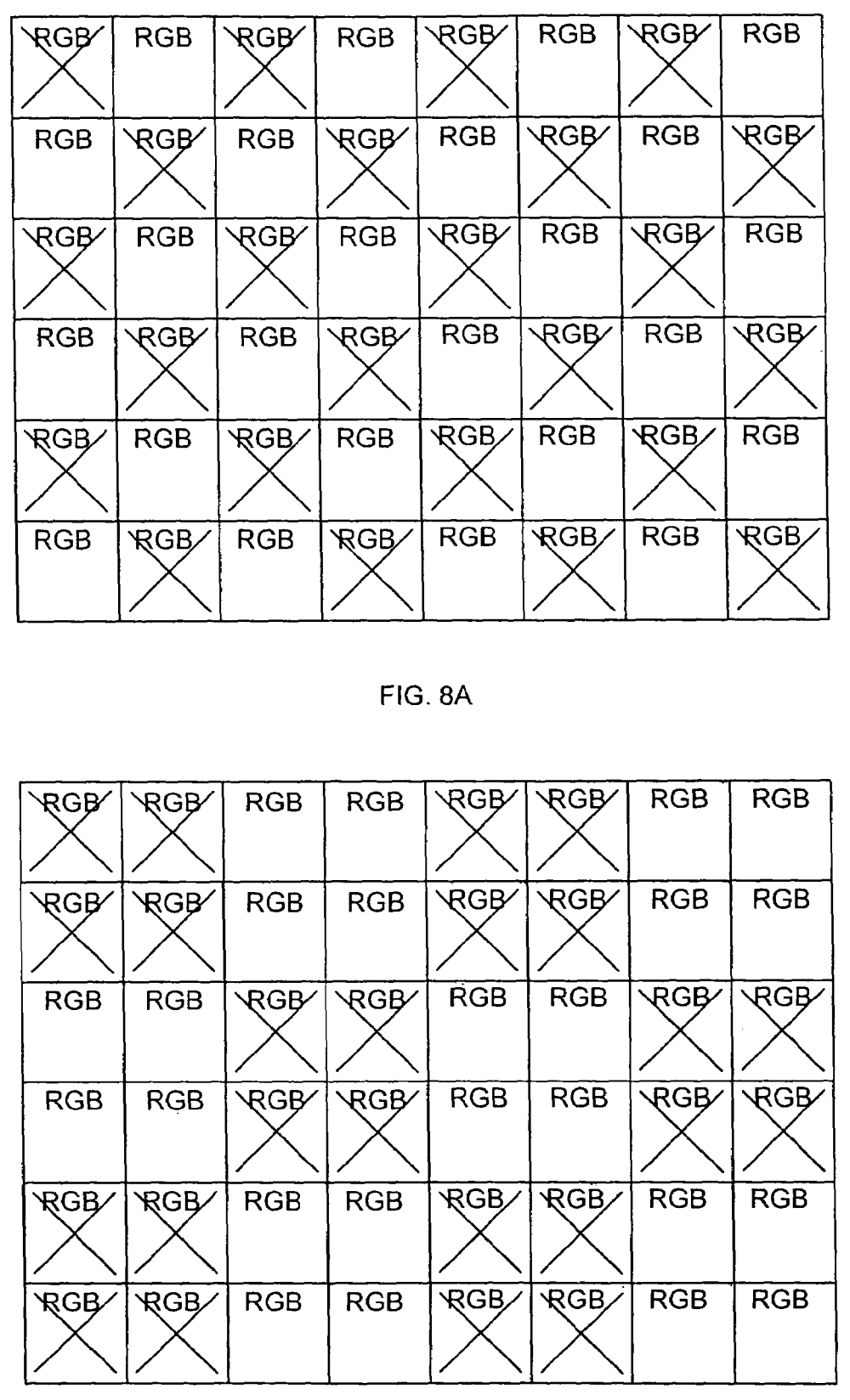

In some embodiments of the invention, filters are distributed among VCF sensor groups of an array in any of a variety of patterns, for example, as described in parent application Ser. No. 10/103,304. The filters can, but need not, all be identical. Preferably, each filter is integrally formed with one of the VCF sensor groups (e.g., as a layer formed on a semiconductor layer or between semiconductor layers). Alternatively, the filters can be fabricated separately from the sensor groups and then positioned over the sensor group array and bonded to (or otherwise attached or held in a fixed position relative to) the VCF sensor groups. The filters can be provided in an alternating or "checkerboard" manner as shown in FIG. 8A, in which each square labeled "RGB" indicates a VCF sensor group, and each square marked with an "X" indicates a VCF sensor group including one of the filters. As shown in FIG. 8A, each odd-numbered sensor group in each odd-numbered row includes one of the filters, and each even-numbered sensor group in each even-numbered row includes one of the filters, thus obtaining optimal spatial frequency between color sensor groups having a filter and color sensor groups not having a filter.

Alternatively, the filters can be provided a pattern as shown in FIG. 8B, in which each square labeled "RGB" indicates a VCF sensor group, and each square marked with an "X" indicates a VCF sensor group including one of the filters. When the filters are provided in the FIG. 8B pattern, the filters are distributed in a manner that permits both full-measured color readout and mosaic emulation readout, while guaranteeing that both types of image readouts contain every combination of color sensor group output and color filter. Alternatively, filters can be distributed among the sensor groups of a VCF sensor group array in any of many other patterns, some of which are described in parent application Ser. No. 10/103,304.

Figure 9:
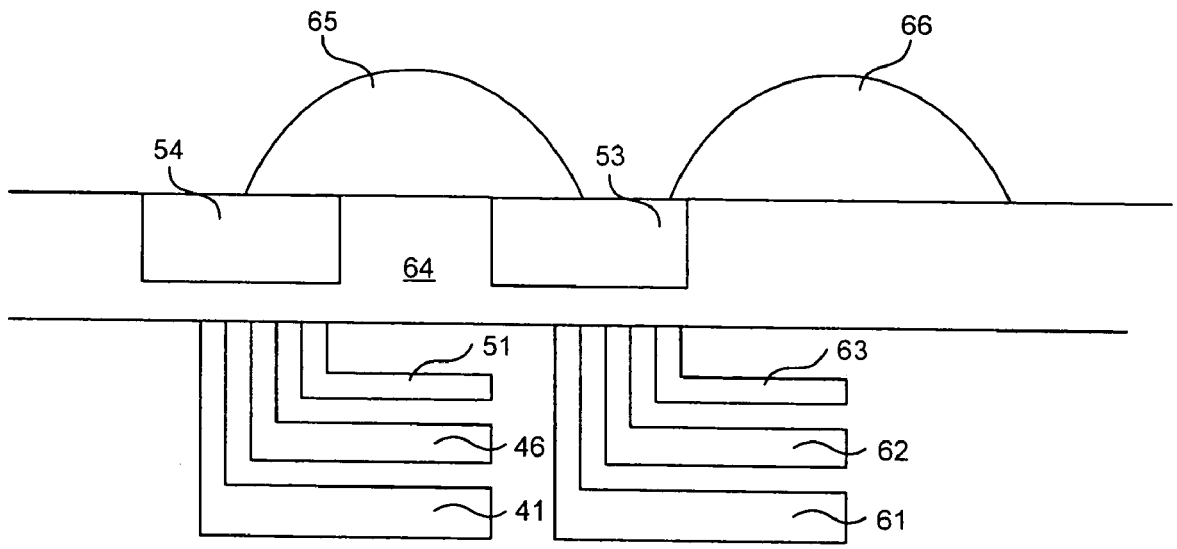
FIG. 9 is a cross-section view of a portion of an array of the inventive VCF sensor groups, in which a micro-lens is formed over each sensor group of the array.

Some embodiments of the inventive VCF sensor group include at least one lens in instead of or in addition to at least one filter. For example, a micro-lens can be formed over each of all or some of the VCF sensor groups of a VCF sensor group array. In some cases when metallization (or another structure) limits the size of the aperture of a VCF sensor group (the area in the imaging plane in which incident radiation will propagate to at least one sensor), photoresist can be deposited on the aperture and then developed so that the photoresist material melts into a concave or convex shape thereby forming a micro-lens. Depending on the characteristics of the material comprising a lens and the lens shape, a lens can function as a filter as well as a lens. For example, FIG. 9 is a cross-sectional view (in a vertical plane) of a portion of a variation the VCF sensor group array of FIG. 8. The FIG. 9 array includes a first VCF sensor group including n-type semiconductor layers 51, 46, and 41 formed in p-type semiconductor material, vertically-oriented contacts connecting each of layers 41, 46, and 51 to the sensor group's top surface, and light shield 54 mounted above the contacts to prevent radiation (normally incident at the sensor groups' top surface) from reaching the contacts. The FIG. 9 array also includes a second VCF sensor group including n-type semiconductor layers 61, 62, and 63 formed in p-type semiconductor material, vertically-oriented contacts connecting each of layers 61, 62, and 63 to the sensor group's top surface, and light shield 53 mounted above these contacts to prevent radiation (normally incident at the sensor groups' top surface) from reaching the contacts. Light shields 53 and 54 are formed in layer 64 which is transparent to the radiation to be sensed. Light shields 53 and 54 surround the first sensor group's aperture, and light shield 53 and another light shield (not shown) surround the second sensor group's aperture. Convex micro-lens 65 is formed on layer 64 over the first group's aperture and convex micro-lens 66 is formed on layer 64 over the second group's aperture.

When micro-lenses are distributed among the sensor groups of a VCF sensor group array in an alternating pattern (such as that shown in FIG. 8A), subsets of the sensor groups having different sensitivity to radiation can be selected independently. This provides an expanded dynamic range for the array as a whole.

The aperture of each sensor group of a VCF sensor group array will typically be square or octagonal but can alternatively have another shape (e.g., a rectangular, circular, or irregular shape). The micro-lenses formed over the apertures of all or some sensor groups of such an array will typically be square, but can have other shapes.

Some embodiments of the inventive VCF sensor group include at least one micro-lens that is a compound lens (e.g., a combination of a concave micro-lens and a convex micro-lens).

It is well known to form micro-lenses as a top layer of a CCD image sensor array, with one micro-lens over each sensor of the array. It is also well known to include micro-lenses as an intermediate layer of a CCD image sensor array, for example with two vertically-separated micro-lenses over each sensor of the array and a color filter between each such pair of vertically-separated micro-lenses. In some embodiments of the present invention, a micro-lens (e.g., micro-lens 65 of FIG. 9) is positioned relative to the sensors of a VCF sensor group so as to refract radiation into the top sensor of the group (e.g., the sensor including layer 51 in FIG. 9) so that at least some of the radiation will propagate through the top sensor and to each of the sensors positioned below the top sensor, assuming that the radiation includes at least one wavelength that is neither absorbed in the group nor reflected by an element of the group before it can reach the bottom sensor.

Materials already used (for other purposes) in semiconductor processing are highly desirable for implementing filters, lenses, and sensors in typical embodiments of the invention because they can be added to a VCF sensor group without modifying the process. Examples of such a material are polysilicon, silicon dioxide, and silicon nitride. A layer of polysilicon can be used as a filter whose absorption spectrum depends on its crystalline characteristics and conductivity and the layer's thickness and depth relative to other elements of a VCF sensor group. Layers of silicon dioxide and silicon nitride grown on a surface (e.g., a silicon surface) can form an interference filter in a VCF sensor group.

The expression "minimum-sized" carrier-collection element of a VCF sensor group that embodies the invention is used herein to denote each carrier-collection element of the group whose projection, on a plane perpendicular to a normal axis defined by a top surface of a top sensor of the group, has an area that is not greater than the projected area of each other carrier-collection element of the group on such plane. The expression "minimum collection area" (of a group) is used herein to denote the projected area of a minimum-sized carrier-collection element of the group, on a plane perpendicular to a normal axis defined by a top surface of a top sensor of the group. In a class of embodiments of the inventive sensor group, the carrier-collection element of one sensor of the group has substantially larger "size" (area projected in a plane perpendicular to a normal axis of a top surface of a top sensor of the group) than does each minimum-sized carrier-collection element of the group, as in the sensor groups of FIGS. 10, 10A, and 10B. In preferred embodiments in this class, one carrier-collection element of a sensor group has size that is at least twice the group's minimum collection area. This carrier-collection element is typically shared by at least one other sensor group of an array, and its size is typically at least substantially equal to the sum of the sizes of all the groups that share it.

Figure 10:
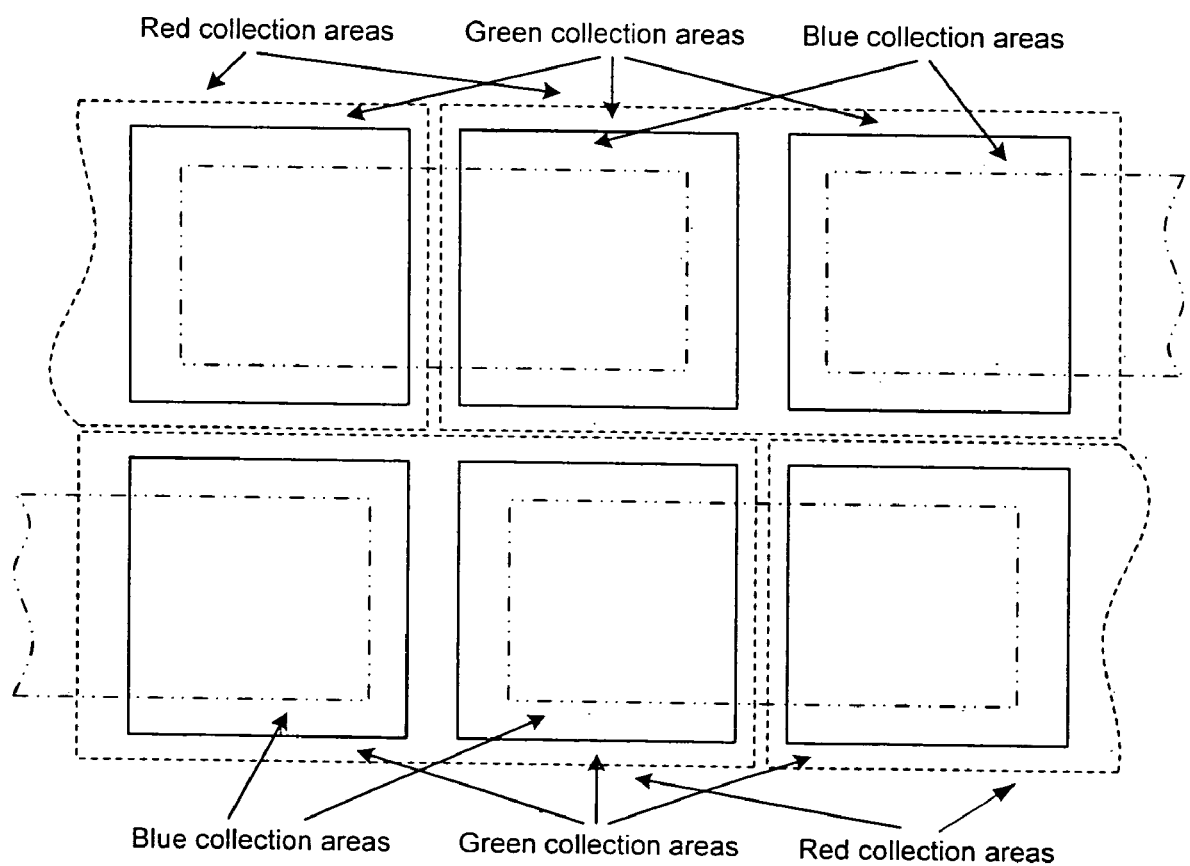
FIG. 10 is a simplified top view of a portion of an array of the inventive VCF sensor groups, in which adjacent sensor groups share carrier-collection elements.

The array of FIG. 10 includes a plurality of sensor groups, six of which are shown in FIG. 10. Each sensor group includes one green sensor (whose carrier-collection area is not shared with any other sensor group), one blue sensor (shared with one other sensor group), and one red sensor (shared with one other sensor group. The carrier-collection area of each red sensor and each blue sensor is shared by two sensor groups. The carrier-collection areas for blue and red photons are larger than the collection areas for green photons.

Figure 10A:
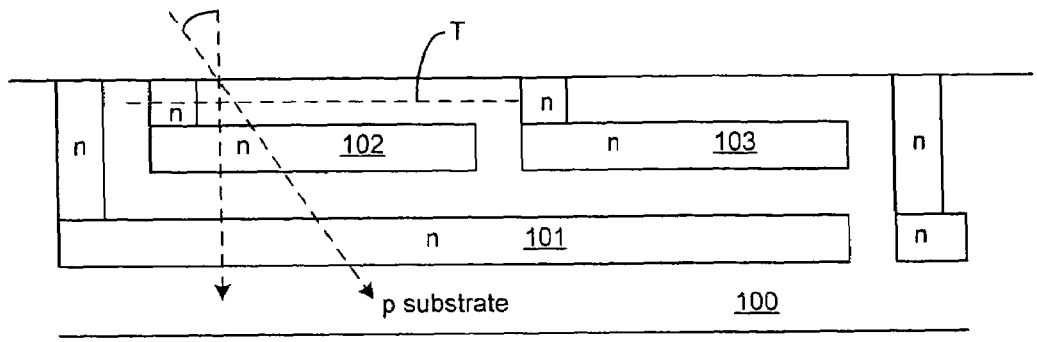
FIG. 10A is a cross-sectional view (in a vertical plane) of two VCF sensor groups of an array, in which two sensor groups share a common sensor element.
Figure 10B:
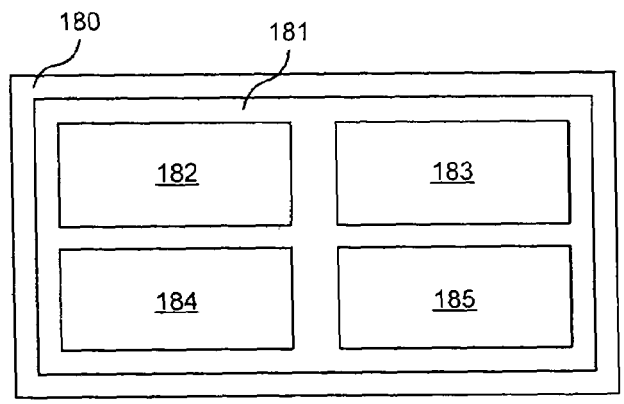
FIG. 10B is a top view of four VCF sensor groups of an array, in which the four sensor groups share carrier-collection areas for collecting carriers that have been photogenerated by absorption of red and blue photons.

In variations on the FIG. 10 or 10B array, at least one carrier-collection area (shared by two sensor groups) comprises two or more portions that are initially formed to be laterally separated from each other and are then shorted together to form a single effective carrier-collection area. For example, each blue sensor can include two laterally separated carrier-collection areas for blue photons, each formed over a different carrier-collection area for green photons, with the two carrier-collection areas for blue photons being laterally separated to provide space for forming at least one transistor on the array's top surface therebetween. The two laterally separated carrier-collection areas of each blue sensor are shorted together to form a single effective carrier-collection area for blue photons that has larger total size than each of the array's carrier-collection areas for green photons.

With reference again to FIG. 10, the electric charge collected on each red sensor is converted to an electrical signal indicative of twice the average of the incident red intensity at the two sensor groups which share the red sensor. The electric charge collected on each blue sensor is converted to an electrical signal indicative of twice the average of the incident blue intensity at the two sensor groups which share the blue sensor. Thus, the array's resolution with respect to green light is twice its resolution with respect to red or blue light. This type of array increases the signal to noise ratio in the blue and red channels while maintaining high spatial resolution in a green (or luminance-like) channel. The high luminance resolution is achieved because every pixel location has an active green sensor, in contrast with conventional image sensor arrays using the Bayer pattern that have a green sensor at only half of the pixel locations. Those of ordinary skill in the art will recognize that maintaining high luminance resolution via a higher sampling rate in the green channel will reduce the presence of aliasing artifacts in interpolated images generated with such an array. Larger blue and red carrier-collection areas further reduce the presence of aliasing artifacts.

In other embodiments, the carrier-collecting areas of the blue sensors of an array of VCF sensor groups are smaller than the carrier-collecting areas of the red and green sensors of the array.

In some embodiments of an array of VCF sensor groups, one sensor group includes at least one sensor (or element of a sensor) that is shared with another sensor group. FIG. 10A is a cross-sectional view (in a vertical plane) of such an array. In FIG. 10A, a first sensor group comprises a first sensor which in turn comprises layer 102 (made of n-type semiconductor) and the regions of p-type material 100 immediately above and below layer 102, and a second sensor which in turn comprises layer 101 (made of n-type semiconductor) and the regions of p-type material 100 immediately above and below layer 101. FIG. 10A also shows a second sensor group comprising a third sensor (which in turn comprises layer 103 made of n-type semiconductor and the regions of p-type material 100 immediately above and below layer 103) and the second sensor. Thus, the second sensor (which includes layer 101) is shared by the two sensor groups, and each of the separate first and third sensors is positioned at the same vertical level in the array.

The FIG. 10A array could be configured so that the first sensor's output is indicative of a blue component of a first pixel, the third sensor's output is indicative of a blue component of a second pixel, and the second sensor's output is indicative of a green component of both the first pixel and the second pixel. The FIG. 10A array is preferably operable in a mode in which it has better resolution with respect to green light than blue light (e.g., by using the outputs of the first, second, and third sensors separately), and in another mode in which it has equal resolution with respect to blue light and green light (e.g., by averaging the outputs of the first and third sensors, and using this averaged value with the output of the second sensor). The FIG. 10A array is a simple embodiment with sensors at only two depths. The sensor groups of other embodiments of the inventive array have sensors arranged vertically at three or more different depths.

In the VCF sensor group array of FIG. 10B, the carrier-collection elements of the red and blue sensors of each sensor group have larger size than does the carrier-collection element of the group's green sensor. The array of FIG. 10B includes a plurality of sensor groups, four of which are shown in FIG. 10B. Each sensor group includes one green sensor whose carrier-collection area (182, 183, 184, or 185) is not shared with any other sensor group, one blue sensor whose carrier-collection area (180) is shared with each of three other sensor groups, and one red sensor whose carrier-collection area (181) is shared with each of three other sensor groups. The carrier-collection areas for blue and red photons are larger than the collection areas for green photons. The electric charge collected on each red sensor (due to photon absorption) is converted to an electrical signal (typically a voltage) indicative of the average of the incident red intensity at the four sensor groups that share the red sensor. The electric charge collected on each blue sensor is converted to an electrical signal (typically a voltage) indicative of the average of the incident blue intensity at the four sensor groups that share the blue sensor. Typically, voltage outputs of the red and blue sensors of the FIG. 10B array (and variations on such array) do not need to be scaled relative to voltage outputs of the green sensors, since the increase in the electric charge collected on each sensor due to an increase in the sensor's carrier-collection area is proportional to the increase in the sensor's capacitance due to such carrier-collection area increase.

When fabricating an array of VCF sensor groups so that the output of each sensor group determines a pixel, it is necessary to isolate the sensor groups from each other to avoid cross talk between pixels. If electrons and holes created in one sensor group can drift into another, the resolution of the imager will be reduced. In preferred embodiments of the invention, such isolation is accomplished by fabricating sensor groups whose physical design contains the charge generated within them.

For example, with reference again to FIG. 10A, in the array of FIG. 10A the lower and larger "second sensor" (including layer 101) is isolated from its neighbor (partially shown but not labeled) at the same vertical level by an n-p substrate junction just as the smaller "first" and "third" sensors (including layers 102 and 103 respectively) are isolated from each other by an n-p substrate junction.

Some conventional sensor arrays do not implement such isolation between the sensors whose output determines different pixels. For example, one type of conventional sensor array, shown in FIG. 11 and described in Bartek, Sensors and Actuators A, 41–42 (1994), pp. 123–128, comprises photodiode sensors (e.g., photodiode 30) created in a layer (31) of epitaxial silicon (epi) which is in common for all the pixels. In this configuration, charge created in one sensor can drift into a neighboring sensor or possibly farther.

Figure 11:
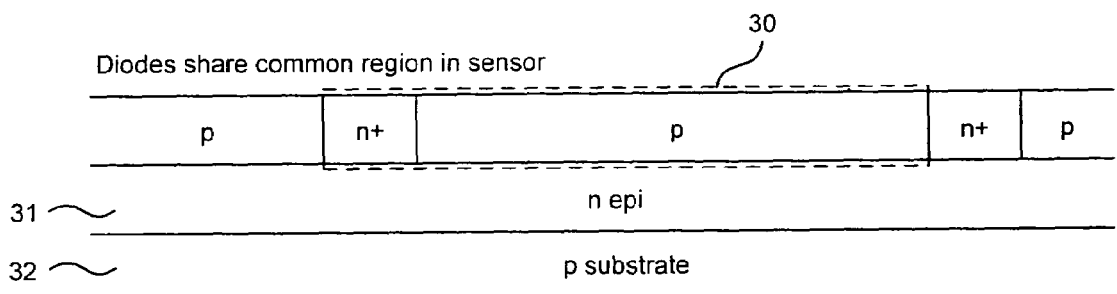
FIG. 11 is a cross-sectional view (in a vertical plane) of a portion of a conventional sensor array.

Because the structure in FIG. 11 lacks isolation regions (e.g., p-type semiconductor regions) between sensors, the common epi layer (layer 31) provides a path which can conduct carriers from under one pixel to under another.

Various methods can be used to isolate the sensors in a VCF sensor group from each other, or to isolate sensor groups (pixels) from each other in VCF sensor group array that embodies the invention. Process integration is an important factor in determining the method used. One method that can be used is junction isolation, which is commonly used to isolate transistors in silicon-based processes. The junction must be able to withstand sufficient voltage across it to prevent leakage. There may be enough doping in the substrate or an epi layer to provide adequate junction isolation, or an increased doping between neighboring regions to be isolated from each other (e.g., neighboring VCF sensor groups) may be required to implement junction isolation. This increased doping can be produced using the "field implant" techniques employed to isolate neighboring transistors in a MOS process.

Other embodiments of the inventive VCF sensor group and array of VCF sensor groups employ dielectric isolation which places an insulating material between semiconducting regions. This can be done by fabricating each sensor group in a block of semiconducting material with an oxide layer under the sensor group. There are a variety of methods for creating such a structure, such as growing silicon on sapphire, implanting a layer of oxygen through the upper layers of a silicon wafer and reacting the oxygen with the silicon to form an oxide layer, and removing a layer of processed silicon from a wafer and transferring it to an insulating substrate.

Dielectric isolation can be used to isolate semiconductor sensor groups from each other in an array of VCF sensor groups. When the sensor groups are displaced laterally from each other and formed in a volume of semiconductor material, such isolation can be implemented by forming the groups on top of an insulating layer, etching a trench in the volume of semiconductor material, and growing or depositing an insulator in the trench. More generally, a trench filled and/or lined with at least one of an insulator and semiconductor material that is doped and biased (during operation) to provide field isolation (e.g., a trench, lined with semiconductor material more heavily doped than the bulk semiconductor material between adjacent structures to be isolated from each other to passivate leakage, and then filled with an oxide or other insulating material) are used to isolate inventive VCF sensor groups from each other in some embodiments of the invention. Use of such trenches (to isolate conventional CMOS structures) is termed "trench isolation" in CMOS technology. Trench isolation can be applied to isolate VCF sensor groups from each other in typical embodiments of the invention because trenches can be etched deep enough to separate VCF sensor groups which are several micrometers deep, such as those created in a typical array of silicon based VCF sensor groups.

Figure 12:
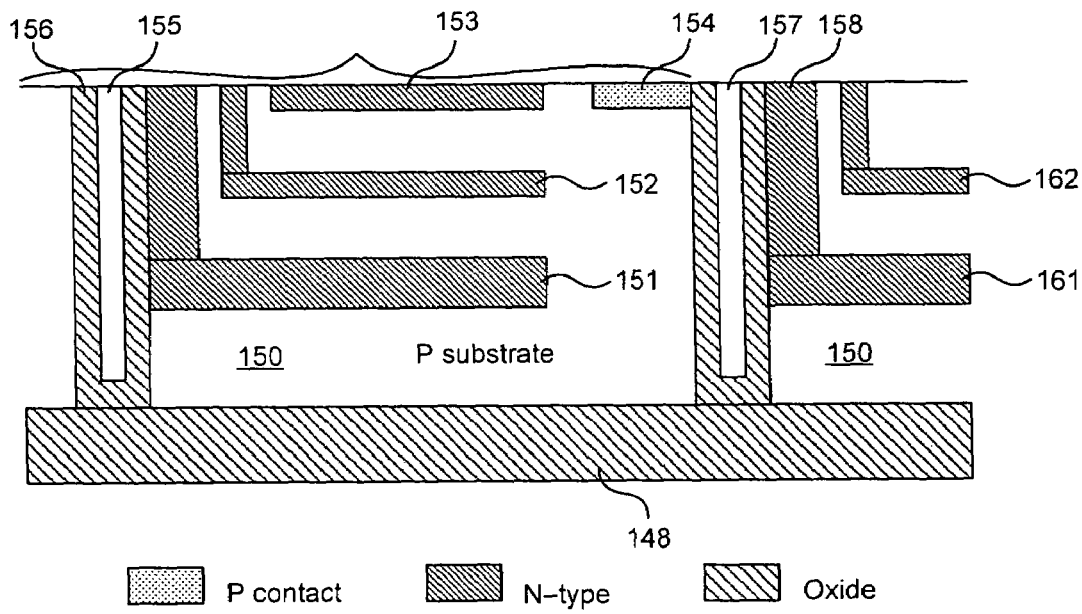
FIG. 12 is a cross-sectional view (in a vertical plane) of a portion of an array of VCF sensor groups, with trench isolation structures between adjacent sensor groups of the array.

An example of a combination of dielectric isolation (implemented by trench isolation) and junction isolation is shown in FIG. 12. In FIG. 12, a first VCF sensor group includes vertically-separated n-type semiconductor layers 151, 152, and 153 (e.g., silicon) formed in p-type semiconductor material 150 (which can be silicon). Contact 154 is provided for coupling p-type material 150 to biasing circuitry. Vertically oriented plug contacts connect each of layers 151 and 152 to the sensor group's top surface, so that each layer can be coupled to biasing and readout circuitry. The plug contacts can be formed as described in above-cited U.S. Patent Application Publication No. US 2002/0058353A1. A second VCF sensor group includes vertically-separated n-type semiconductor layers 161 and 162 that are also formed in p-type semiconductor material 150. Each sensor of the first sensor group is isolated from the second sensor group by an n-p substrate junction, just as the sensors in the first sensor group are isolated from each other by n-p substrate junctions. Lateral isolation between the first and second sensor groups is accomplished by trench isolation, namely by trench 157 lined with insulating material 158 (which can be silicon dioxide or silicon nitride, for example) formed between them. Trench 155 (lined with oxide 156) isolates the first sensor group from a third sensor group (not shown in FIG. 12) adjacent to the first sensor group. Insulator layer 148 (which can be silicon dioxide or silicon nitride, for example) below the bottom sensor of each VCF sensor group also functions to isolate the sensor groups from each other.

The trenches employed in accordance with the invention for trench isolation between VCF sensor groups can be shallow trenches with a low aspect ratio (e.g., trenches having quarter-micron depth of the type conventionally used in some CMOS integrated circuits). Typically, however, the trenches employed in accordance with the invention for trench isolation between VCF sensor groups will be deeper trenches with a high aspect ratio (e.g., trenches of the type conventionally used in some DRAM integrated circuits).

With reference to FIGS. 20–25, we next describe an improved technique for providing buried layer isolation that is employed in preferred embodiments of the inventive VCF sensor group. During operation of each such embodiment of the inventive VCF sensor group, there is a "non-collecting" volume of semiconductor material of a first type (either p-type or n-type) between each two "carrier-collecting" sensor regions (of the opposite semiconductor type). Carriers (electrons or holes) can be photogenerated in a non-collecting volume of a sensor group. Carriers that have been photogenerated in a carrier-collecting region, or that have migrated to a carrier-collecting region after being photogenerated elsewhere, can be collected by readout circuitry. In some cases, carriers that have been photogenerated in a non-collecting volume of a sensor group can migrate to a carrier-collecting sensor region of a neighboring sensor group. Typically, photogenerated carriers can migrate from a non-collecting volume to any of at least two carrier-collecting sensor regions (in one sensor group or in different sensor groups), although barriers (e.g., barrier 205 of FIG. 20 to be described below) can be formed in accordance with the invention to discourage such migration in undesired directions.

Figure 20:
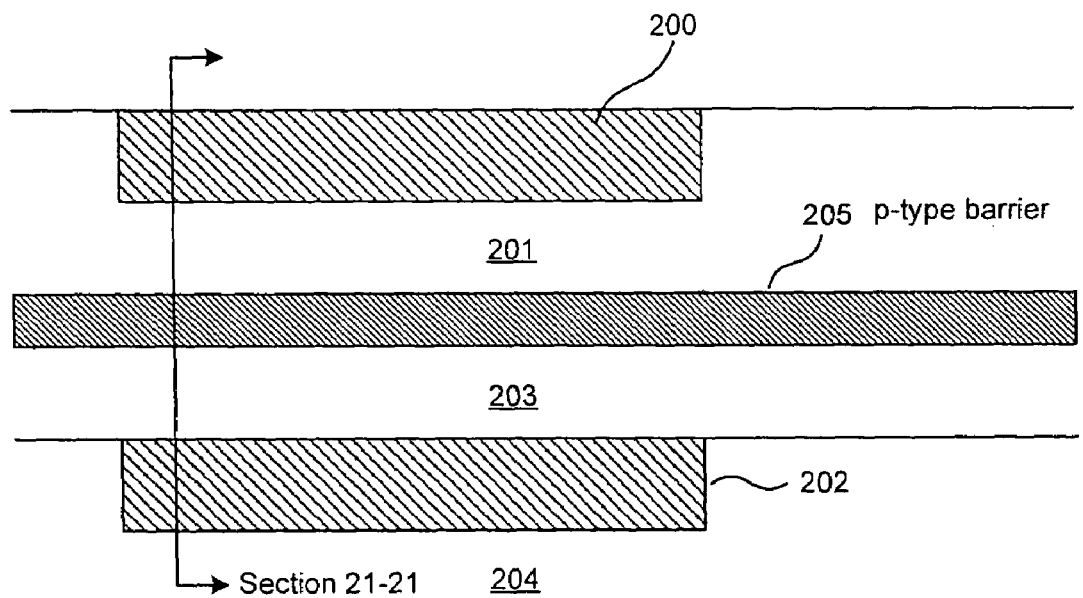
FIG. 20 is a simplified cross-sectional view (in a vertical plane) of an embodiment of the inventive VCF sensor group including a blanket barrier layer (205) between two sensors.

As shown in FIG. 20, a sensor group can include upper carrier-collecting sensor region (including photodiode cathode 200 comprising n-type semiconductor material), lower carrier-collecting sensor region (including photodiode cathode 202 comprising n-type semiconductor material), non-collecting photodiode anode layers 201 and 203 (comprising grounded p-type semiconductor material) between sensor regions 200 and 202, and non-collecting photodiode anode layer 204 (comprising grounded p-type semiconductor material) below sensor region 202.

In order to provide isolation between each pair of vertically-separated sensors of the sensor group, a blanket barrier layer of more heavily doped semiconductor material of the first type is laminated between upper and lower portions of each non-collecting volume (and thus between the sensors). Here, we use the term "laminated" in a broad sense that does not imply that any specific method (e.g., physical bonding of separate structures, or an implantation process) is used to form the blanket barrier layer. For example, as shown in FIG. 20, the sensor group includes blanket barrier layer 205 (comprising p-type semiconductor material) between layers 201 and 203 of p-material (and thus between the carrier-collecting sensor regions comprising cathodes 200 and 202). The upper carrier-collecting sensor region (comprising cathode 200) can be a "blue" sensor, the lower carrier-collecting sensor region (comprising cathode 202) can be a "green" sensor, and the group can also include a "red" sensor (not shown) below layer 204, and a second blanket barrier layer of p-type material between layer 204 and the red sensor.

Figure 21:
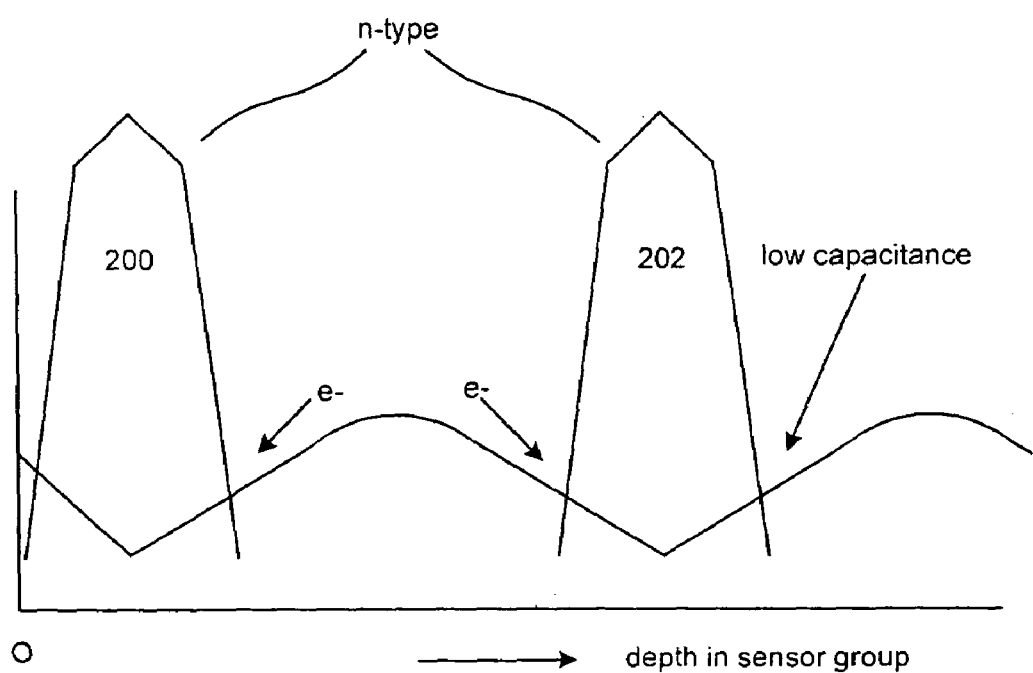
FIG. 21 is a graph of dopant concentration as a function of depth in the sensor group of FIG. 20.

FIG. 21 is a graph of dopant concentration as a function of depth in the sensor group of FIG. 20, which shows the locations of cathode layers 200 and 202 and barrier 205. During operation of the FIG. 20 sensor group, the presence of barrier 205 results in the electric potential having a gradient which directs photogenerated electrons to the nearest one of cathode layers 200 and 202 so that they do not drift in an undesired direction (e.g., from a point close to cathode layer 200 all the way to cathode 202 or to the cathode of an adjacent sensor group). By virtue of its location, barrier 205 also reduces the capacitance of the FIG. 20 sensors below the capacitance of the sensors of the sensor group of below-described FIG. 22.

Figure 22:
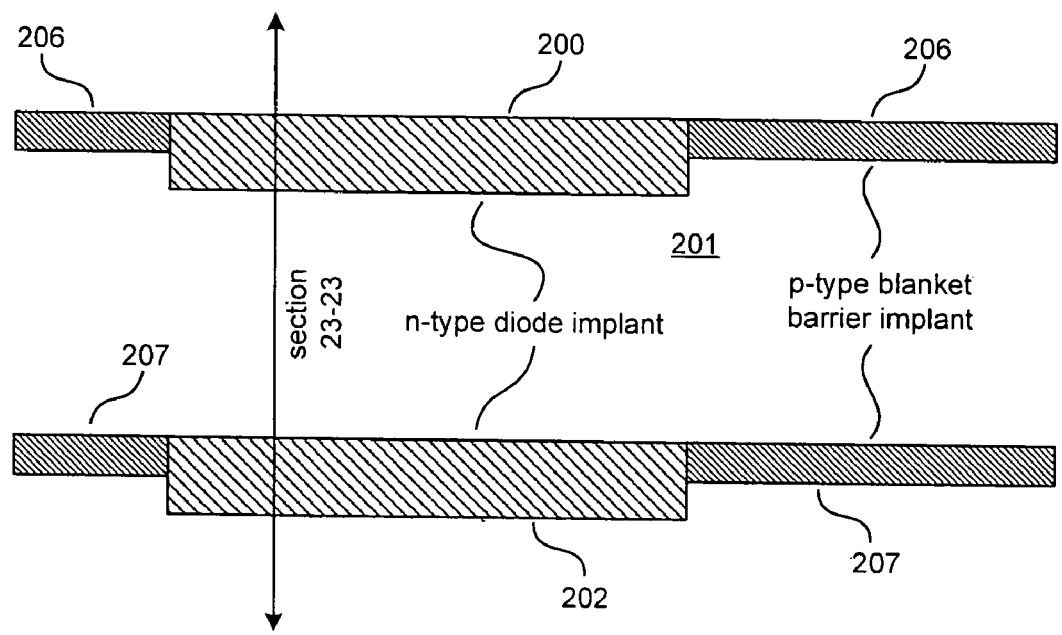
FIG. 22 is a simplified cross-sectional view (in a vertical plane) of a variation on the sensor group of FIG. 20, including conventional blanket barrier implants rather than the inventive blanket barrier layer 205.

Positioning of blanket barrier layers in accordance with the present invention between vertically stacked carrier-collecting sensor regions (as in FIG. 20) contrasts with positioning of blanket barriers at (or at and slightly below) the same vertical level as each carrier-collecting sensor region, as shown in FIG. 22 and described in above-referenced U.S. Patent Application Publication No. US 2000/0058353A1. U.S. Patent Application Publication No. US 2002/0058353A1. teaches that each blanket barrier (e.g., each of layers 206 and 207 of p-type semiconductor material shown in FIG. 22) is implanted across an entire wafer (in which an array of VCF sensor groups is to be formed), and carrier-collecting sensor regions (e.g., those including cathodes 200 and 202 of n-type semiconductor material shown in FIG. 22) are then formed by implantation on selected areas of each blanket barrier to produce sensors for different sensor groups of the array. Each blanket barrier produced by the prior technique (disclosed in Patent Application Publication No. US 2002/0058353A1) and present invention is intended to prevent carriers produced in a non-collecting volume from leaking vertically to carrier-collecting sensor regions (other than the nearest carrier-collecting sensor region) of the same sensor group and from leaking horizontally to a non-collecting volume of another sensor group and then vertically to a carrier-collecting sensor region of the other sensor group. Examples of "non-collecting volumes" are the portion of anode layer 201 (comprising p-semiconductor material) of FIG. 22 midway between cathodes 200 and 202, a portion of anode layer 201 of FIG. 20 that is very near to barrier 205 but relatively far from cathode 200, and a portion of anode layer 203 of FIG. 20 that is very near to barrier 205 but relatively far from cathode 202.

Figure 23:
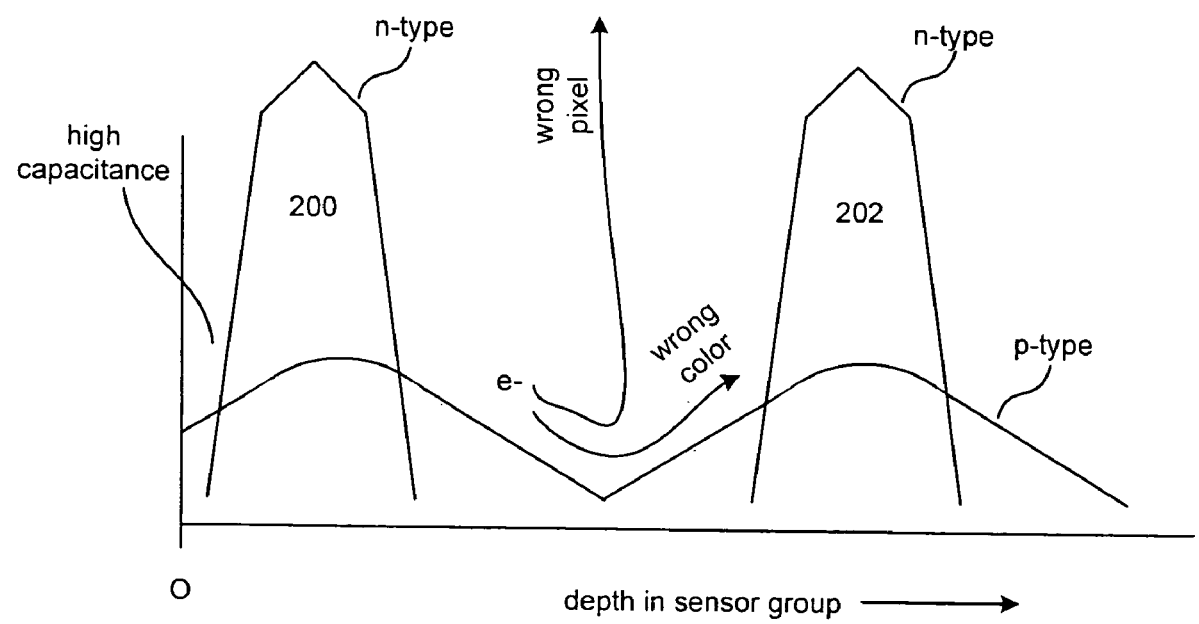
FIG. 23 is a graph of dopant concentration as a function of depth in the sensor group of FIG. 22.

FIG. 23 is a graph of dopant concentration as a function of depth in the sensor group of FIG. 22, which shows the locations of cathode layers 200 and 202 and barriers 206 and 207. During operation of the FIG. 22 sensor group, the presence of barriers 206 and 207 results in the electric potential having a gradient which allows electrons photogenerated in layer 201 to drift in undesired directions (e.g., from a point close to cathode layer 200 all the way to cathode 202 or to the cathode of an adjacent sensor group). By virtue of their locations, barriers 206 and 207 also increase the capacitance of the FIG. 22 sensors above the capacitance of the sensors of above-described FIG. 20.

The inventive technique for positioning and forming blanket barriers has several advantages, including that it reduces photodiode capacitance (thus increasing the output voltage of each photodiode and reducing the time required to reset each photodiode between exposures), and reduces (beyond the level attainable by the prior technique) the leakage of photogenerated carriers to the wrong carrier-collecting region of a sensor group or to an adjacent sensor group. During operation, the potential gradient produced in accordance with the invention between vertically-separated carrier-collecting regions (in one sensor group) provides a higher potential barrier that better prevents leakage of photogenerated carriers to the wrong carrier-collecting region of the group (or to an adjacent sensor group) than would the potential gradient produced using the prior-technique.

Figure 24:
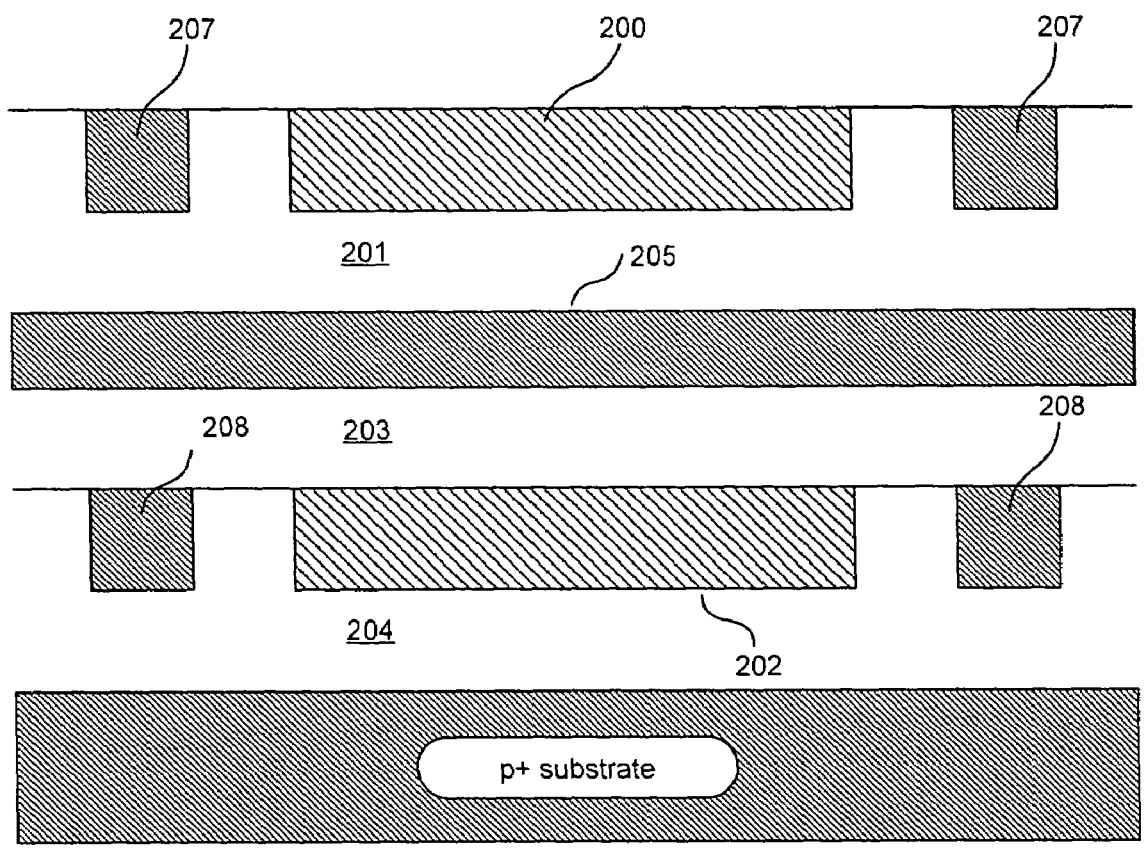
FIG. 24 is a simplified cross-sectional view (in a vertical plane) of another embodiment of the inventive VCF sensor group, including a blanket barrier layer (205) between two sensors and additional blanket barrier implants (207 and 208).

In addition to a blanket barrier layer of the type discussed with reference to FIG. 20, some embodiments of the invention include additional p-type barrier regions formed between carrier-collecting sensor regions at the same depth in adjacent sensor groups (i.e., "laterally" with respect to each such carrier-collecting sensor region). For example, as shown in FIG. 24, additional barrier regions 207 (comprising p-type semiconductor material) can be formed in p-semiconductor material between cathode 200 and cathodes (not shown) at the same depth in adjacent sensor groups, (e.g., cathodes to the left and to the right of cathode 200). FIG. 24 also shows additional barrier regions 208 (comprising p-type semiconductor material) formed in p-semiconductor material 204 between cathode 202 and cathodes (not shown) at the same depth in adjacent sensor groups (e.g., cathodes to the left and to the right of cathode 202). Laterally-positioned additional barrier regions 207 and 208 change the potential gradient between the carrier-collecting sensor regions of the adjacent sensor groups so as to reduce the risk that photogenerated carriers (electrons in the embodiment shown), generated at a location near to a first cathode (e.g., cathode 200) will drift to a cathode located farther away than the first cathode (e.g., to a cathode of another sensor group, not shown in FIG. 24, positioned to the right of cathode 200).

Figure 25A:
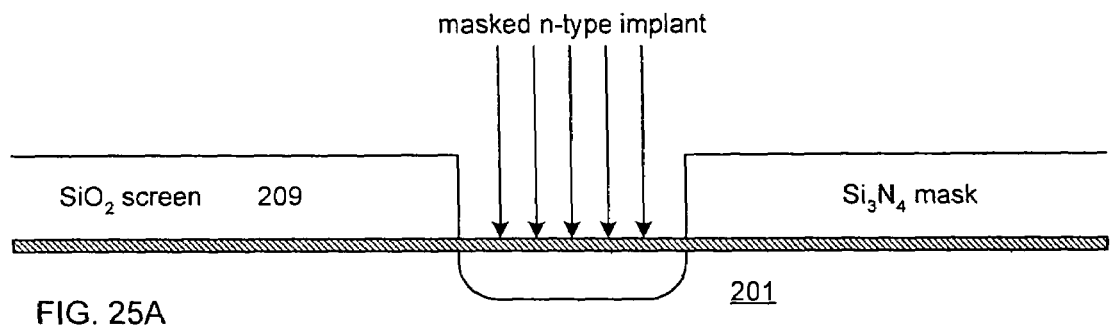
FIGS. 25A–25D are cross-sectional views (in a vertical plane) of structures formed at various steps of a self-aligned complementary implant process during manufacture of an embodiment of the inventive VCF sensor group.
Figure 25B:
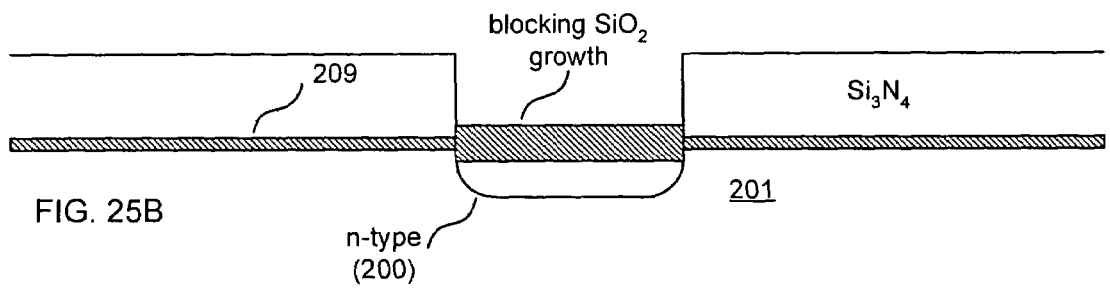
Figure 25C:
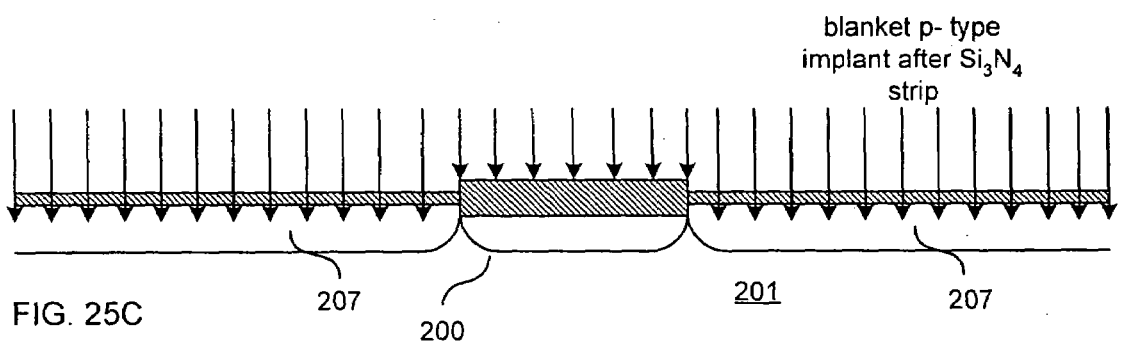
Figure 25D:
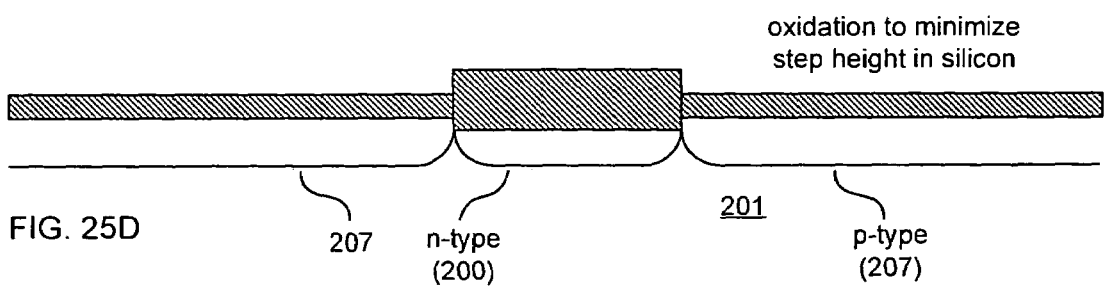

Additional barriers 207 (and 208) are preferably formed using a self-aligned complementary implant process such as that to be described with reference to FIGS. 25A–25D. Alternatively, they can be masked separately. As shown in FIG. 25A, $SiO_2$ screen 209 is produced on layer 201, a $Si_3N_4$ mask deposited on the $SiO_2$ screen, the mask is etched from the region at which cathode 200 is to be formed, and an ion implantation procedure then produces n-type cathode 200 below the exposed portion of screen 209. As shown in FIG. 25B, a blocking layer of $SiO_2$ is then grown on the exposed portion of screen 209. As shown in FIG. 25C, the $Si_3N_4$ mask is then stripped away and another ion implantation procedure is then performed to produce p-type barriers 207. Finally, as shown in FIG. 25D, additional $SiO_2$ is grown over the exposed $SiO_2$ surface of the entire structure to minimize the step height between portions of the exposed $SiO_2$ surface.

Various methods can be used to deposit a semiconductor material on top of other semiconductor materials or insulating materials during fabrication of a VCF sensor group. One method is the physical transfer of material from one wafer to another and the bonding of that material to the final wafer. This leaves islands of sensor material on the substrate. These can be insulated by the dielectric of the passivation, which is yet another version of dielectric isolation. Bonded wafers can be fabricated with leakage and yield characteristics as good as those of bulk wafers, especially where the fabrication process produces a thermal Si/SiO2 interface in the bonded wafer.

With reference to FIGS. 14A–14L, we next explain how several of the above-mentioned fabrication techniques are employed to fabricate one of the VCF sensor groups of FIG. 8 in a preferred manner. The preferred fabrication method allows color filters 43 and 48 to be inexpensively included in an array of VCF sensor groups. The fabrication techniques to be described with reference to FIGS. 14A–14L (and variations thereon) can be employed to manufacture other embodiments of the inventive VCF sensor group and arrays thereof, as well as to manufacture some types of semiconductor integrated circuits (e.g., circuits including transistors).

Figures 14A, 14B, 14C:
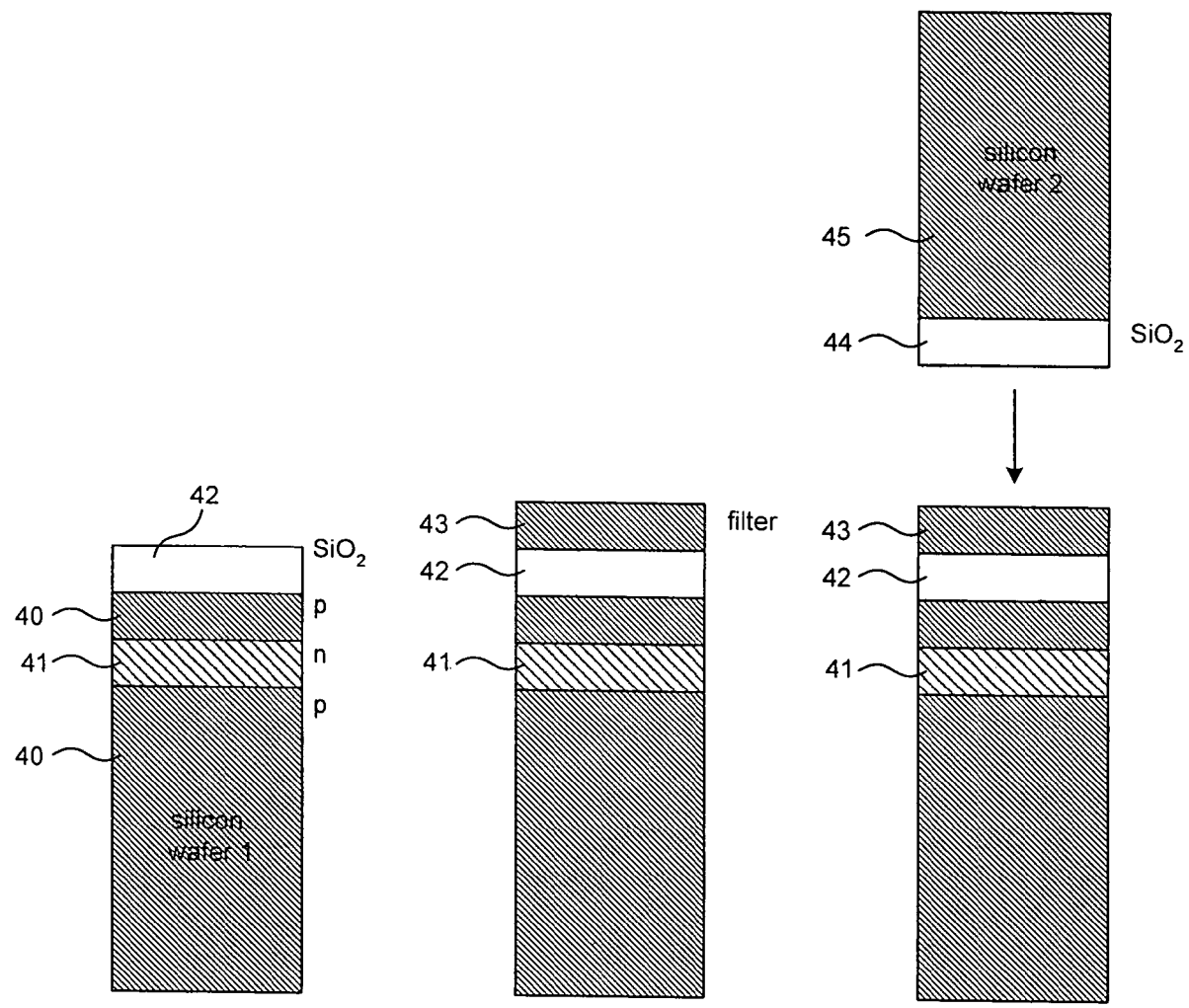
FIGS. 14A–14L are cross-sectional views (in a vertical plane) of structures formed at various steps of manufacture of another embodiment of the inventive VCF sensor group.

FIG. 14A shows the result of performing the first steps in the process sequence, which are to implant n-type layer 41 in p-type substrate 40, and then grow SiO2 layer 42 on substrate 40 by a thermal oxide growth operation. Alternatively, layer 42 (and layers 44, 47, and 49) can be made of another dielectric material, for example, silicon nitride (SiN).

FIG. 14B shows the result of performing the next step in the process sequence, which is to deposit "red pass/cyan reflect" filter 43 on layer 42. Filter 43 can be an interference filter made of alternating layers SiN and SiO2. Alternatively, filter 43 can be an interference filter comprising layers of materials having different refractive indices (other than layers of SiN and SiO2), preferably materials for which there is a deposition recipe that can be performed using conventional CVD equipment. Filter 43 alternatively is a "red pass/cyan absorb" filter that absorbs but does not significantly reflect green and blue radiation.

Figure 14D:
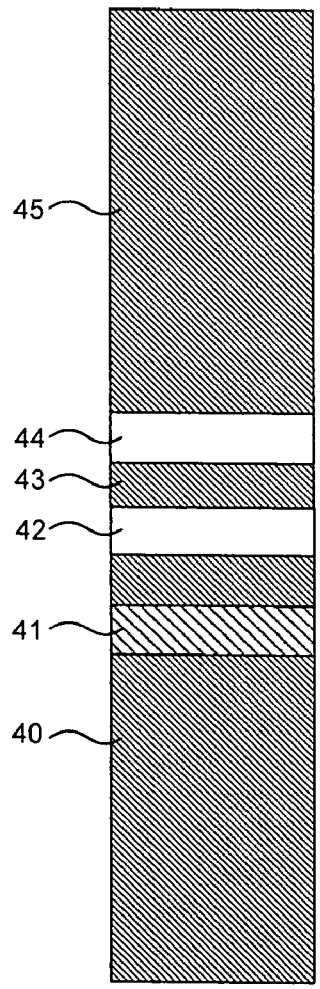

FIG. 14C shows the next step in the process sequence, which is to bring a second wafer into contact with the wafer of FIG. 14B. Specifically, the second wafer comprises substrate 45 (of p-type silicon) and SiO2 layer 44 (grown on substrate 45). Then, as shown in FIG. 14D, layer 44 of the second wafer is bonded to filter 43 of the first wafer (preferably by a thermal bonding step) to cause filter 43 to become sandwiched between SiO2 layers 42 and 44. More generally, bonding of two wafers (each having some layers of the inventive VCF sensor group formed thereon) can be used during manufacture of the invention. Any of a variety of known bonding techniques can be used to manufacture typical embodiments of the invention, such as those described in Pasquariello, et al., "Plasma-Assisted InP-to-Si Low Temperature Wafer Bonding, IEEE Journal on Selected Topics in Quantum Electronics, Vol. 8, No. 1, January/February 2002.

Figure 14E:
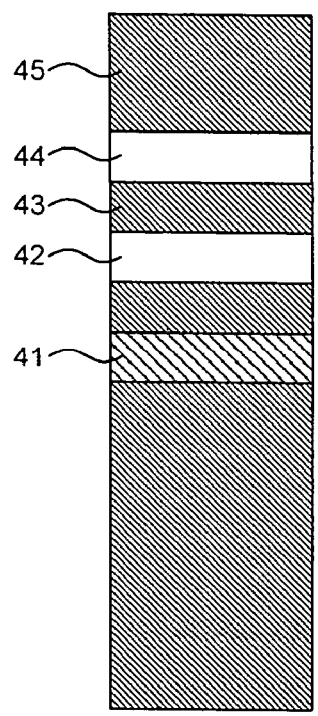

FIG. 14E shows the result of performing the next step in the process sequence, which is to reduce the thickness of p-type substrate 45 to a desired thickness, if such thickness-reduction is needed. This is done by polishing the exposed surface of substrate 45 back to a thickness of about 0.5 μm, or by cleaving, or by some other means.

Figure 14F:
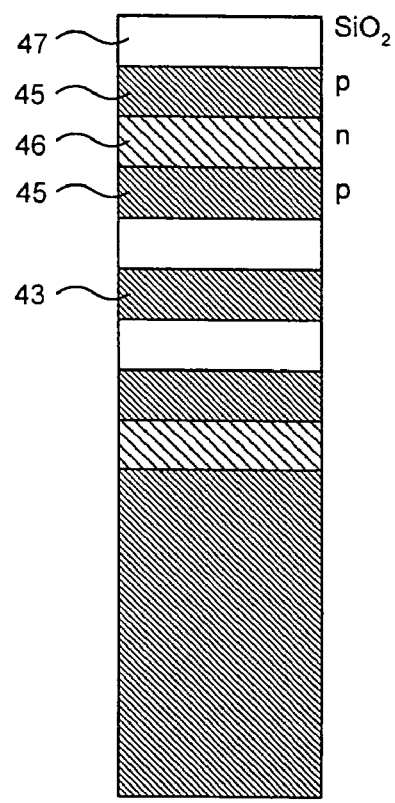
Figures 14G, 14H, 14I:
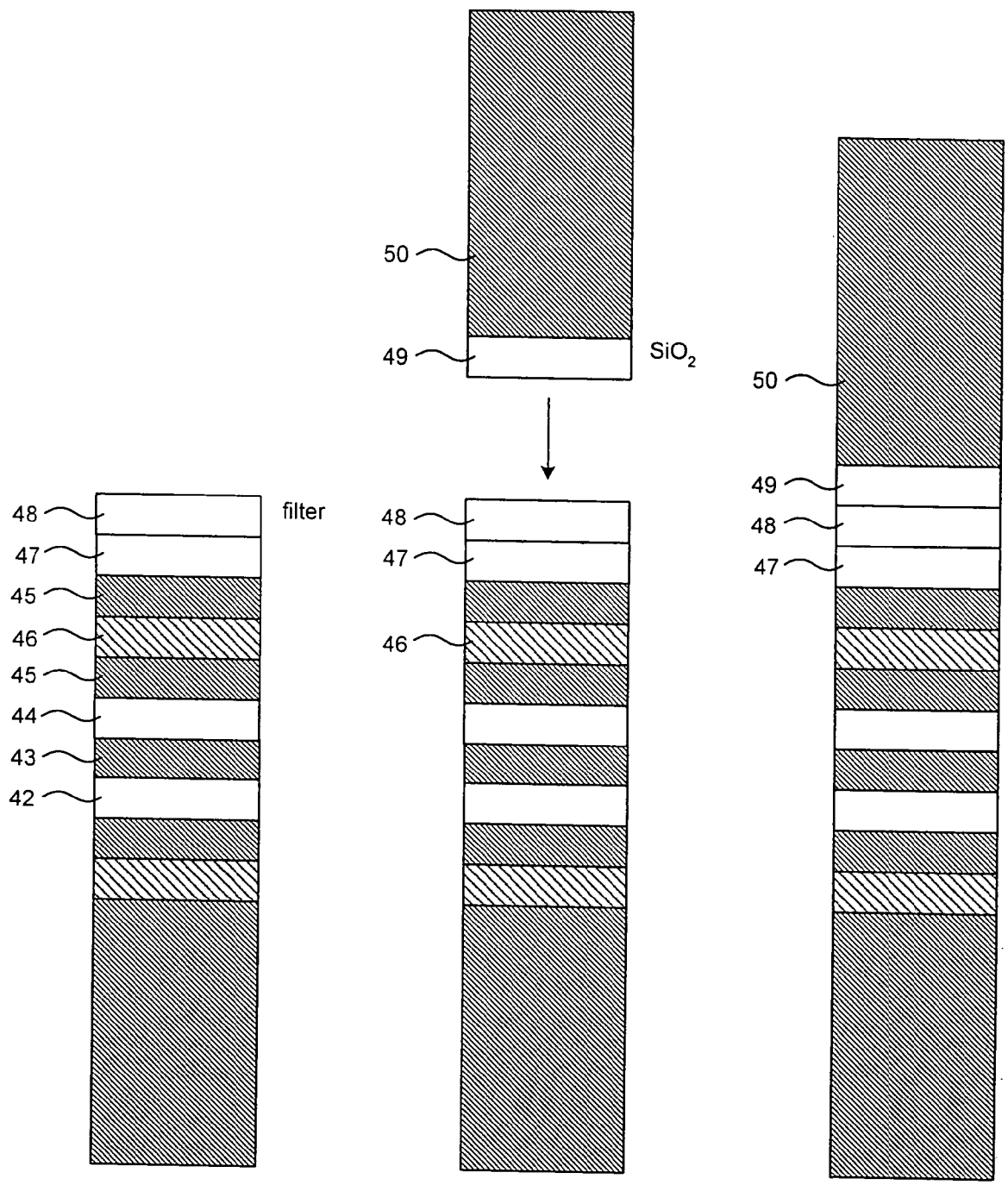

FIGS. 14F and 14G show the results of performing the next steps in the process sequence, which are to implant n-type layer 46 in substrate 45, then grow SiO2 layer 47 on the exposed (top) surface of substrate 45 by a thermal oxide growth operation (as shown in FIG. 14F), and then to deposit filter layer 48 (which can, but need not, consist of SiN material) on SiO2 layer 47 as shown in FIG. 14G. FIG. 14H shows the next step in the process sequence, which is to bring a third wafer into contact with the bonded and processed wafers of FIG. 14G. Then, as shown in FIG. 14I, layer 49 of the third wafer is bonded to the exposed (top) surface of layer 48 (preferably by a thermal bonding step) to cause layer 48 to become sandwiched between SiO2 layers 47 and 49.

Layers 47, 48, and 49 (as shown in FIG. 14I) together comprise an interference filter that functions as a "yellow pass/blue reflect" filter. Alternatively, an interference filter comprising more than three alternating layers SiN and SiO2 can be formed by producing a stack of additional layers of SiN and SiO2 on the structure of FIG. 14G before bonding a third wafer (of the type shown in FIG. 14H) to the top of the stack. In other alternative embodiments, an interference filter comprising a stack of layers of materials having different refractive indices (a stack that does not consist of layers of SiN and SiO2) can be formed on the FIG. 14E structure, before a third wafer (of the type shown in FIG. 14H but possibly having a layer of some material other than SiO2 in place of SiO2 layer 49 of FIG. 14H) is bonded to the top of the stack. Filter 47,48, and 49 is alternatively a "yellow pass/blue absorb" filter that absorbs but does not significantly reflect blue radiation. The third wafer, shown in FIG. 14H, comprises substrate 50 (of p-type silicon) and SiO2 layer 49 (grown on substrate 50). Any of a variety of known bonding techniques can be used to accomplish the bonding step described with reference to FIG. 14I, including at least some of those described in the above-cited paper by Pasquariello, et al.

Figure 14J:
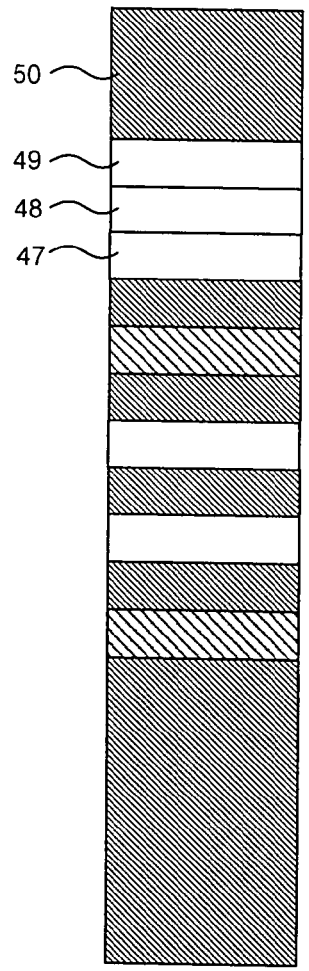

FIG. 14J shows the result of performing the next step in the process sequence, which is to reduce the thickness of p-type substrate 50 to a desired thickness, if such thickness reduction is needed. This is done by polishing the exposed surface of substrate 50 back to a thickness of about 0.3 µm, or by cleaving, or by some other means.

Figure 14K:
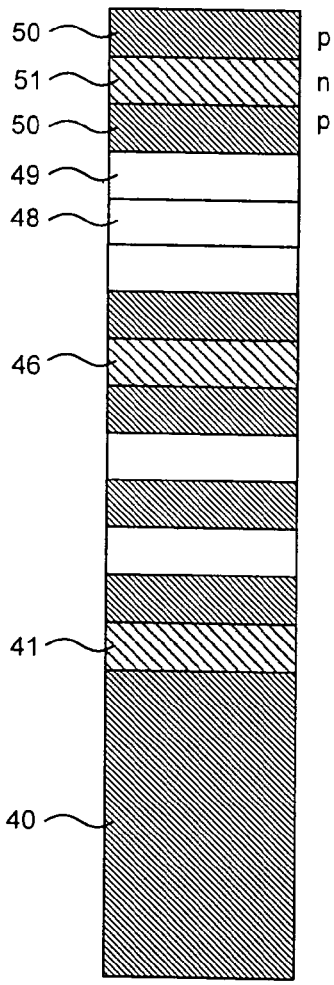
Figure 14L:
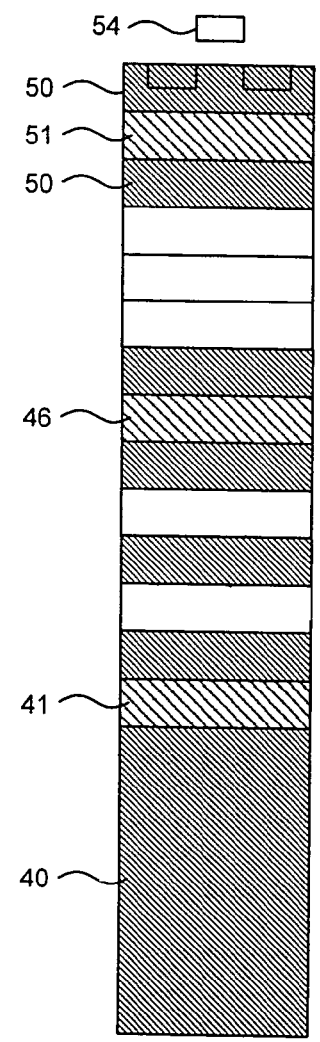

FIG. 14K shows the result of performing the next step in the process sequence, which is to implant n-type layer 51 in substrate 50. Then, as shown in FIG. 14L, final CMOS processing steps are performed. These final steps can include passivation, formation of contacts (or completion of the process of forming contacts, and mounting of light shield 54 in the appropriate position.

To use the final structure shown in FIG. 14L, a contact extending from each of layers 41, 46, and 51 to the exposed (top) surface of the structure would need to be fabricated. The contacts would preferably be formed in any of the ways described herein or alternatively, as described in U.S. Patent Application Publication No. US 2002/0058353A1. With reference to FIGS. 15–15H, we next describe one preferred technique for fabricating each such contact.

The technique to be described with reference to FIGS. 15A–15H forms a low leakage trench contact, preferably using a trench etcher of the type normally used for a high performance analog bipolar (or DRAM) process.

Figure 15A:
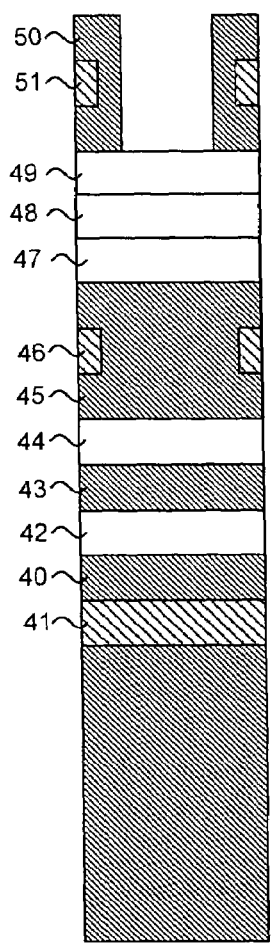

FIG. 15A shows the result of performing the first step in the process sequence, which is to etch a trench through silicon layers 50 and 51 of the FIG. 14L structure to dielectric layer 49.

Figure 15B:
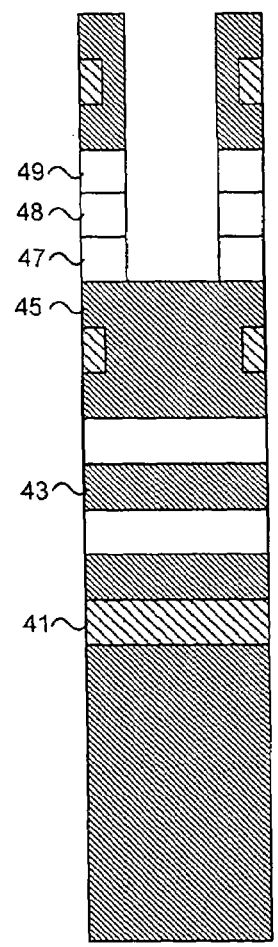
Figure 15C:
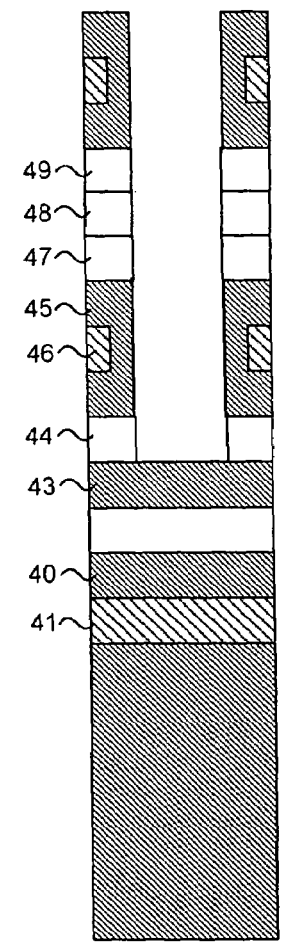
Figure 15D:
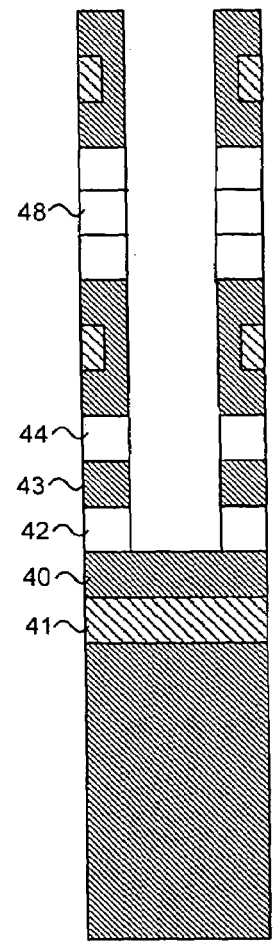

Next, as shown in FIG. 15B, an appropriate etch process (e.g., an oxide etch process when layers 47, 48, and 49 consist of SiN or SiO2) extends the trench to silicon layer 45. Next, as shown in FIG. 15C, a silicon etch process extends the trench to dielectric layer 44. Next, as shown in FIG. 15D, an appropriate etch process (e.g., an oxide etch process when layers 44, 43, and 42 consist of SiN or SiO2) extends the trench to silicon layer 40.

Next, as shown in FIG. 15E, a timed silicon etch process extends the trench into n-type silicon cathode layer 41 (the cathode of the red sensor).

Next, as shown in FIG. 15F, the trench is lined with an insulator, preferably by growing $SiO_2$ passivation layer 301 in all exposed surfaces of the trench. Next, as shown in FIG. 15G, an anisotropic etch is performed into cathode layer 41 to remove the insulator from the trench bottom only and expose the n-type silicon material of cathode layer 41.

Finally, as shown in FIG. 15H, the trench is filled with n-type polysilicon material 302 to complete the trench contact to layer 41. The top of the trench contact can be coupled directly to a biasing and readout circuit (e.g., to the gate of a source-follower amplifier transistor 56r of FIG. 2A).

In a block of solid material in which the inventive VCF sensor group is formed, trenches can be produced and filled with semiconductor material to form contacts to buried sensor cathodes and anodes. For example, semiconductor material around a trench can be doped and a passivation layer then grown on the doped lining of the trench, the bottom of the trench can then be opened (e.g., by an anisotropic etch), and the opened trench can then be filled with an n-type semiconductor (e.g., n+ polysilicon) so that it functions as an n-type contact to a buried n-type cathode. Alternatively, such a trench can be lined and/or filled with insulating material to isolate VCF sensor groups from each other. Trench contacts (or isolating structures) can be made much narrower than can plug contacts formed by diffusion as described in U.S. Patent Application Publication No. US 2002/0058353A1. A trench having cross-sectional area of 0.5 µm and a depth of a few microns can easily be produced using existing techniques to form a trench contact to a deep sensor in a typical VCF sensor group. Such a cross-sectional area is much less than the minimum cross-sectional area of a diffused plug contact (having the same depth) that can be inexpensively produced using existing techniques. Use of trench contacts (or trench isolating structures) can improve the fill factor of an array of horizontally separated VCF sensor groups, in the sense that they can increase the area of the imaging plane in which incident radiation can be detected by sensors of VCF sensor groups (and decrease the area of the imaging plane that is blocked by radiation shields or occupied by structures that do not convert incident radiation into detectable electrons or holes).

Figure 17:
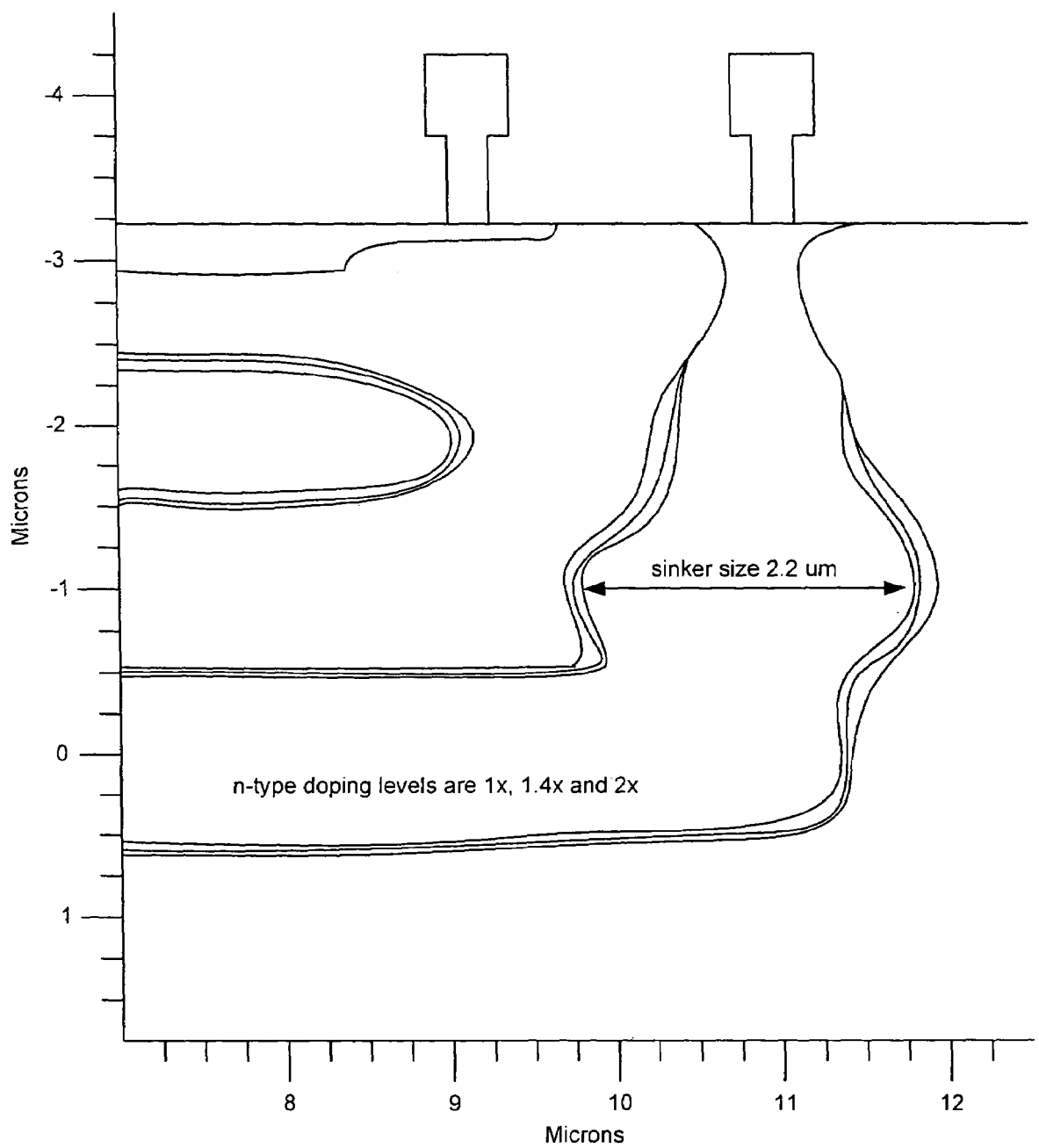
FIG. 17 is a cross-sectional view (in a vertical plane) of a structure formed during manufacture of an embodiment of a VCF sensor group, including a plug contact formed by an implantation process. Each contour (representing the boundary between p-type and n-type material) indicates the result of forming the plug contact with a different-type doping level, with the smallest n-type region having a first ("1×") n-type doping level, the largest n-type region having twice ("2×") this doping level, and the intermediate size n-type region having an intermediate ("1.4×") n-type doping level.

In preferred embodiments, at least one plug contact is formed in a VCF sensor group by a multi-stage implantation process that produces the diffused plug contact with a cross-sectional area much less than the minimum cross-sectional area of a diffused plug contact (having the same depth) than can be inexpensively produced using existing techniques. As shown in FIG. 17, an n-type plug contact to an n-type cathode of a "red" sensor (at a depth of about 2 µm below the n-type cathode of a "green" sensor, and about 2.6 µm below the top surface of the finished sensor group) can be formed by the prior technique of implanting phosphorus (with energy 1200 KeV) into an exposed surface of p-type silicon (at a depth of about 1.3 µm from the top surface of the finished sensor group) to form a bottom portion of the contact, then forming additional structure (including a p-type silicon epitaxial layer) above the exposed surface, and then implanting phosphorus (with energy 500 KeV) into the new exposed surface of p-type silicon (at a depth of about 0.6 µm from the top surface of the finished sensor group) to form a top portion of the contact. However, as is also shown in FIG. 17, this results in a contact having undesirably large diameter (a diameter of as much as 2.2 µm or more, depending on the n-type doping level employed and the number of thermal cycles of the process). Furthermore, the need to place a thick (e.g., 3 µm) photoresist layer on the sensor group during fabrication of the contact (to prevent the high energy, e.g., 1200 KeV, phosphorus implants from reaching undesired areas of the sensor group) imposes a minimum on the size of the sensor group features that can be formed.

Figure 18:
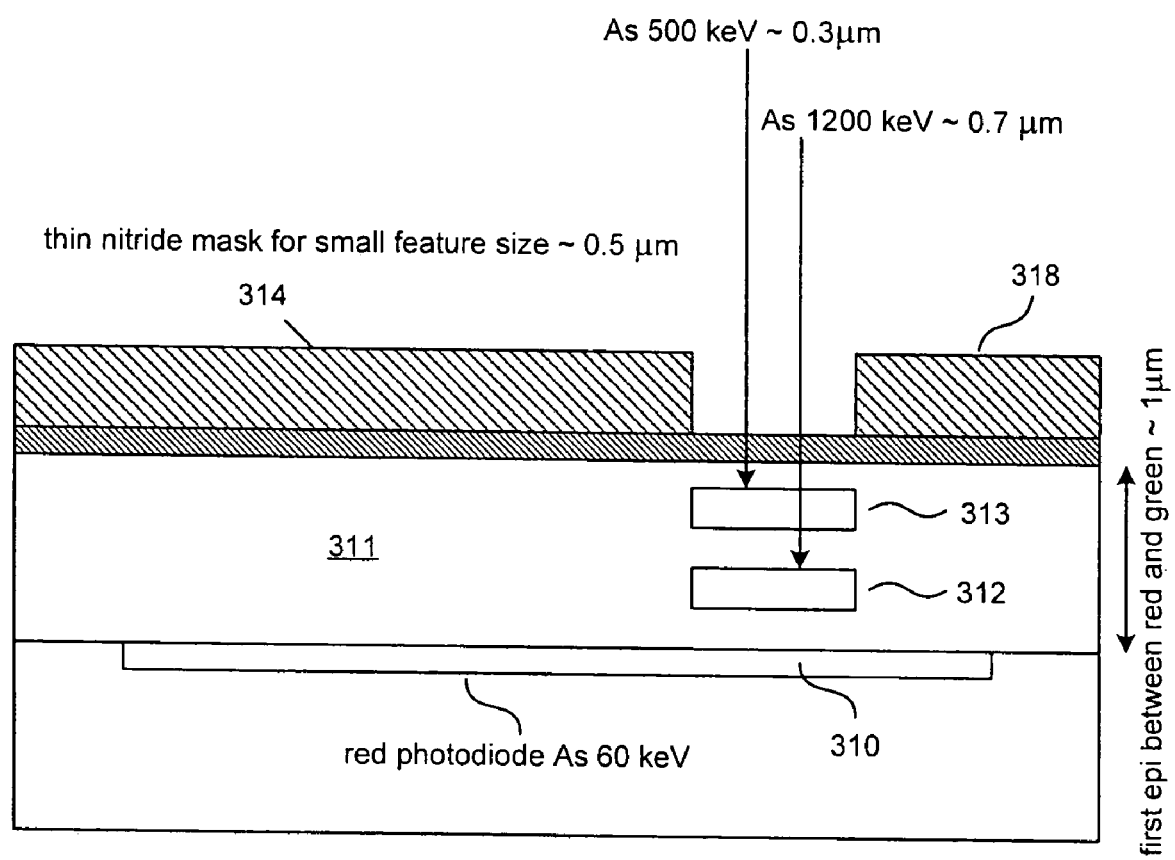
FIG. 18 is a cross-sectional view (in a vertical plane) of a structure formed during manufacture of a preferred embodiment of the inventive VCF sensor group, including a bottom portion of a plug contact (formed during an early stage of a multi-stage implantation process).
Figure 18A:
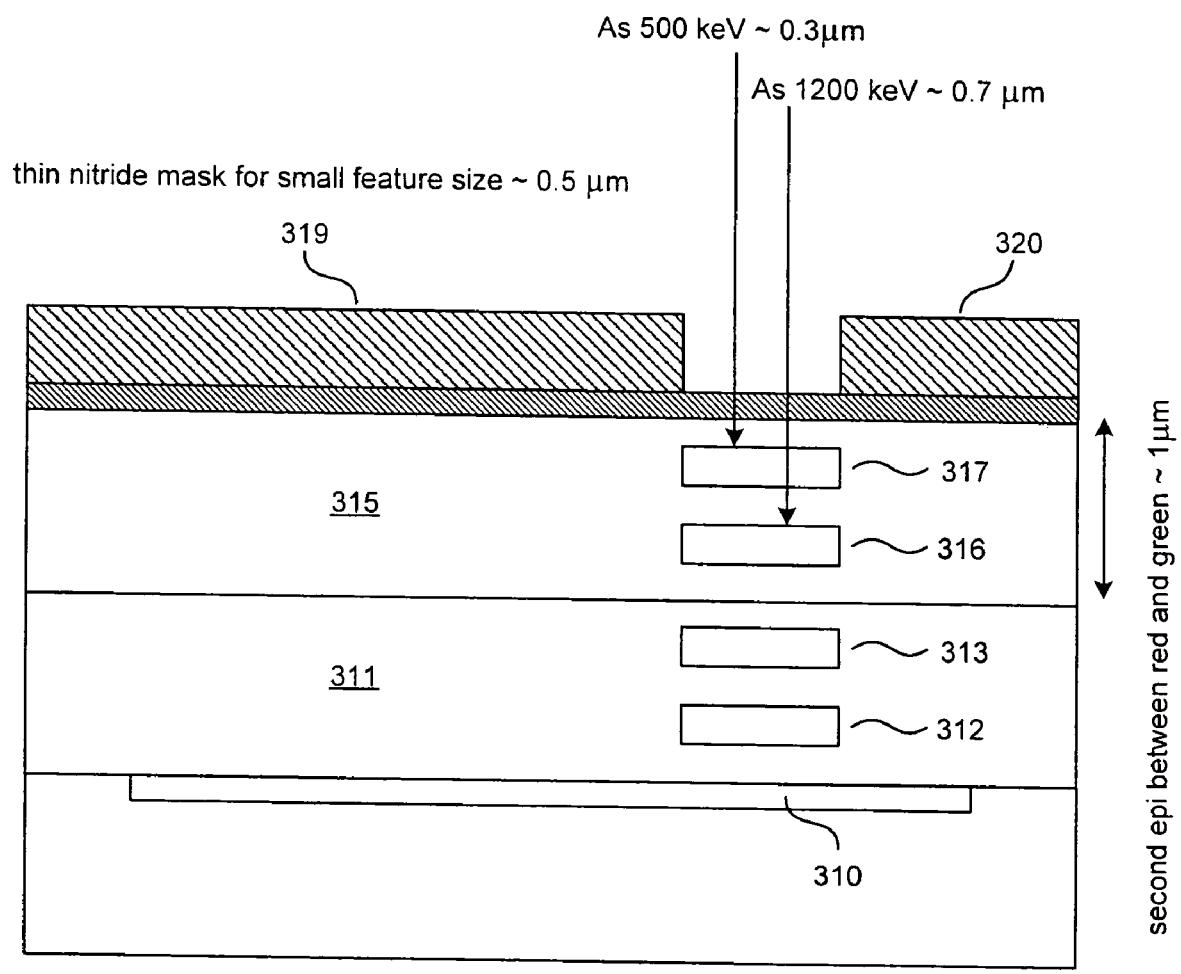
FIG. 18A is a cross-sectional view (in a vertical plane) of a structure, formed from the FIG. 18 structure during manufacture of a preferred embodiment of the inventive VCF sensor group, including a top portion of the plug contact (formed during a subsequent stage of the multi-stage implantation process) whose bottom portion is shown in both FIGS. 18 and 18A.

In contrast with the technique employed to produce the FIG. 17 contact, we next describe (with reference to FIGS. 18 and 18A) an embodiment of a multi-stage implantation process performed in accordance with the present invention. The inventive multi-stage implantation process of FIGS. 18 and 18A is performed after the target (e.g., red sensor cathode 310 of FIG. 18, consisting of n-type silicon) has been formed (e.g., by implanting Arsenic with energy 60 KeV into a p-type substrate), and can produce a contact having diameter of about 0.5 µm that extends to a target at a depth of about 2 µm in a sensor group. The process includes four steps.

The first step is to form a first epitaxial layer (epi layer) is on the target to which the contact is to extend (e.g., layer 311 of p-type Silicon is formed on photodiode cathode 310 as shown in FIG. 18).

A bottom portion of the plug (e.g., plug portions 312 and 313 of FIG. 18) is then formed by ion implantation in the first epi layer (311). To do so, a thin nitride mask 314 can be formed on layer 311, a small mask opening 318 (having diameter of about 0.5 µm) then produced in mask 314, and Arsenic then implanted through opening 318, in the typical case that layer 311 has thickness of about 1 µm so that the bottom portion of the plug need extend only a short distance (1 µm) through layer 311. With such a mask and such first epi layer thickness, a first part 312 of the plug's bottom portion (extending from layer 310 to about 0.7 µm above layer 310) can be formed by implanting Arsenic with energy 1200 Kev into layer 311, and a second part 313 of the plug's bottom portion (extending about 0.3 µm from part 312 to the top surface of layer 311) can then be formed on part 312 by implanting Arsenic with energy 500 KeV into layer 311.

Figure 19:
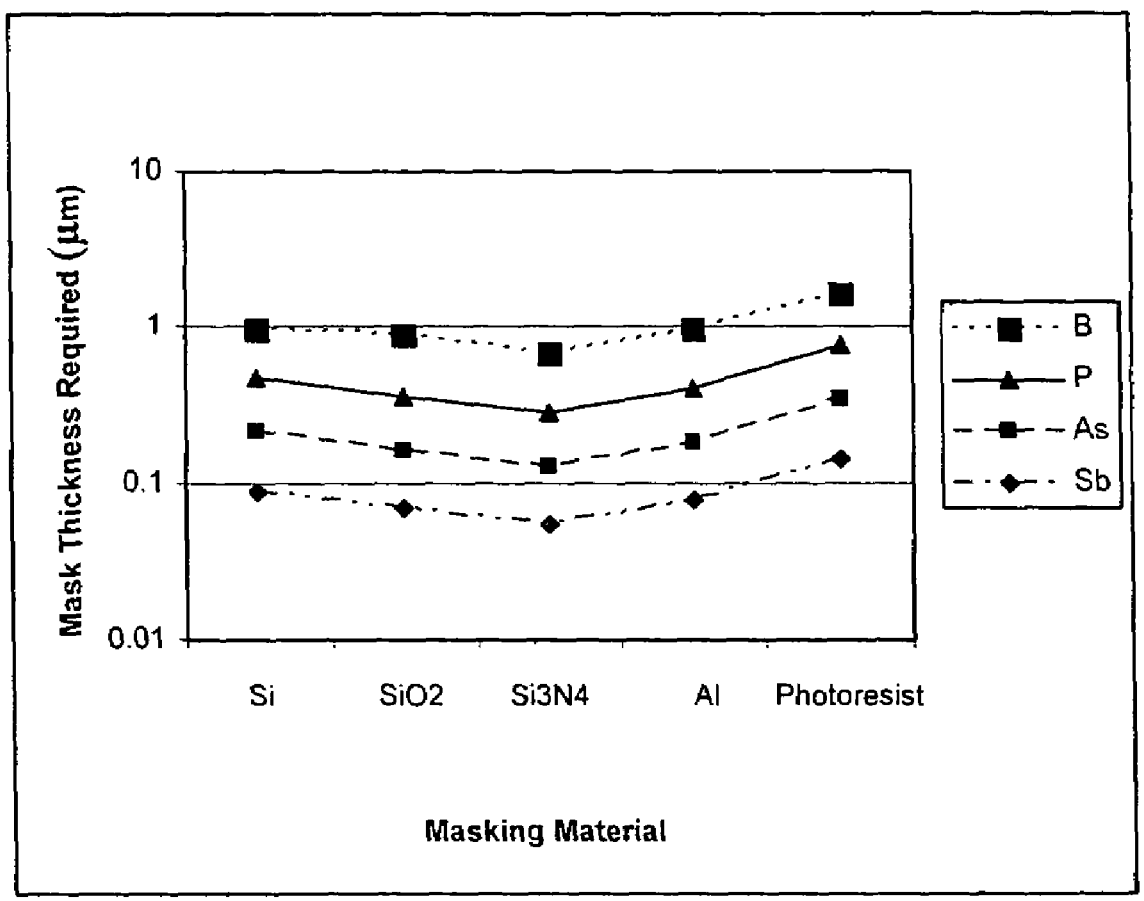
FIG. 19 is a graph of the mask thickness required during typical implantation of Boron, Phosphorus, Arsenic, and Antimony, for each of five indicated masking materials.

An advantage of implanting a substance having diffusivity lower than that of Phosphorus (e.g., Arsenic) in accordance with the invention is that this allows use of a much thinner mask, as is apparent from inspection of FIG. 19. FIG. 19 is a graph of the mask thickness required during typical implantation of Boron, Phosphorus, Arsenic, and Antimony, for each of five indicated masking materials. For example, FIG. 19 indicates that a mask of $Si_3N_4$ having thickness of about 0.07 µm can be used during Arsenic implantation (at 100 KeV) whereas a mask of $Si_3N_4$ having thickness greater than 0.15 µm would be needed during Phosphorus implantation at the same energy.

The third step is to remove mask 314 from first epi layer 311, and then form a second epitaxial layer (epi layer 315 of FIG. 18A, consisting of p-type Silicon) on first epi layer 311.

A top portion of the plug (e.g., plug portions 316 and 317 of FIG. 18A) is then formed by ion implantation in the second epi layer (315). To do so, a thin nitride mask 319 can be formed on layer 315, a small mask opening 320 (having diameter of about 0.5 µm) then produced in mask 319, and Arsenic then implanted through opening 320, in the typical case that layer 315 has thickness of about 1 µm so that the top portion of the plug need extend only a short distance (1 µm) through layer 315. With such a mask and such second epi layer thickness, a first part 316 of the plug's bottom portion (extending from layer 311 to about 0.7 µm above layer 311) can be formed by implanting Arsenic with energy 1200 Kev into layer 315, and a second part 317 of the plug's bottom portion (extending about 0.3 µm from part 316 to the top surface of layer 315) can then be formed on part 316 by implanting Arsenic with energy 500 KeV into layer 315.

More generally, a class of embodiments of the invention use a substance having diffusivity lower than that of phosphorus (preferably, Arsenic ("As") rather than the conventionally-used Phosphorus ("P")) to perform the implantation steps required for diffused plug formation. Such a substance (having low diffusivity) diffuses less horizontally than does Phosphorus, thus allowing narrower plugs to be formed so that sensor groups can be manufactured with an improved fill factor. Although Arsenic has much lower diffusivity (both vertical and horizontal diffusivity) than Phosphorus, the inventive multi-stage implantation process (of which a typical example has been described with reference to FIGS. 18, 18A, and 19) makes it practical to implant Arsenic (rather then Phosphorus) to form a diffused plug. This is because the Arsenic only needs to diffuse a relatively short distance vertically through each epi layer in the multi-stage implantation process; not through a long distance (e.g., all the way from the top of the sensor group to the buried target to which the contact is to extend) as in conventional methods for diffused plug formation.

Variations on the multi-stage implantation process described above (with reference to FIGS. 18, 18A, and 19) employ a low diffusivity substance other than Arsenic and/or more than three epi layers above the target. A different portion of the contact is formed in each epi layer.

When manufacturing a VCF sensor group (or array of VCF sensor groups) on a wafer, at least one transistor (for use in coupling at least one sensor of each VCF sensor group) can be formed on the "bottom" surface of the wafer (the surface opposite the "top" surface of the group at which radiation to be sensed is incident). Formation of such transistors on the bottom surface of the wafer (rather than the top surface of the group) improves the fill factor for an array of horizontally separated VCF sensor groups. Transistors can be formed on the bottom surface of a wafer in many different embodiments of the inventive VCF sensor group and arrays of VCF sensor groups.

An example of a method for forming a VCF sensor group on a wafer with a transistor on the bottom surface of a wafer will be described with reference to FIGS. 16A–16H. FIGS. 16A–16H assume that the structure comprising elements 40, 41, 42, 43, 44, 45, 46, 47, 48, 49, 50, and 51 (shown in FIG. 16A) has been formed in advance. This structure is identical to that shown in FIG. 14K, and will be referred to as the "main" structure. The description of the main structure and the method for manufacturing it will not be repeated.

Figure 16A:
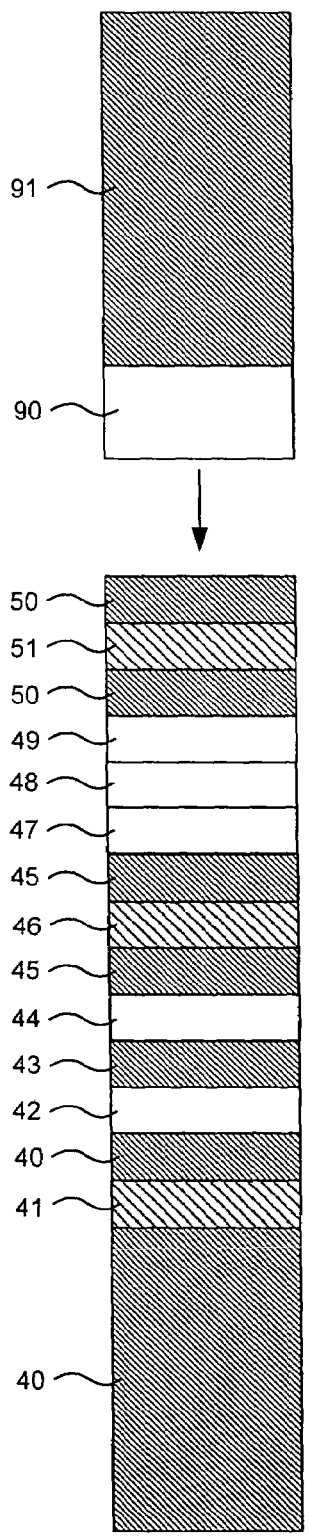
FIGS. 16A–16H are cross-sectional views (in a vertical plane) of structures formed at various steps of manufacture of another embodiment of the inventive VCF sensor group.

As shown in FIG. 16A, a "handle" wafer comprising p-type semiconductor substrate material 91 and insulating layer 90 on substrate 91 is then aligned with the main structure, with top layer 50 of the main structure facing insulating layer 90 of the handle wafer.

Figure 16B:
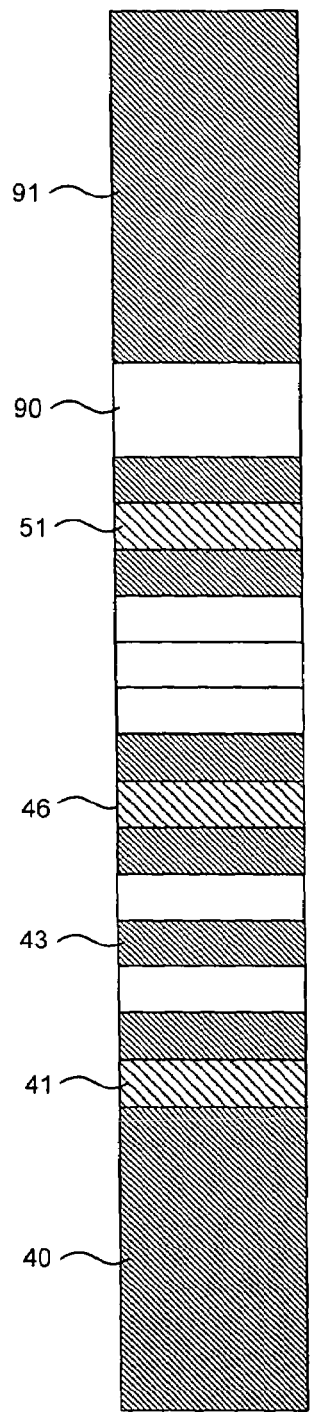

Then, as shown in FIG. 16B, layer 90 of the handle wafer is bonded to the exposed (top) surface of layer 50 (preferably by a thermal bonding step) to cause layer 90 to become sandwiched between p-type semiconductor layer 50 and p-type semiconductor substrate 91.

Figure 16C:
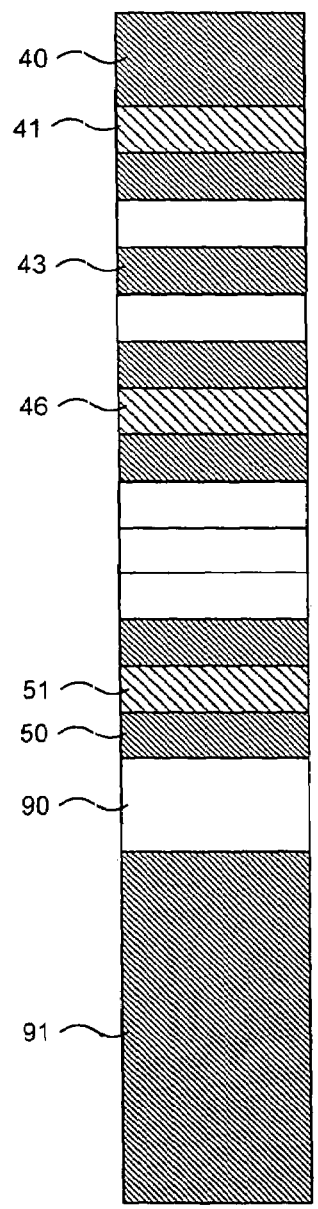

The exposed bottom surface of substrate 40 is then polished back to reduce its thickness (as shown in FIG. 16C) and thus make the sensors (comprising red sensor cathode layer 41, green sensor cathode layer 46, and blue sensor cathode layer 51) accessible from the bottom. The resulting structure can then be inverted, as shown in FIG. 16C so that the exposed "bottom" surface of polished element 40 is at the top of FIG. 16C.

Figure 16D:
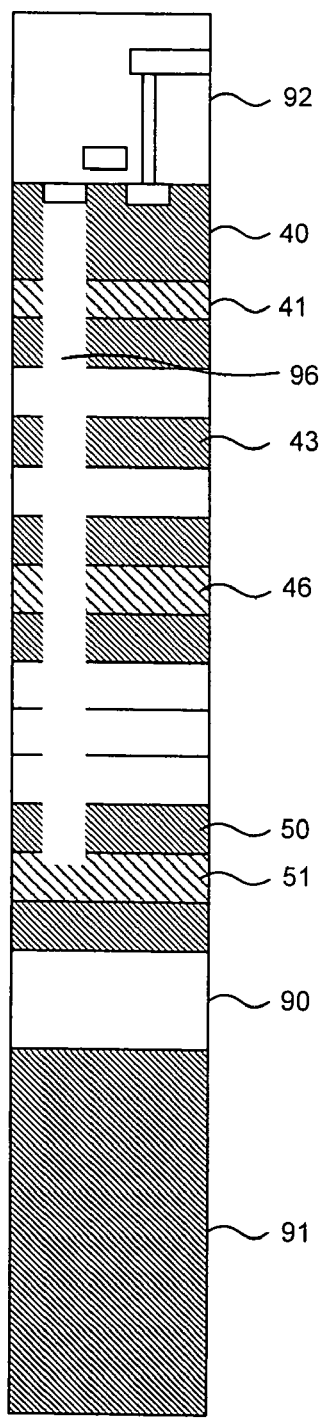

As shown in FIG. 16D, a trench contact (96) is then formed to extend from the exposed "bottom" surface of element 40 (at the top of FIG. 16D) to blue sensor cathode layer 51. This can be done in the manner described with reference to FIGS. 15A–15H. Support circuitry 92 is then formed on the exposed bottom surface of element 40, preferably by a semiconductor integrated circuit fabrication process. Support circuitry 92 includes at least one transistor coupled to the bottom of trench contact 96 (at the top of FIG. 16D). Another trench contact (not shown) is formed from the exposed bottom surface of element 40 to green sensor cathode layer 46, and a third trench contact (not shown) is formed from the exposed bottom surface of element 40 to red sensor cathode layer 41. At least one transistor of support circuitry 92 is coupled, via a trench contact, to each of layers 41, 46, and 51.

Figure 16E:
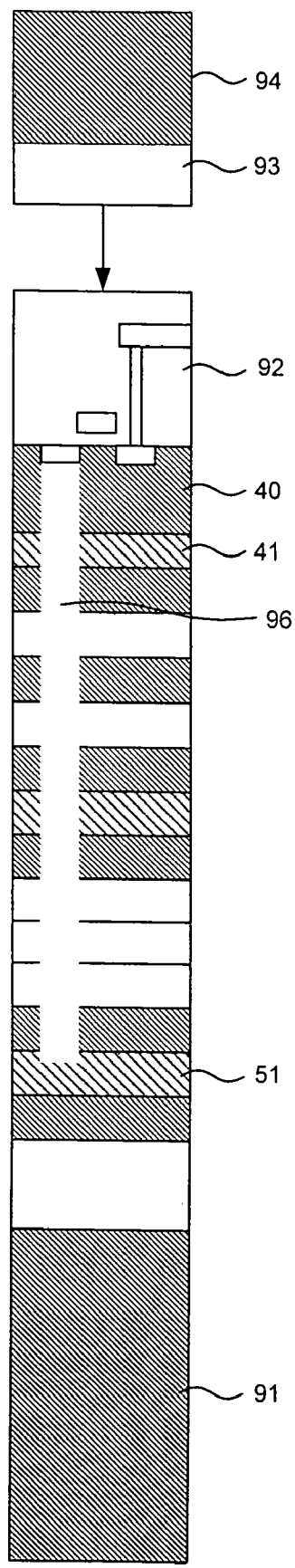

As shown in FIG. 16E, a second "handle" wafer comprising p-type semiconductor substrate material 94 and insulating layer 93 on substrate 94 is then aligned with the FIG. 16D structure, with the exposed (bottom) surface of the p-type semiconductor substrate of element 92 facing insulating layer 93.

Figure 16F:
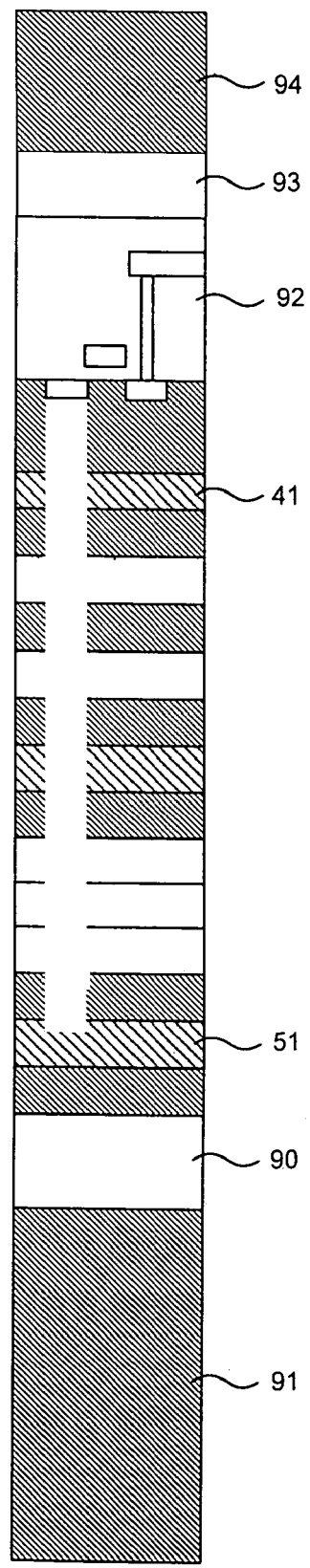

Then, as shown in FIG. 16F, layer 93 of the second handle wafer is bonded to the exposed surface of element 92 (preferably by a low temperature bonding step) to cause layer 93 to become sandwiched between the p-type semiconductor substrate of element 92 and p-type semiconductor substrate 94.

Figure 16G:
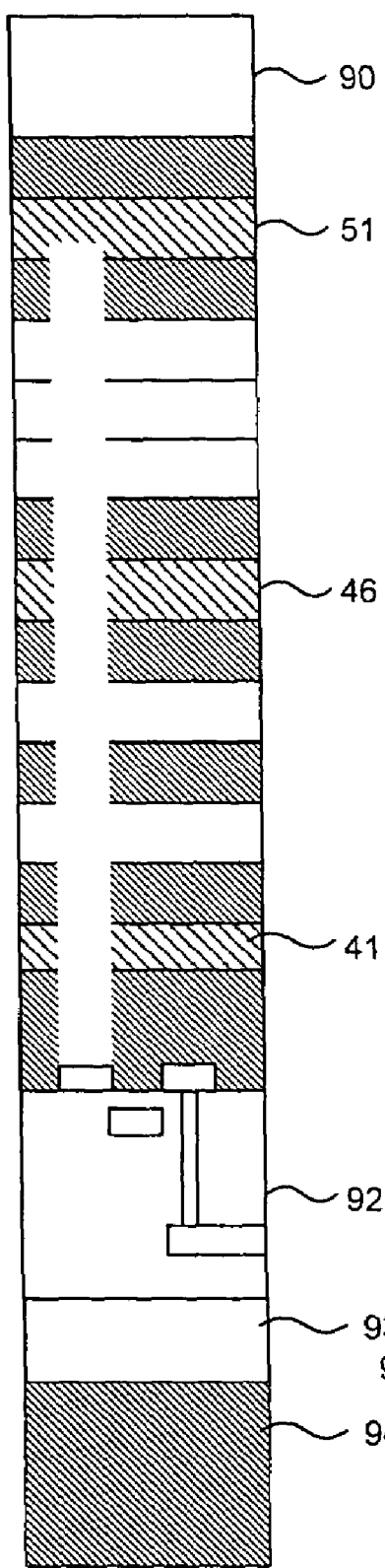

Then substrate 91 is removed (e.g., polished away) and the structure of FIG. 16F can be inverted (so that the exposed bottom surface of substrate 94 faces down and the exposed top surface of layer 90 faces up as shown in FIG. 16G).

Figure 16H:
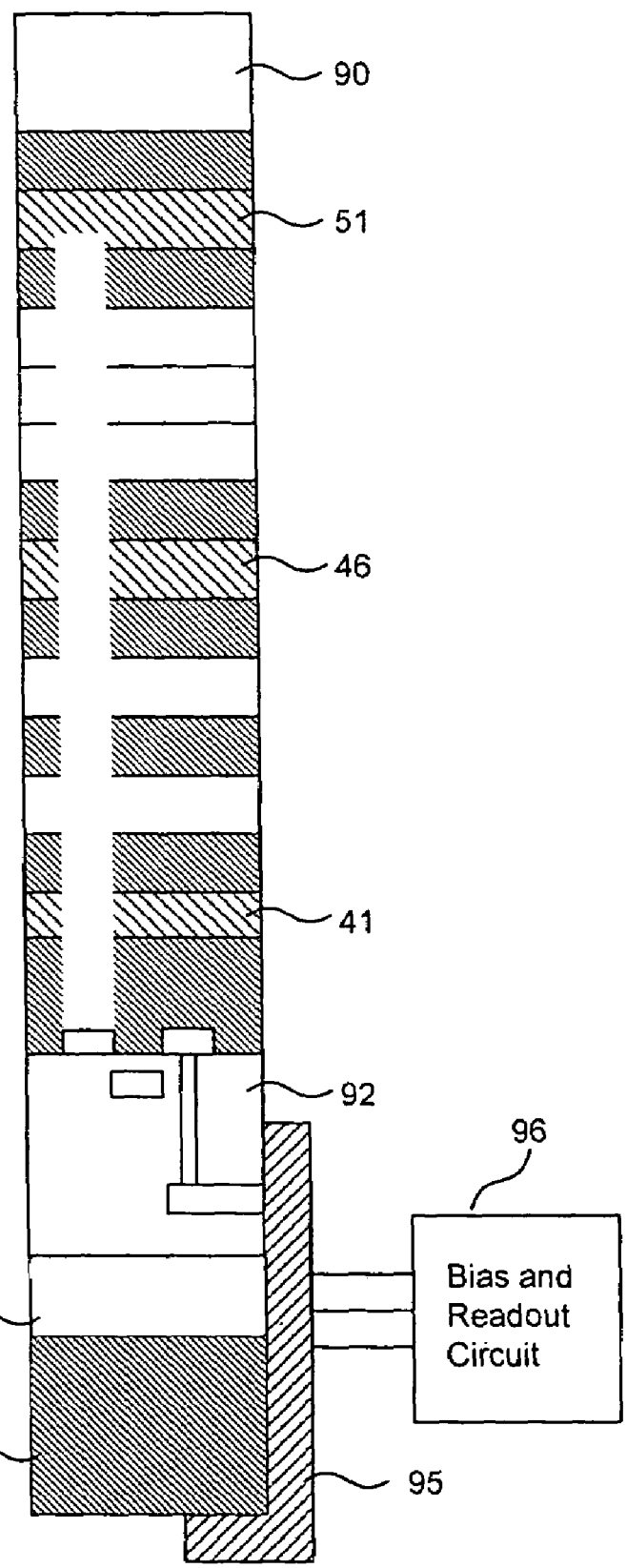

Support circuitry 92 can then be coupled to biasing and readout circuitry. For example, as shown in FIG. 16H, support circuitry 92 can be coupled to biasing and readout circuit 96 by shell-case structure 95, which implements contacts between each transistor of support circuitry 92 and circuit 96. Commercially used methods (e.g., those developed by Shellcase Ltd.) can be employed to produce shell-case structure 95. Biasing and readout circuit 96 can be of the type described with reference to FIG. 2A.

Another method of creating isolation (e.g., between neighboring VCF sensor groups) is to use a shut off MOS transistor as an isolation structure. This can be done with a thick oxide transistor having a gate that surrounds the top layer of the sensor group to be isolated (where the gate kept at a voltage well below threshold), or with another type of MOS transistor. A shut off MOS transistor is useful for isolating semiconducting regions near a surface, but does not greatly affect paths deep in the substrate. It may therefore be best applied in combination with isolation methods of the type described above with reference to FIGS. 20–24, to isolate neighboring VCF sensor groups from each other.

An example of the isolation method mentioned in the previous paragraph is ring isolation, which can be implemented by forming a thick or thin oxide MOS transistor whose gate surrounds the top layer of the sensor group to be isolated. In operation, the gate is biased to shut off the transistor.

Any of a number of available methods can be used to fabricate a VCF sensor group, and best method in each case depends on the materials and requirements for the sensor group.

Structures in silicon can be constructed with epitaxial growth and implantation, as described for example in above-referenced U.S. Patent Application Publication No. US 2002/0058353A1. Ion implantation provides a method of constructing junction structure below the silicon surface. By using high energy (>400 KeV) implantation, deep structures are possible. Because VCF sensor groups typically require thicker silicon structures than can be created even with high energy implantation, epitaxial growth in combination with implantation is typically employed to create the deep structures needed for capturing photons (in accordance with the invention) by converting the photons to electron/hole pairs deep in the silicon.

Another method employed to create deep structure in some embodiments of the invention is silicon bonding. This method bonds, at a molecular level, a layer of one semiconducting or insulating material to another. For example, it is possible to create structure in one silicon wafer and then bond a thin layer of silicon to the top of it. It is also becoming possible to bond dissimilar semiconductors. For example, with proper material preparation, a III-V semiconductor can be bonded to silicon. Because of the dissimilarity in the expansion coefficient of the two materials, an island of III-V material on a volume of silicon cannot be large. However, an island of III-V material (e.g., the $In_xGa_{1-x}N$ material discussed above with reference to FIG. 7) that is sufficiently large for forming typical embodiments of the inventive VCF sensor group can be bonded to silicon. An important advantage of doing so is that the III-V material can be chosen to absorb radiation in a different wavelength band than does silicon (e.g., some III-V material transmits all or substantially all green and red radiation incident thereon although silicon has significant absorptivity to green radiation and much greater absorptivity to green than to red radiation). Thus a sensor group can be implemented in which each sensor formed from III-V material absorbs radiation in a different wavelength band than does each sensor formed from silicon underlying the III-V material.

To add a filter to a vertical structure (e.g., a VCF color filter), it is possible to create a trench (or other void) in a volume of semiconductor material and then fill the void with a filter material that is a liquid or other fluid (e.g., a slurry). One method of accomplishing this is to use lateral silicon overgrowth to form a void in a volume of semiconductor material, and then to etch away the oxide (present during the lateral silicon overgrowth step). A liquid etchant, such as hydrofluoric acid, can be used for the etching step. When a void has been formed under silicon, the void can be filled with a liquid optical filter material (or with optical filter material that is a fluid other than a liquid). This filter material would be solidified (e.g., by heat treatment or UV treatment) to form the VCF sensor group structure. Alternatively, an oxide region could be formed by ion implantation of oxygen followed by a reaction phase that would create SiO2 (silicon dioxide) from the reaction of the wafer and the implanted oxygen.

Figure 13A:
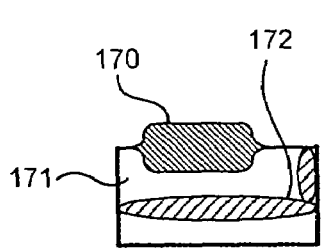
FIGS. 13a–13f are cross-sectional views (in a vertical plane) of structures formed at various steps of manufacture of an embodiment of the inventive VCF sensor group.
Figure 13B:
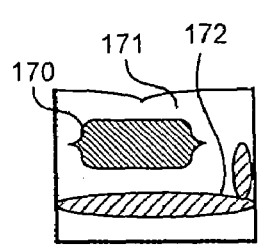

The process described in the previous paragraph will next be described in greater detail with reference to FIGS. 13a–13f. FIG. 13a shows SiO2 region 170 formed on the surface of p-type semiconductor 171 (which can be silicon), and implanted n-type semiconductor region 172 creating a p-n junction under SiO2 region 170. Implanted region 172 will become one of the sensors of a VCF sensor group. FIG. 13b also shows a first plug implant (of n-type semiconductor material) extending upward from the right edge of region 172.

Figure 13C:
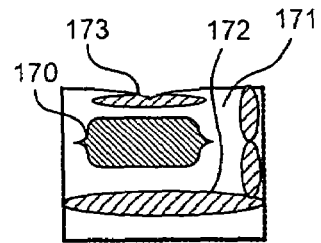

FIG. 13b shows the same cross section after lateral epitaxial growth has covered SiO2 region 170 with additional p-type semiconductor material 171 of the same type as semiconductor 171 of FIG. 13a (which can be silicon). Lateral epitaxial growth has been used in the semiconductor industry to create dielectrically isolated, single crystal silicon. As shown in FIG. 13c, a near surface implant (of n-type semiconductor material) is then formed over SiO2 region 170, and a second plug implant (of n-type semiconductor material) is formed to extend upward to the top surface of semiconductor 171 from the first plug implant. The two plug implants together form a plug contact for coupling layer 172 to biasing and readout circuitry.

Figure 13D:
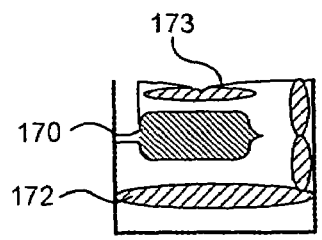
Figure 13E:
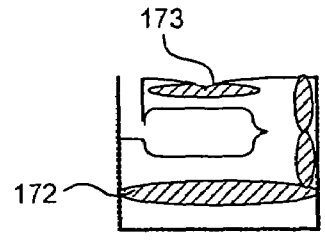
Figure 13F:
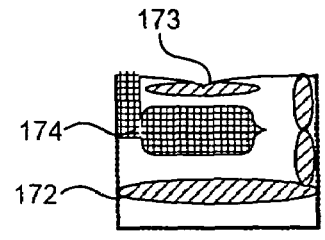

As shown in FIG. 13d, the next step is to etch away enough of material 171 to form a trench that exposes underlying SiO2 region 170. Then, an SiO2 etch is performed to remove the oxide (the SiO2) from region 170, leaving a void below top layer 173 as shown in FIG. 13e. Finally, the void is filled with liquid filter material 174 (as shown in FIG. 13f) and material 174 is solidified. Alternatively, filter material 174 is a fluid other than a liquid.

Variations on the method described with reference to FIGS. 13a–13f can be used to form VCF sensor groups with two or more vertically-separated sensors below the filter region (the filled with filter material 174).

In some embodiments of the inventive VCF sensor group, semiconducting materials other than crystalline silicon are deposited on a wafer or other substrate. Two examples of such semiconducting materials are amorphous silicon and polysilicon.

Amorphous silicon can be deposited by a variety of chemical vapor deposition and sputtering techniques. Amorphous silicon can deposited with high quality by plasma assisted chemical vapor deposition using SiH as the source gas. Doping of the deposited amorphous silicon can be achieved by adding small amounts of other hydride, such as phosphine, arsine and diborane. Amorphous silicon can be used in a VCF sensor group as a sensor (by creating a pn diode within the amorphous silicon), or as a filter, or as both a filter and a sensor. Amorphous silicon has been used in photoimaging arrays. The low temperature (less than 400° C.) at which amorphous silicon is deposited is an advantage because it only slightly increases diffusion of dopants and may be compatible with some filters.

In a similar fashion, polysilicon can be formed on a semiconductor wafer or other substrate. Typically, amorphous silicon is deposited and then re-crystallized to form polysilicon. Polysilicon can be doped by implantation or from a deposited layer to create a pn junction. Transistors can also be formed in either amorphous silicon or polysilicon and used in addressing sensors of VCF sensor groups.

Various filters and combinations of filters can be included in the VCF sensor groups of the present invention to provide improved photon separation, color accuracy, and sensor resolution. For example, an array of VCF sensor groups can be combined with organic color filters of the type typically used in image sensor manufacturing. Filters can be formed on (or included in) a subset of the sensor groups of the array in a checkerboard-like pattern to tune the color response of the sensor groups that are responsive to blue and red illumination. With such a pattern of filters, the properties of each filter can be very simple and insensitive to manufacturing variations due to the fact that the filter works in conjunction with the semiconductor color filter properties of each VCF sensor group. The advantage gained is a potentially more desirable color filter response. Alternatively, organic, dielectric, or polysilicon filters can be placed on (or included in) a subset of the VCF sensor groups of an array, in an alternating arrangement such that every other sensor group that responds to a particular color also has a color filter that serves to shape the color response, thereby creating an array with six distinct color responses. The latter technique allows for a large variety of color responses while minimizing the manufacturing overhead associated with the process of placing organic filters (or other types of filters) on top of an image sensor surface or including filters in VCF sensor groups.

While best modes for implementing the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described. Further, the claims that describe methods do not imply any specific order of steps unless explicitly described in the claim language.

What is claimed is:

1. An array of sensor groups formed on a semiconductor substrate, said array including:
   a first sensor group including at least two vertically stacked sensors, wherein the sensors of the first sensor group include a top sensor having a top surface that defines a normal axis, each of the sensors of the first sensor group has a different spectral response, is configured to be biased to function as a photodiode, and has a carrier-collection element configured to collect photo-generated carriers when said sensor is biased to function as a photodiode; and
   a second sensor group including at least two vertically stacked sensors, wherein each of the sensors of each of the second sensor group has a different spectral response, is configured to be biased to function as a photodiode, and has a carrier-collection element configured to collect photo-generated carriers when said sensor is biased to function as a photodiode,
   wherein the carrier-collection element of at least one of the sensors of the first sensor group is a relatively large element having an area, projected on a plane perpendicular to the normal axis, that is larger than the area projected on said plane of the carrier-collection element of another one of the sensors of the first sensor group, and the relatively large carrier-collection element is included in and shared by both the first sensor group and the second sensor group.

2. The array of claim 1, wherein each of the first sensor group and the second sensor group includes:
   a top, blue-sensitive sensor;
   a bottom, red-sensitive sensor; and
   a green-sensitive sensor between the blue-sensitive sensor and the red-sensitive sensor.

3. The array of claim 2, wherein the relatively large carrier-collection element is a carrier-collection element of a red-sensitive sensor that is shared by the first sensor group and the second sensor group.

4. The array of claim 2, wherein the relatively large carrier-collection element is a carrier-collection element of a blue-sensitive sensor that is shared by the first sensor group and the second sensor group.

5. The array of claim 1, wherein each of the sensors of the first sensor group is configured to collect photo-generated carriers of a first polarity in response to incident radiation when said each of the sensors is biased to function as a photodiode, each of the sensors of the second sensor group is configured to collect photo-generated carriers of a first polarity in response to incident radiation when said each of the sensors is biased to function as a photodiode, and said array also includes:

circuitry, coupled to the sensors of the first sensor group and the second sensor group and configured to convert the photo-generated carriers collected by the first sensor group into at least one electrical signal and to convert the photo-generated carriers collected by the second sensor group into at least one other electrical signal.

6. The array of claim 5, wherein each of the sensors of the first sensor group includes at least one reference layer vertically stacked with the carrier-collecting layer of said each of the sensors, and the reference layer is configured to collect and conduct away photo-generated carriers of a polarity opposite to the first polarity.

7. The array of claim 1, also including:

at least one filter positioned relative to the sensors of the first sensor group such that radiation that has propagated through or reflected from the filter will propagate into at least one of the sensors of the first sensor group.

8. A sensor group formed on a semiconductor substrate, said sensor group comprising:

at least two vertically stacked sensors including a top sensor having a top surface that defines a normal axis, wherein each of the sensors has a different spectral response, is configured to be biased to function as a photodiode, and has a carrier-collection element configured to collect photo-generated carriers when the sensors are biased to function as photodiodes, wherein at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element, wherein the sensors include:
    a top, blue-sensitive sensor;
    a bottom, red-sensitive sensor; and
    a green-sensitive sensor between the blue-sensitive sensor and the red-sensitive sensor, the group includes one minimum-sized carrier-collection element, the carrier-collection element of the green-sensitive sensor is the minimum-sized carrier-collection element, and the carrier-collection element of at least one of the red-sensitive sensor and the blue-sensitive sensor has an area, projected on the plane perpendicular to the normal axis, that is at least twice the area, projected on said plane, of the minimum-sized carrier-collection element.

9. A sensor group formed on a semiconductor substrate, said sensor group comprising:

at least two vertically stacked sensors including a top sensor having a top surface that defines a normal axis, wherein each of the sensors has a different spectral response, is configured to be biased to function as a photodiode, and has a carrier-collection element configured to collect photo-generated carriers when the sensors are biased to function as photodiodes, wherein at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element,
    wherein the sensors are configured such that when radiation, propagating along each axis that extends from the top surface through all the sensors, is incident at the group, the radiation is incident at the top sensor with an incidence angle not greater than 30 degrees with respect to the normal axis.

10. A sensor group formed on a semiconductor substrate, said sensor group comprising:

at least two vertically stacked sensors, each having a different spectral response and configured to be biased to function as a photodiode to collect photo-generated carriers of a first polarity in response to incident radiation, wherein the sensors include a top sensor having a top surface that defines a normal axis;
    circuitry coupled to the sensors and configured to convert the photo-generated carriers into at least one electrical signal; and
    at least one filter positioned relative to the sensors such that radiation that has propagated through or reflected from the filter will propagate into at least one of the sensors,
    wherein each of the sensors has a carrier-collection element configured to collect photo-generated carriers of the first polarity when the sensors are biased to function as photodiodes, at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element.

11. The sensor group of claim 10, wherein the filter has a structure and position relative to the sensors such that filtered radiation that has propagated through said filter is incident on at least one of the sensors.

12. The sensor group of claim 10, wherein the filter has a structure and position relative to the sensors such that filtered radiation that has reflected from said filter is incident on at least one of the sensors.

13. The sensor group of claim 10, wherein the filter comprises at least one layer that has been integrated with the sensors by a semiconductor integrated circuit fabrication process.

14. A sensor group formed on a semiconductor substrate, said sensor group comprising:

at least two vertically stacked sensors, each having a different spectral response and configured to be biased to function as a photodiode to collect photo-generated carriers of a first polarity in response to incident radiation, wherein the sensors include a top sensor having a top surface that defines a normal axis; and
    circuitry coupled to the sensors and configured to convert the photo-generated carriers into at least one electrical signal,
    wherein each of the sensors has a carrier-collection element configured to collect photo-generated carriers of the first polarity when the sensors are biased to function as photodiodes, at least one said carrier-collection element is a minimum-sized carrier-collection element, the carrier-collection element of at least one of the sensors has an area, projected on a plane perpendicular to the normal axis, that is substantially larger than the area, projected on said plane, of each said minimum-sized carrier-collection element, and
    the sensors are configured such that when radiation, propagating along each axis that extends from the top surface through all the sensors, is incident at the group, the radiation is incident at the top sensor with an incidence angle not greater than 30 degrees with respect to the normal axis.

* * * * *